(12) United States Patent
Lee et al.

(10) Patent No.: US 11,864,459 B2
(45) Date of Patent: Jan. 2, 2024

(54) COMPOUND AND LIGHT EMITTING DEVICE INCLUDING THE SAME

(71) Applicant: Samsung Display Co., Ltd., Yongin-si (KR)

(72) Inventors: Jaesung Lee, Yongin-si (KR); Sungbum Kim, Yongin-si (KR); Haejin Kim, Yongin-si (KR); Eunsoo Ahn, Yongin-si (KR); Hyunjung Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 861 days.

(21) Appl. No.: 16/912,191

(22) Filed: Jun. 25, 2020

(65) Prior Publication Data

US 2021/0273166 A1 Sep. 2, 2021

(30) Foreign Application Priority Data

Nov. 26, 2019 (KR) .......................... 10-2019-0153547

(51) Int. Cl.
*H10K 85/30* (2023.01)
*C07F 15/00* (2006.01)
(Continued)

(52) U.S. Cl.
CPC ....... *H10K 85/361* (2023.02); *C07F 15/0086* (2013.01); *C09K 11/06* (2013.01);
(Continued)

(58) Field of Classification Search
CPC .... H05K 85/361; H10K 85/342; H10K 85/00; H10K 85/341; H10K 50/17; H10K 50/18; C09K 11/06; C07F 15/0086
(Continued)

(56) References Cited

U.S. PATENT DOCUMENTS 7,285,341 B2 10/2007 Zheng et al.
7,973,168 B2 7/2011 Suh et al.
(Continued)

FOREIGN PATENT DOCUMENTS

JP 2001-172232 6/2001
JP 2005-170911 6/2005
(Continued)

*Primary Examiner* — Thinh T Nguyen
(74) *Attorney, Agent, or Firm* — KILE PARK REED & HOUTTEMAN PLLC

(57) ABSTRACT

A trimetallic complex and a light-emitting device including the same are provided. The trimetallic complex is represented by Formula 1:

<Formula 1>

(Continued)

(52) U.S. Cl.
CPC ........... *H10K 85/00* (2023.02); *H10K 85/341* (2023.02); *H10K 85/342* (2023.02); *H10K 85/346* (2023.02); *C09K 2211/1044* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 59/123* (2023.02); *H10K 2101/10* (2023.02)

(58) Field of Classification Search
USPC ......................................... 257/40; 438/82, 99
See application file for complete search history.

(56) References Cited

U.S. PATENT DOCUMENTS

| | | | |
|---|---|---|---|
| 9,252,372 | B2 | 2/2016 | Yersin et al. |
| 10,008,673 | B2 | 6/2018 | Brocke et al. |
| 10,374,166 | B2 | 8/2019 | Hatakeyama et al. |
| 2007/0106103 | A1 | 5/2007 | Ikeda et al. |
| 2014/0058099 | A1 | 2/2014 | Wakamiya et al. |
| 2019/0153007 | A1 | 5/2019 | Li et al. |
| 2019/0202851 | A1 | 7/2019 | Stoessel et al. |
| 2019/0288223 | A1* | 9/2019 | Sim et al. ............ H01L 51/0087 |

FOREIGN PATENT DOCUMENTS

| | | |
|---|---|---|
| JP | 2017-212093 | 11/2017 |
| KR | 10-2007-0074095 | 7/2007 |
| KR | 10-2011-0030465 | 3/2011 |
| KR | 10-1836041 | 3/2018 |
| KR | 10-2018-0046851 | 5/2018 |
| WO | 2004/061047 | 7/2004 |
| WO | 2011/107186 | 9/2011 |
| WO | 2012/118164 | 9/2012 |
| WO | 2015/102118 | 7/2015 |

\* cited by examiner

-continued

20 Claims, 1 Drawing Sheet

(51) Int. Cl.
| | |
|---|---|
| *H10K 50/11* | (2023.01) |
| *C09K 11/06* | (2006.01) |
| *H10K 85/00* | (2023.01) |
| *H10K 50/15* | (2023.01) |
| *H10K 50/16* | (2023.01) |
| *H10K 50/17* | (2023.01) |
| *H10K 50/18* | (2023.01) |
| *H10K 59/123* | (2023.01) |
| *H10K 101/10* | (2023.01) |

10

| 190 |
|-----|
| 150 |
| 110 |

COMPOUND AND LIGHT EMITTING DEVICE INCLUDING THE SAME

CROSS-REFERENCE TO RELATED APPLICATION(S)

This application claims priority to and benefits of Korean Patent Application No. 10-2019-0153547 under 35 U.S.C. § 119, filed on Nov. 26, 2019, in the Korean Intellectual Property Office, the entire contents of which are incorporated herein by reference.

BACKGROUND

1. Technical Field

Embodiments relate to a compound and a light-emitting device including the same.

2. Description of the Related Art

Organic light-emitting devices are self-emission devices that have wide viewing angles, high contrast ratios, short response times, and excellent characteristics in terms of brightness, driving voltage, and response speed, compared to devices in the art.

An organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state, thereby generating light.

SUMMARY

Embodiments include a novel luminescent material and a device including the same.

Additional embodiments will be set forth in part in the description which follows and, in part, will be apparent from the description, or may be learned by practice of the embodiments of the disclosure.

In an embodiment, a trimetallic complex is represented by Formula 1.

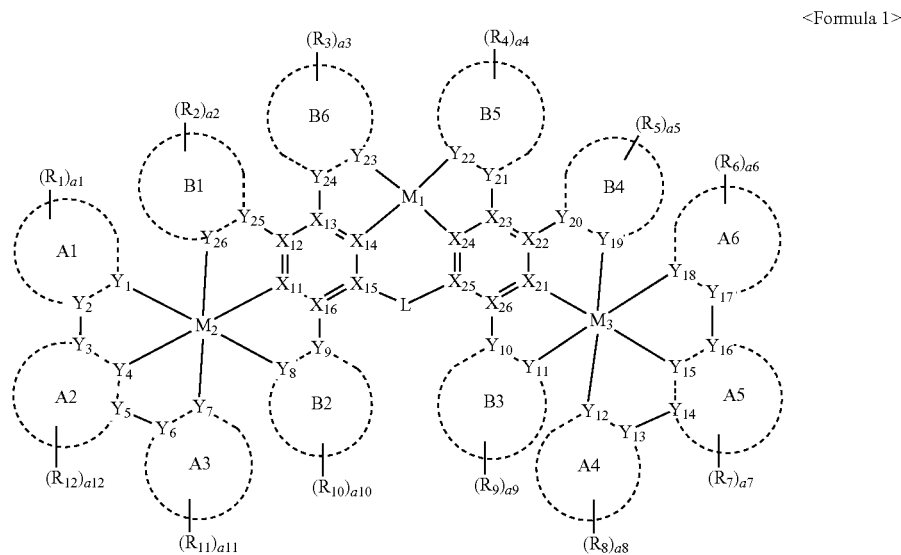

<Formula 1>

In Formula 1, $M_1$, $M_2$, and $M_3$ may be transition metals, $A_1$ to $A_6$ and $B_1$ to $B_6$ may each independently be selected from a $C_5$-$C_{60}$ carbocyclic group and a $C_1$-$C_{60}$ heterocyclic group, $Y_1$ to $Y_{26}$ may each independently be C or N, $X_{11}$ to $X_{16}$ and $X_{21}$ to $X_{26}$ may each independently be C or N, L may be selected from a single bond, *—O—*', *—S—*', *—C($R_{21}$)($R_{22}$)—*', *—C($R_{21}$)=*', *=C($R_{21}$)—*', *—C($R_{21}$)=C($R_{22}$)—*', *—C(=O)—*', *—C(=S)—*', *—C≡C—*', *—B($R_{21}$)—*', *—N($R_{21}$)—*', *—P($R_{21}$) *—Si($R_{21}$)($R_{22}$)—*', *—P($R_{21}$)($R_{22}$)—*', and *—Ge($R_{21}$)($R_{22}$)—*', $R_1$ to $R_{12}$, $R_{21}$, and $R_{22}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —B($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), two adjacent substituents selected from the group consisting of $R_1$ to $R_{12}$, $R_{21}$, and $R_{22}$ may optionally be linked to each other to form a substituted or unsubstituted $C_5$-$C_{60}$ carbocyclic group or a substituted or unsubstituted $C_1$-$C_{60}$ heterocyclic group, a1 to a12 may each independently be an integer from 1 to 4,

* and *' each indicate a binding site to a neighboring atom, and at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{30}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from deuterium, —F, —Cl, —Br, —I, a hydroxyl group, a cyano group, a nitro group, an amidino group, a hydrazino group, a hydrazono group, a $C_1$-$C_{30}$ alkyl group, a $C_2$-$C_{60}$ alkenyl group, a $C_2$-$C_{30}$ alkynyl group, and a $C_1$-$C_{30}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$), and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amino group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

In an embodiment, a light-emitting device may include a first electrode, a second electrode facing the first electrode, and a middle layer disposed between the first electrode and the second electrode and including an emission layer, wherein the middle layer includes the trimetallic complex.

In an embodiment, in the light emitting device, the first electrode may be an anode, the second electrode may be a cathode, and the middle layer may comprise a hole transport region disposed between the first electrode and the emission layer and an electron transport region disposed between the emission layer and the second electrode. The hole transport region may comprise at least one selected from the group consisting of a hole injection layer, a hole transport layer, an emission auxiliary layer, and an electron blocking layer. The electron transport region may comprise at least one selected from the group consisting of a hole blocking layer, an electron transport layer, and an electron injection layer.

In an embodiment, an electronic apparatus may comprise a thin-film transistor, and the light-emitting device, wherein the thin-film transistor includes a source electrode, a drain electrode, an activation layer, and a gate electrode. The first electrode of the light-emitting device may be electrically connected to at least one of the source electrode and the drain electrode of the thin-film transistor.

BRIEF DESCRIPTION OF THE DRAWING

The above and other aspects, features, and advantages of embodiments of the disclosure will be more apparent from the following description taken in conjunction with the FIGURE, which shows a schematic cross-sectional view of a structure of a light-emitting device according to an embodiment.

DETAILED DESCRIPTION OF THE EMBODIMENTS

Reference will now be made in detail to embodiments, examples of which are illustrated in the accompanying drawing. In this regard, the embodiments may have different forms and should not be construed as being limited to the descriptions set forth herein. Accordingly, the embodiments are described below, by referring to the FIGURE, to explain aspects of the invention.

Like reference numerals refer to like elements throughout. In the drawing, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the invention. Similarly, a second element could be termed a first element. As used herein, the singular forms are intended to include the plural forms as well, unless the context clearly indicates otherwise.

As used herein, the term "and/or" includes any and all combinations of one or more of the associated listed items for the purpose of its meaning and interpretation. For example, "A and/or B" may be understood to mean "A, B, or A and B." The terms "and" and "or" may be used in the conjunctive or disjunctive sense and may be understood to be equivalent to "and/or". Throughout the disclosure, the expression "at least one of a, b or c" indicates only a, only b, only c, both a and b, both a and c, both b and c, all of a, b, and c, or variations thereof.

The phrase "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be further understood that the terms "comprises," "comprising," "includes," and/or "including," when used in this specification, specify the presence of stated features, numerals, steps, operations, elements, parts, or the combination thereof, but do not preclude the presence or addition of one or more other features, numerals, steps, operations, elements, parts, or the combination thereof.

It will be further understood that when a layer, a film, a region, a plate, etc. is referred to as being "on" or "above" another part, it can be "directly on" the other part, or intervening layers may also be present. It will also be understood that when a layer, a film, a region, a plate, etc. is referred to as being "under" or "below" another part, it can be "directly under" the other part, or intervening layers may also be present. When an element is referred to as being disposed "on" another element, it can be disposed under the other element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

In one embodiment, a trimetallic complex is represented by Formula 1.

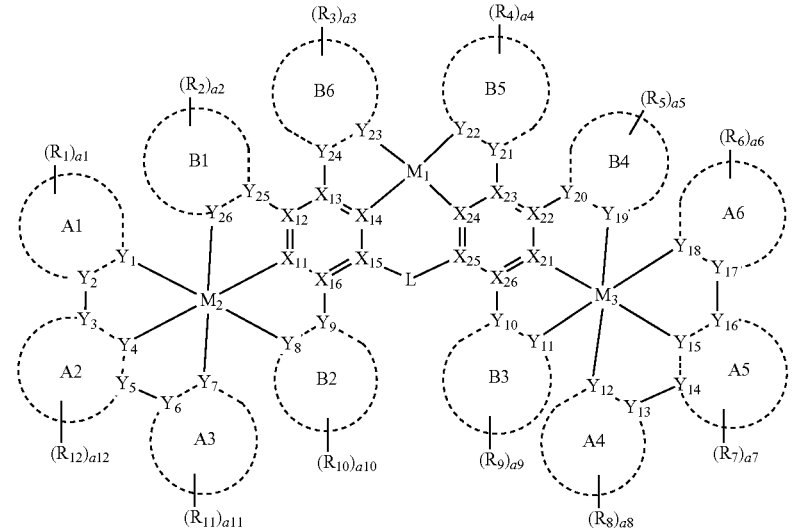

<Formula 1>

In Formula 1, $M_1$, $M_2$, and $M_3$ may be transition metals, $A_1$ to $A_6$ and $B_1$ to $B_6$ may each independently be selected from a $C_5$-$C_{60}$ carbocyclic group and a $C_1$-$C_{60}$ heterocyclic group, $Y_1$ to $Y_{26}$ may each independently be C or N, $X_{11}$ to $X_{16}$ and $X_{21}$ to $X_{26}$ may each independently be C or N, L may be selected from a single bond, *—O—*', *—S—*', *—C($R_{21}$)($R_{22}$)—*', *—C($R_{21}$)=*', *=C($R_{21}$)—*', *—C($R_{21}$)=C($R_{22}$)—*', *—C(=O)—*', *—C(=S)—*', *—C≡C—*', *—B($R_{21}$)—*', *—N($R_{21}$)—*', *—P($R_{21}$)*—Si($R_{21}$)($R_{22}$)—*', *—P($R_{21}$)($R_{22}$)—*', and *—Ge($R_{21}$)($R_{22}$)—*', $R_1$ to $R_{12}$, $R_{21}$, and $R_{22}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), two adjacent substituents of $R_1$ to $R_{12}$, $R_{21}$, and $R_{22}$ may optionally be linked to each other to form a substituted or unsubstituted $C_5$-$C_{60}$ carbocyclic group or a substituted or unsubstituted $C_1$-$C_{60}$ heterocyclic group, a1 to a12 may each independently be an integer from 1 to 4,

* and *' each indicate a binding site to a neighboring atom, and at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{30}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{30}$ alkyl group, a $C_2$-$C_{30}$ alkenyl group, a $C_2$-$C_{30}$ alkynyl group, and a $C_1$-$C_{30}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_3$-1 to $Q_{33}$ may each independently be selected from hydrogen, deuterium, —F, —Cl, —Br, —I, a hydroxyl group, a cyano group, a nitro group, an amino group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{30}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

When a1 to a12 are integers of 2 or more, the substituents $R_1$ to $R_{12}$ may be identical to or different from each other. For example, when a1 is an integer of 2 or more, the substituents $R_1$(s) may be different from or identical to each other. For example, when a2 is an integer of 2 or more, the substituents $R_2$(s) may be different from or identical to each other. The same applies to other substituents $R_3$ to $R_{12}$.

For example, adjacent $R_1$(s) may be linked together to form a substituted or unsubstituted $C_5$-$C_{60}$ carbocyclic group or a substituted or unsubstituted $C_1$-$C_{60}$ heterocyclic group. For example, adjacent $R_2$(s) may be linked together to form a substituted or unsubstituted $C_5$-$C_{60}$ carbocyclic group or a substituted or unsubstituted $C_1$-$C_{60}$ heterocyclic group. The same applies to other substituents $R_3$ to $R_{12}$.

The trimetallic complex of Formula 1 according to an embodiment may not only improve stability by making a structure of ligands that are linked to each other more rigidly, but may also further tilt an angle between the ligands based on a central metal to inhibit formation of an excimer. As a result, a light-emitting device including the trimetallic complex of Formula 1 according to an embodiment may have improved efficiency and lifespan.

In one embodiment, $M_1$, $M_2$, and $M_3$ may each independently be selected from platinum (Pt), palladium (Pd), copper (Cu), silver (Ag), gold (Au), rhodium (Rh), iridium (Ir), ruthenium (Ru), and osmium (Os). $M_1$, $M_2$, and $M_3$ may be identical to or different from one another.

For example, $M_1$ may be selected from platinum (Pt), palladium (Pd), and osmium (Os).

In one embodiment, $M_2$ and $M_3$ may each be a metal different from $M_1$. For example, $M_2$ and $M_3$ may be identical to or different from each other and may each be a metal different from $M_1$.

In one embodiment, $M_2$ and $M_3$ may each independently be selected from rhodium (Rh), iridium (Ir), and ruthenium (Ru).

For example, $M_2$ and $M_3$ may each be rhodium (Rh) and iridium (Ir). For example, each of $M_2$ and $M_3$ may be rhodium (Rh). For example, each of $M_2$ and $M_3$ may be iridium (Ir). For example, $M_2$ and $M_3$ may each be rhodium (Rh) and ruthenium (Ru). For example, each of $M_2$ and $M_3$ may be ruthenium (Ru). For example, $M_2$ and $M_3$ may each be iridium (Ir) and ruthenium (Ru).

In one embodiment, $A_1$ to $A_6$ and $B_1$ to $B_6$ may each independently be selected from a benzene group, a naphthalene group, an anthracene group, a phenanthrene group, an azulene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isooxazole group, a thiazole group, an isothiazole group, an oxadiazole group, a thiadiazole group, a benzopyrazole group, a pyrazolopyridine group, a furopyrazole group, a thienopyrazole group, a benzimidazole group, a 2,3-dihydrobenzimidazole group, an imidazopyridine group, a 2,3-dihydroimidazopyridine group, a furo imidazole group, a thienoimidazole group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In one embodiment, $Y_4$, $Y_9$, $Y_{10}$, $Y_{15}$, $Y_{20}$, $Y_{21}$, $Y_{24}$, and $Y_{25}$ may each be N.

For example, $Y_4$, $Y_9$, $Y_{10}$, $Y_{15}$, $Y_{20}$, $Y_{21}$, $Y_{24}$, and $Y_{25}$ may each be N, and $Y_1$ to $Y_3$, $Y_5$ to $Y_8$, $Y_{11}$ to $Y_{14}$, $Y_{16}$ to $Y_{19}$, $Y_{22}$, and $Y_{23}$ and $Y_{26}$ may each be C.

In one embodiment, $X_{11}$ to $X_{16}$ and $X_{21}$ to $X_{26}$ may each be C.

In one embodiment, L may be *—O—*', and $Y_1$, $Y_7$, $Y_8$, $Y_{11}$, $Y_{12}$, $Y_{18}$, $Y_{19}$, $Y_{22}$, $Y_{23}$, $Y_{26}$, $X_{11}$, $X_{14}$, $X_{21}$, and $X_{24}$ may each be C.

In one embodiment, $A_1$ to $A_6$ and $B_1$ to $B_6$ may each independently be selected from a $C_5$-$C_6$ carbocyclic group and a $C_3$-$C_7$ heterocyclic group.

The carbocyclic group and the heterocyclic group are understood by referring to the definition of the substituent used herein. The term "$C_5$-$C_6$ carbocyclic group" refers to a carbocyclic group having 5 to 6 carbon atoms. The term "$C_3$-$C_7$ heterocyclic group" refers to a heterocyclic group having 3 to 7 carbon atoms.

In one embodiment, $A_1$ to $A_6$ may each independently be a $C_5$ heterocyclic group. The "$C_5$ heterocyclic group" refers to a heterocyclic group having 5 carbon atoms.

In one embodiment, $B_1$ to $B_6$ may each independently be a $C_3$-$C_7$ heterocyclic group.

In one embodiment, $A_1$ to $A_6$ may each independently be a 6-membered ring including one or more N(s).

In one embodiment, $B_1$ to $B_6$ may each independently be a 5-membered ring including two or more N(s). For example, $B_1$ to $B_6$ may each independently include two N(s). For example, $B_1$ to $B_6$ may each independently include three N(s).

In one embodiment, $A_1$ to $A_6$ and $B_1$ to $B_6$ may each independently be selected from a benzene group, a pyridine group, an imidazole group, a 2,3-dihydroimidazole group, an imidazopyrimidine group, and a benzimidazole group.

For example, $A_1$ to $A_6$ may each independently be selected from a benzene group and a pyridine group. For example, $B_1$ to $B_6$ may each independently be selected from an imidazole group, a 2,3-dihydroimidazole group, an imidazopyrimidine group, and a benzimidazole group.

In one embodiment, Formula 1 may be represented by Formula 2 below:

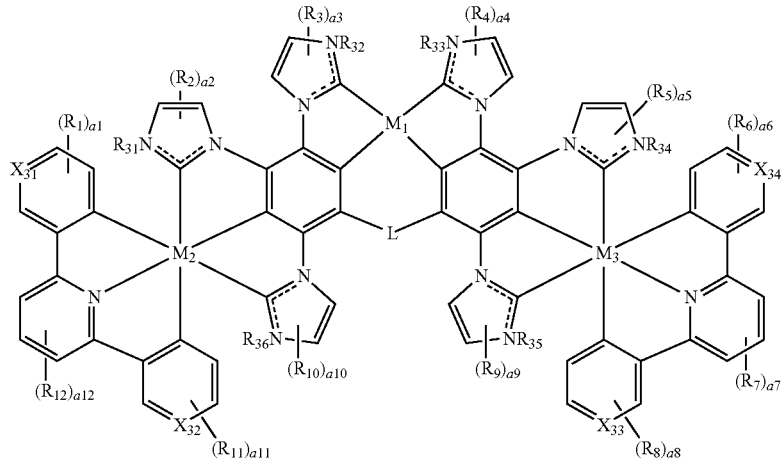

<Formula 2>

In Formula 2, definitions of $R_{31}$ to $R_{36}$ are the same as the definition of R1 of Formula 1, and X31 to X34 may each independently indicate C or N. M1, M2, M3, L, R1 to R12, and a1 to a12 are the same as described in connection with Formula 1.

In Formula 2, a dashed line indicates a conjugated state.

In a bond between a metal and a ligand in Formula 2, when a binding site of the ligand is N, a bond between the metal and N may be a coordinate bond. The same applies to Formula 1.

In one embodiment, in Formula 2, L may be *—O—*', $R_1$ to $R_{12}$ may each independently be —F, —Cl, —Br, or —I, and $R_{31}$ to $R_{36}$ may each independently be a substituted or unsubstituted $C_1$-$C_{60}$ alkyl group.

In one embodiment, the trimetallic complex represented by Formula 1 may be one of the following compounds:

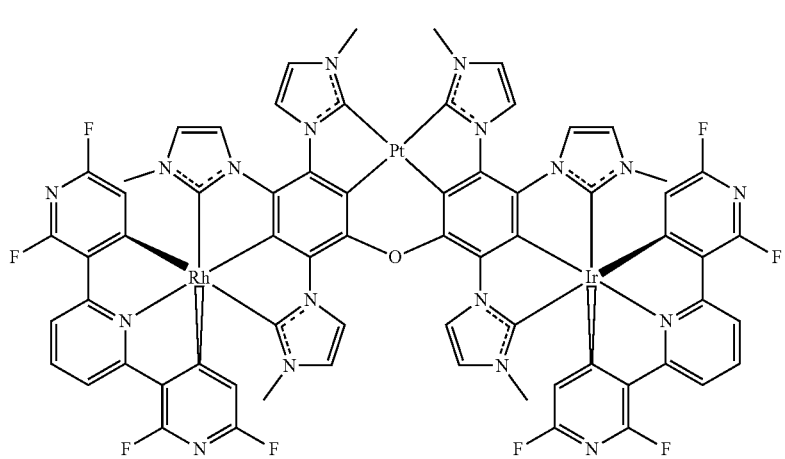

BD1

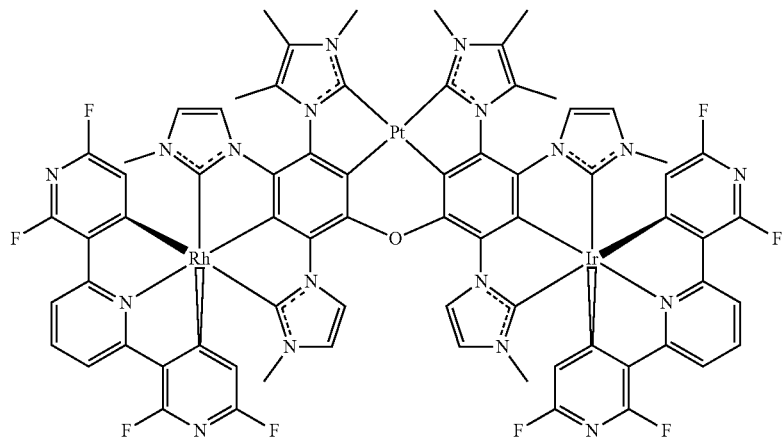
BD2
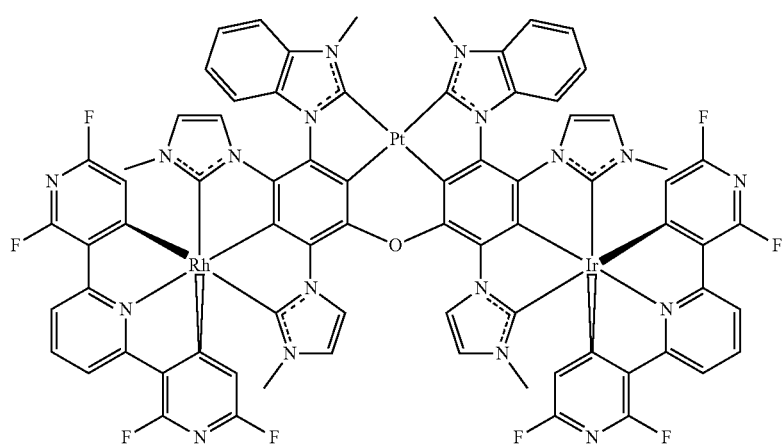
BD3
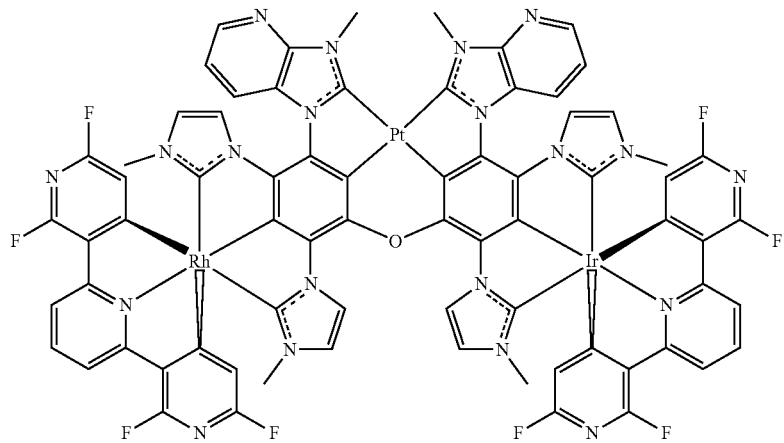
BD4

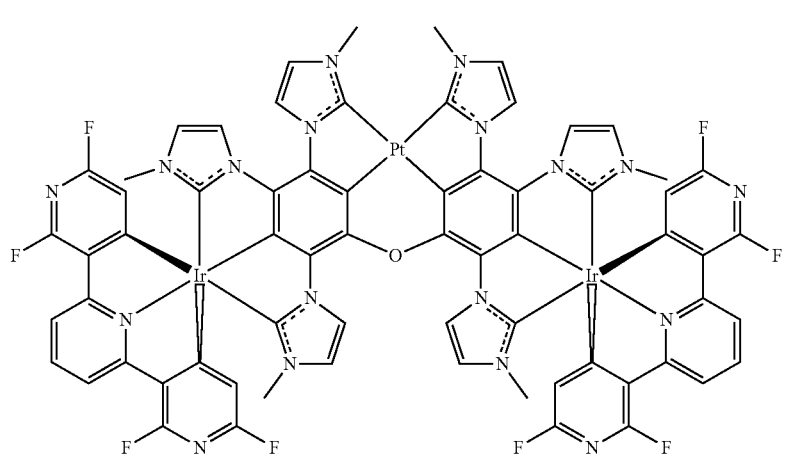
BD5
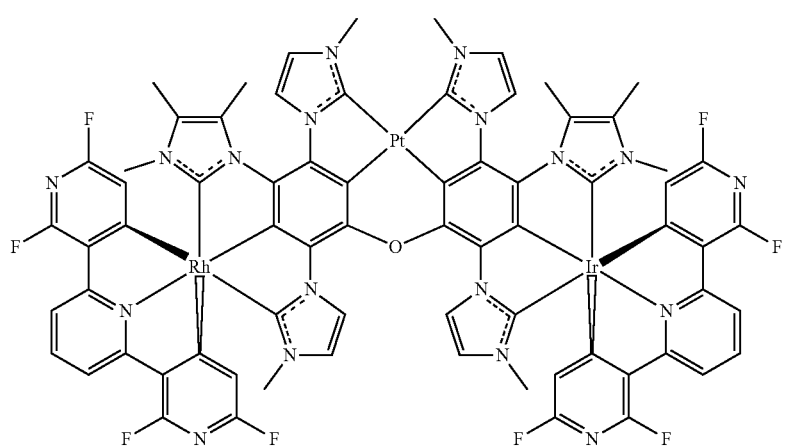
BD6
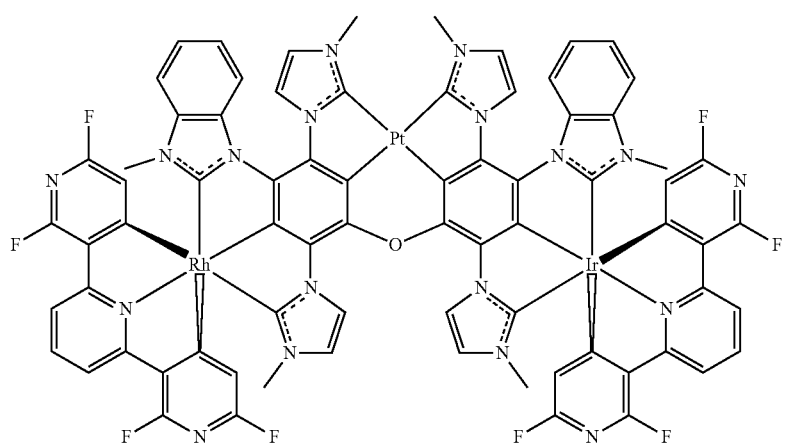
BD7

-continued

BD8

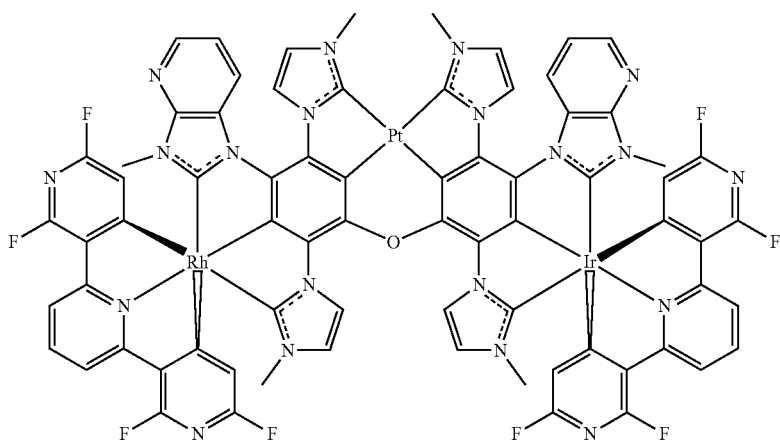

The expression "(a middle layer) includes at least one compound" as used herein may include an embodiment in which a middle layer (or a subcomponent thereof) includes identical compounds represented by Formula 1 and an embodiment in which an organic layer (or a subcomponent thereof) includes two or more different compounds represented by Formula 1.

For example, the middle layer may include, as the compound, only Compound 1. In this regard, Compound 1 may exist only in the emission layer of the light-emitting device. In embodiments, the middle layer may include, as the compound, Compound 1 and Compound 2. In this regard, Compound 1 and Compound 2 may exist in an identical layer (for example, Compound 1 and Compound 2 may all exist in an emission layer), or different layers (for example, Compound 1 may exist in an emission layer and Compound 2 may exist in an electron transport region).

According to one embodiment, a light-emitting device may include:

a first electrode;

a second electrode facing the first electrode; and a middle layer disposed between the first electrode and the second electrode and including an emission layer, wherein the middle layer includes the compound of Formula 1. For example, the light-emitting device may be an organic light-emitting device.

According to one embodiment, the first electrode of the light-emitting device may be an anode, the second electrode of the light-emitting device may be a cathode, and the middle layer may further comprise a hole transport region disposed between the first electrode and the emission layer and an electron transport region disposed between the emission layer and the second electrode.

The hole transport region may include at least one selected from the group consisting of a hole injection layer, a hole transport layer, an emission auxiliary layer, and an electron blocking layer.

The electron transport region may include at least one selected from the group consisting of a hole blocking layer, an electron transport layer, and an electron injection layer.

In one embodiment, the emission layer may be a phosphorescent emission layer.

In one embodiment, the trimetallic complex of Formula 1 may be included in the emission layer.

In one embodiment, the emission layer may include a dopant, and the dopant may include the compound. For example, the dopant may include the trimetallic complex of Formula 1.

In one embodiment, the trimetallic complex of Formula 1 may act as a phosphorescent dopant.

In embodiments, the emission layer may be a blue emission layer.

In embodiments, an electronic apparatus may include: a thin-film transistor; and the light-emitting device, wherein the thin-film transistor may include a source electrode, a drain electrode, an activation layer, and a gate electrode. The first electrode of the light-emitting device may be electrically connected to one of the source electrode and the drain electrode of the thin-film transistor.

The term "middle layer" as used herein refers to a single layer and/or all layers between the first electrode and the second electrode of the light-emitting device. The "middle layer" may include an organic material, an inorganic material, or any combination thereof.

DESCRIPTION OF THE FIGURE

The FIGURE is a schematic cross-sectional view of a light-emitting device 10 according to an embodiment. The light-emitting device 10 includes a first electrode 110, a middle layer 150, and a second electrode 190.

Hereinafter, the structure of the light-emitting device 10 according to an embodiment and a method of manufacturing the light-emitting device 10 will be described in connection with the FIGURE.

[First Electrode 110]

In the FIGURE, a substrate may be disposed under the first electrode 110 or above the second electrode 190. The substrate may be a glass substrate or a plastic substrate.

The first electrode 110 may be formed by depositing or sputtering a material for forming the first electrode 110 on the substrate. When the first electrode 110 is an anode, a high work function material that can easily inject holes may be used as a material for a first electrode.

The first electrode 110 may be a reflective electrode, a semi-transmissive electrode, or a transmissive electrode. When the first electrode 110 is a transmissive electrode, a material for forming a first electrode may be indium tin oxide (ITO), indium zinc oxide (IZO), tin oxide ($SnO_2$), zinc oxide (ZnO), or any combinations thereof, but embodiments are not limited thereto. In embodiments, when the first electrode 110 is a semi-transmissive electrode or a reflective electrode, a material for forming a first electrode may be magnesium (Mg), silver (Ag), aluminum (Al), aluminum-lithium (Al—Li), calcium (Ca), magnesium-indium (Mg-In), magnesium-silver (Mg—Ag), or any combinations thereof, but embodiments are not limited thereto.

The first electrode 110 may have a single-layered structure consisting of a single layer or a multi-layered structure including multiple layers. For example, the first electrode 110 may have a three-layered structure of ITO/Ag/ITO, but the structure of the first electrode 110 is not limited thereto.

[Middle Layer 150]

The middle layer 150 may be disposed on the first electrode 110. The middle layer 150 may include an emission layer.

The middle layer 150 may further include a hole transport region disposed between the first electrode 110 and the emission layer and an electron transport region disposed between the emission layer and the second electrode 190.

The middle layer 150 may further include a metal-containing compounds such as organometallic compounds, inorganic materials such as quantum dots, and the like, in addition to various organic materials.

[Hole Transport Region in Middle Layer 150]

The hole transport region may have: i) a single-layered structure consisting of a single layer consisting of a single material, ii) a single-layered structure consisting of a single layer consisting of different materials, or iii) a multi-layered structure including multiple layers including different materials.

The hole transport region may include a hole injection layer (HIL), a hole transport layer (HTL), an emission auxiliary layer, an electron blocking layer (EBL), or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked (or disposed) sequentially from the first electrode 110, but embodiments are not limited thereto.

The hole transport region may include a compound represented by Formula 201, a compound represented by Formula 202, or any combination thereof:

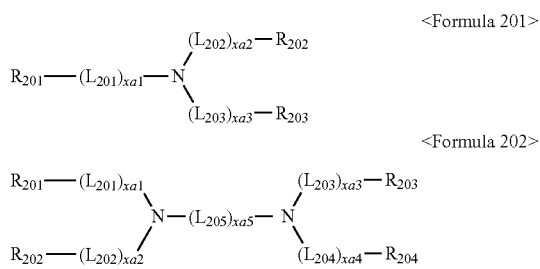

In Formulae 201 and 202, $L_{201}$ to $L_{204}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $L_{205}$ may be *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xa1 to xa4 may each independently be 0, 1, 2, or 3 (for example, 0, 1, or 2), xa5 may be an integer from 1 to 10 (for example, 1, 2, 3, or 4), and $R_{201}$ to $R_{204}$ and $Q_{201}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one embodiment, i) at least one of $R_{201}$ to $R_{203}$ of Formula 201 and ii) at least one of $R_{201}$ to $R_{204}$ of Formula 202 may each independently be selected from a fluorenyl group, a spiro-bifluorenyl group, a benzofluorenyl group, an indeno phenanthrenyl group, a pyridinyl group, a pyrrolyl group, a thiophenyl group, a furanyl group, an indolyl group, a benzoindolyl group, an isoindolyl group, a benzoisoindolyl group, a benzosilolyl group, a benzothiophenyl group, a benzofuranyl group, a carbazolyl group, a dibenzosilolyl group, a dibenzothiophenyl group, or a dibenzofuranyl group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a phenanthrenyl group, an indenyl group, a fluorenyl group, a dimethylfluorenyl group, a diphenyla fluorenyl group, a spiro-bifluorenyl group, a benzofluorenyl group, a dimethyla benzofluorenyl group, a diphenyla benzofluorenyl group, an indeno phenanthrenyl group, a dimethylindeno phenanthrenyl group, a diphenylindeno phenanthrenyl group, a pyridinyl group, a pyrrolyl group, a thiophenyl group, a furanyl group, an indolyl group, phenylan indolyl group, a benzoindolyl group, phenylbenzoindolyl group, an isoindolyl group, phenylan isoindolyl group, a benzoisoindolyl group, phenylbenzoisoindolyl group, a benzosilolyl group, a dimethylbenzosilolyl group, a diphenylbenzosilolyl group, a benzothiophenyl group, a benzofuranyl group, a carbazolyl group, a phenylcarbazolyl group, a biphenylcarbazolyl group, a dibenzosilolyl group, a dimethyla dibenzosilolyl group, a diphenyla dibenzosilolyl group, a dibenzothiophenyl group, and a dibenzofuranyl group, but embodiments are not limited thereto.

In one embodiment, the compound represented by Formula 201 or 202 may include at least one a carbazole group.

In one embodiment, the compound represented by Formula 201 may not include a carbazole group.

In one embodiment, the compound represented by Formula 201 may be represented by Formula 201A-1:

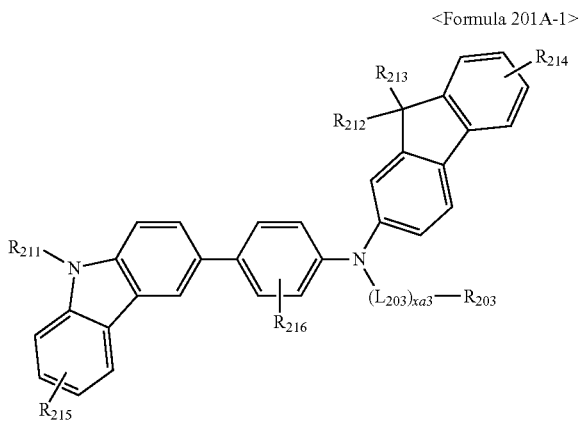

<Formula 201A-1>

$L_{203}$, xa3, and $R_{203}$ in Formula 201A-1 are the same as described above, and $R_{211}$ to $R_2$-16 may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a phenanthrenyl group, an indenyl group, a fluorenyl group, a dimethylfluorenyl group, a diphenyla fluorenyl group, a spiro-bifluorenyl group, a benzofluorenyl group, a dimethyla benzofluorenyl group, a diphenyla benzofluorenyl group, an indeno phenanthrenyl group, a dimethylindeno phenanthrenyl group, a diphenylindeno phenanthrenyl group, a pyridinyl group, a pyrrolyl group, a thiophenyl group, a furanyl group, an indolyl group, phenylan indolyl group, a benzoindolyl group, phenylbenzoindolyl group, an isoindolyl group, phenylan isoindolyl group, a benzoisoindolyl group, phenylbenzoisoindolyl group, a benzosilolyl group, a dimethylbenzosilolyl group, a diphenylbenzosilolyl group, a benzothiophenyl group, a benzofuranyl group, a carbazolyl group, a phenylcarbazolyl group, a biphenylcarbazolyl group, a dibenzosilolyl group, a dimethyla dibenzosilolyl group, a diphenyla dibenzosilolyl group, a dibenzothiophenyl group, or a dibenzofuranyl group.

The hole transport region may include one of Compounds HT1 to HT44, m-MTDATA, TDATA, 2-TNATA, NPB (NPD), (3-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof, but embodiments are not limited thereto:

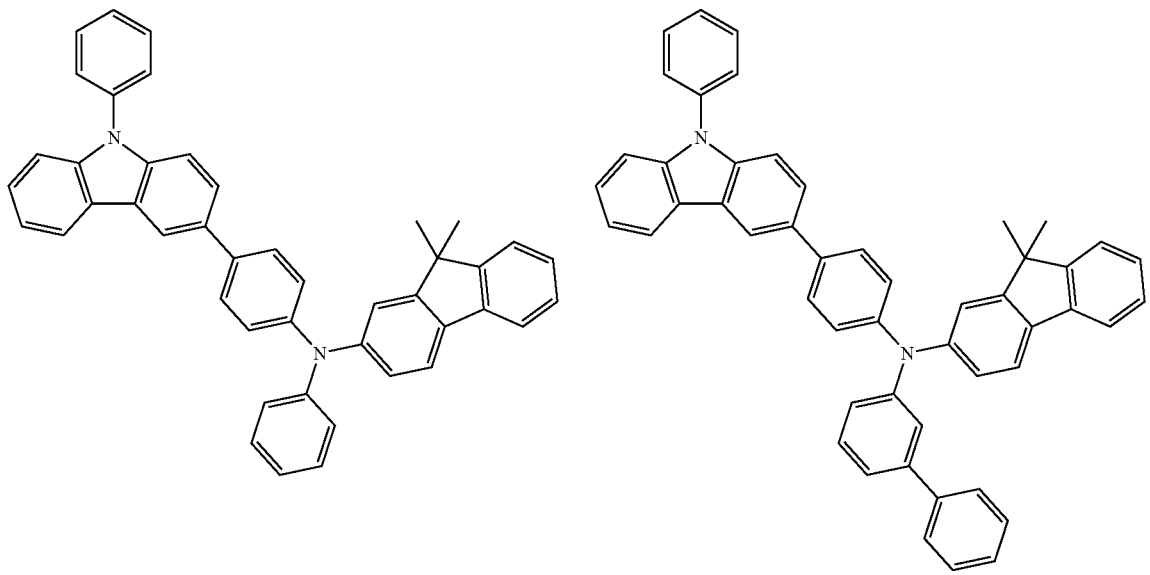

-continued
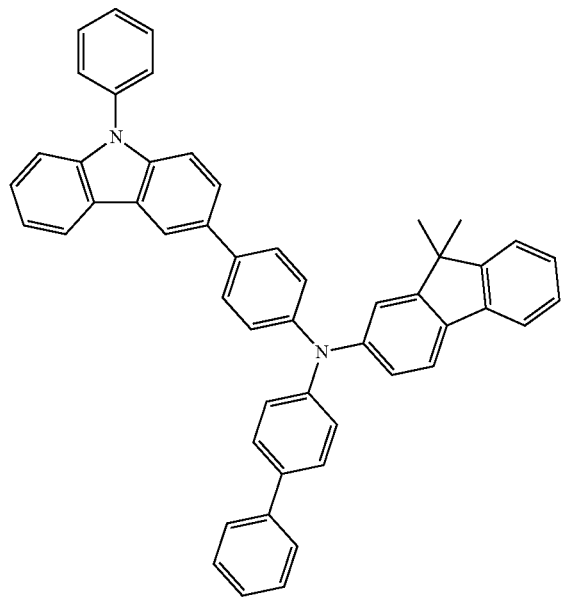
HT3
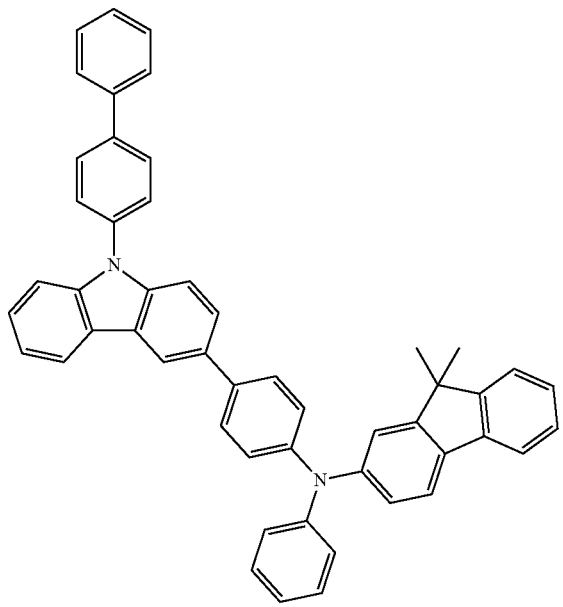
HT4
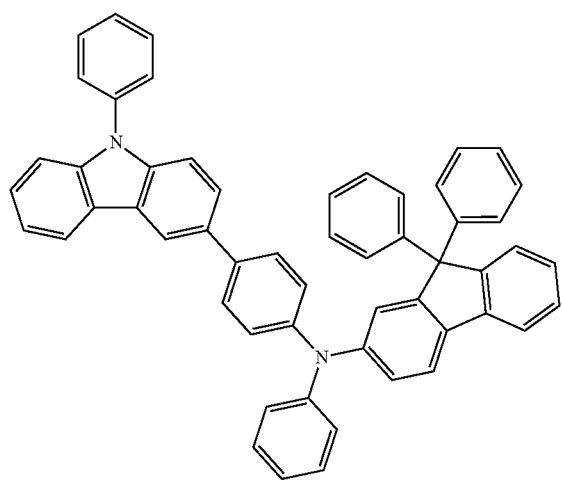
HT5
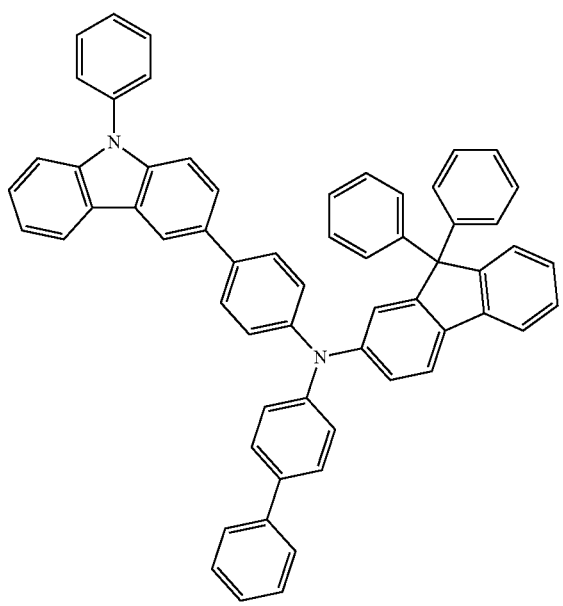
HT6

-continued
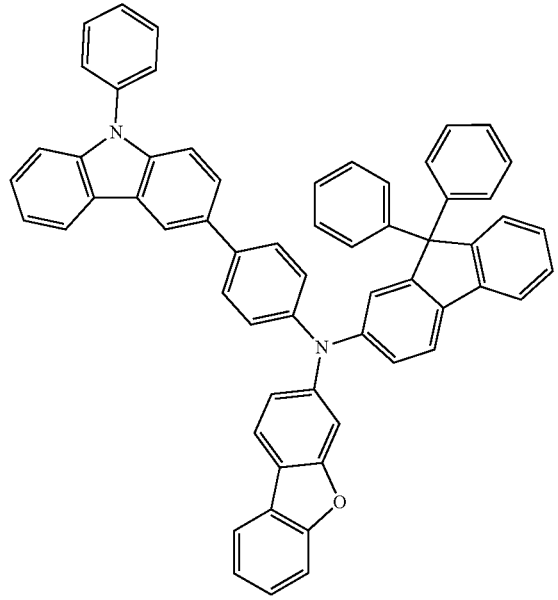
HT7
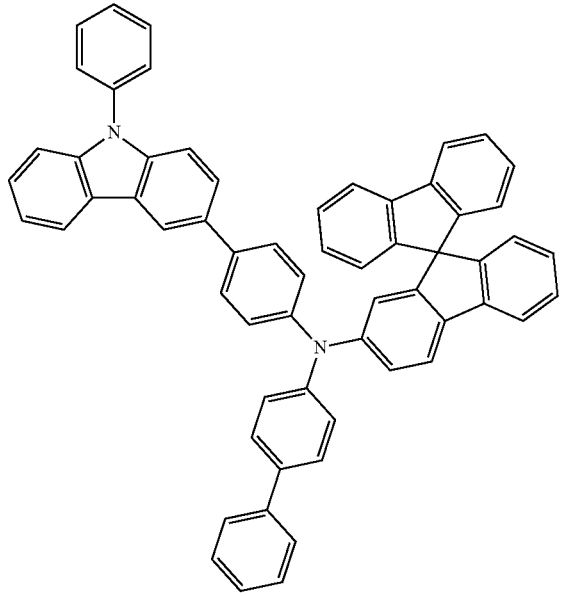
HT8
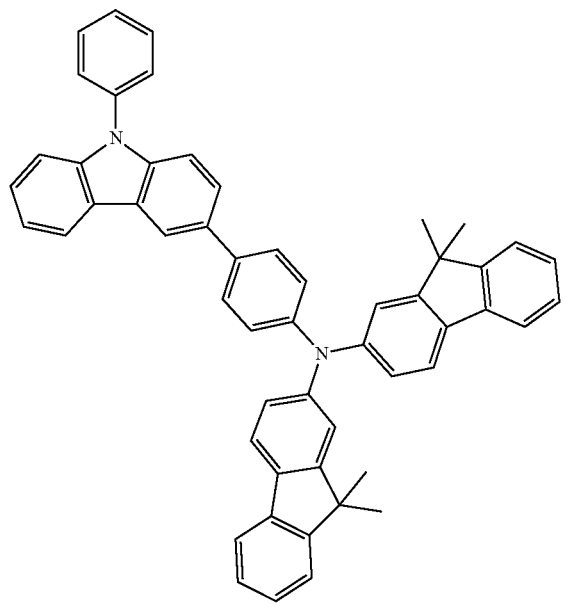
HT9
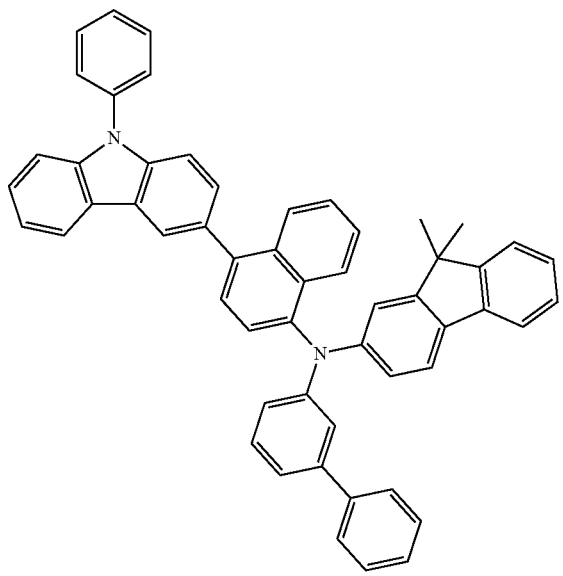
HT10

-continued
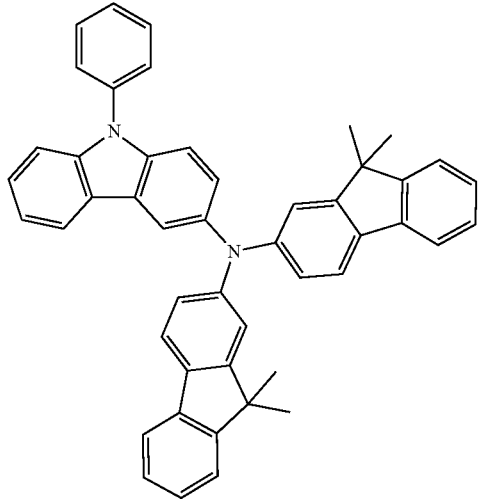
HT11
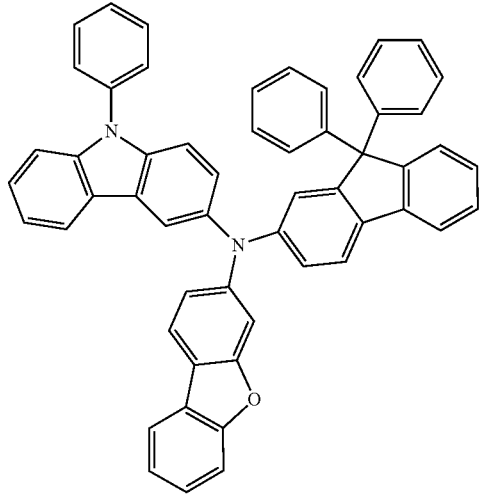
HT12
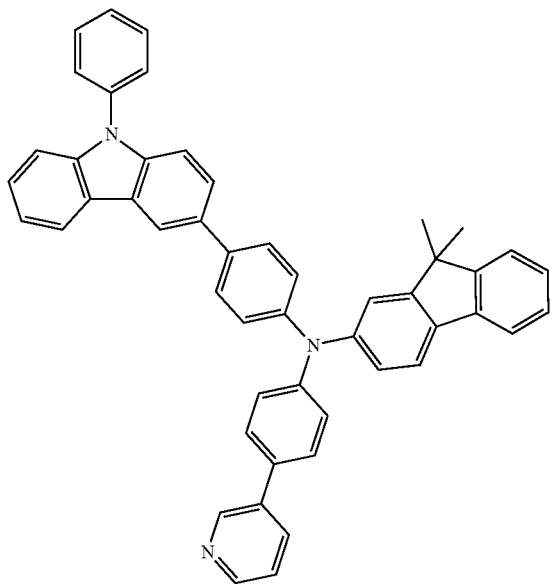
HT13
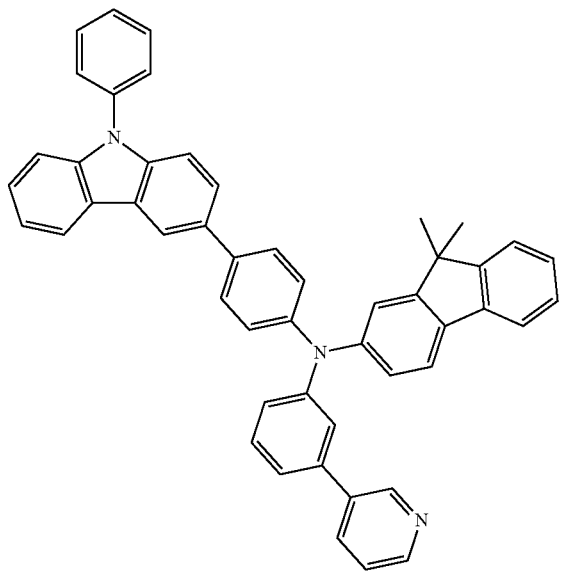
HT14
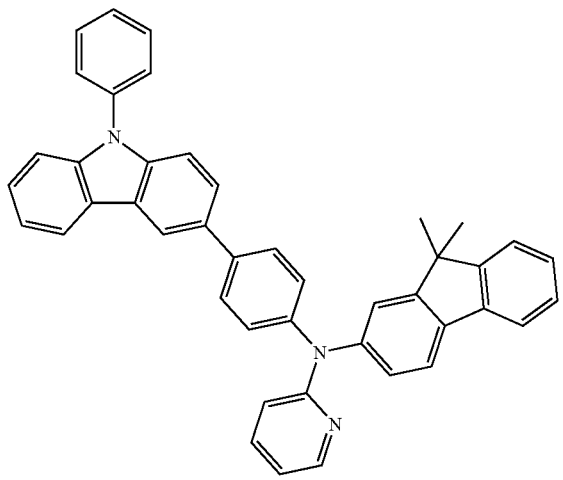
HT15
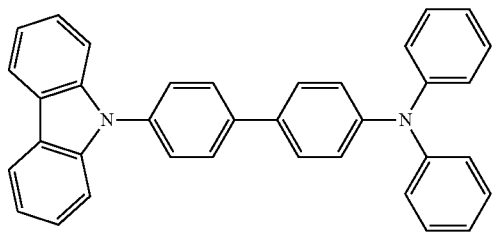
HT16

-continued
HT17
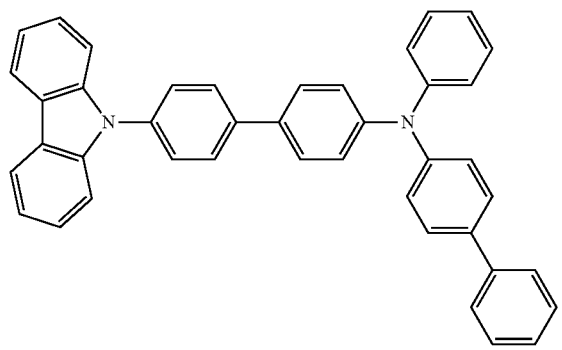
HT18
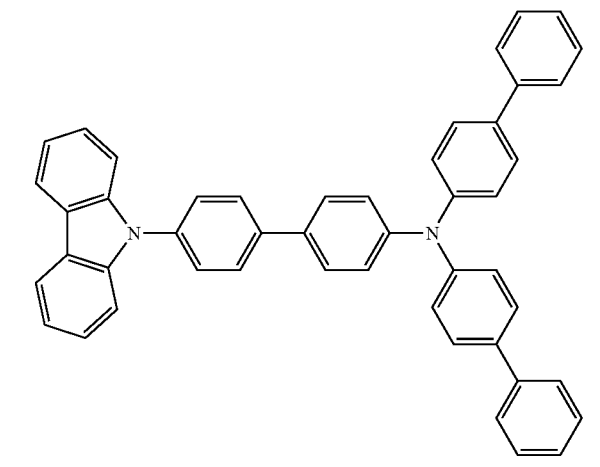
HT19
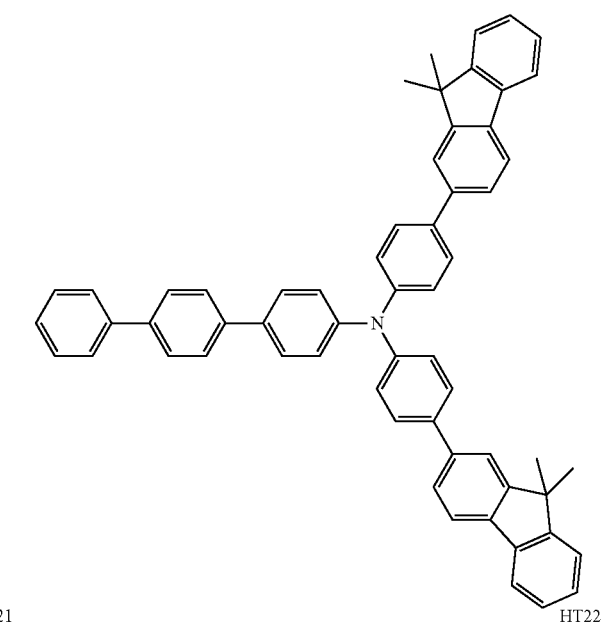
HT20
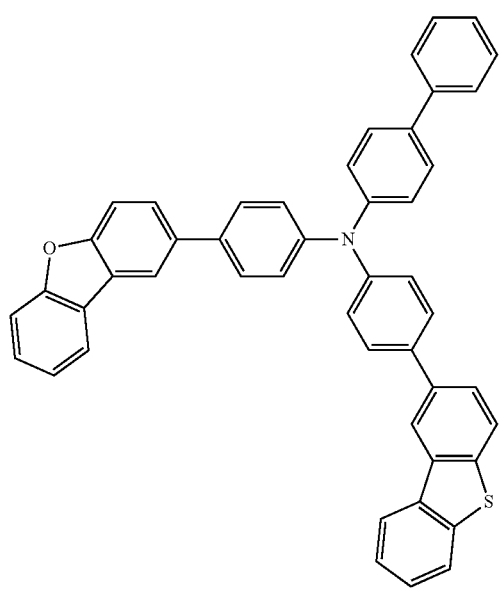
HT21
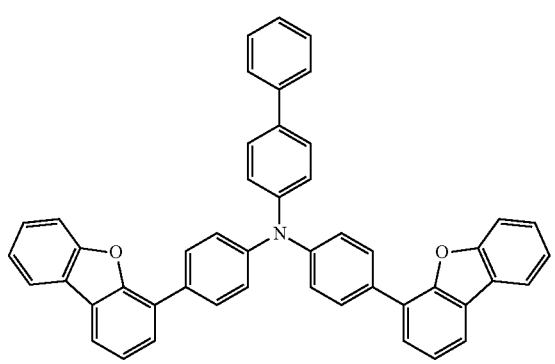
HT22

-continued
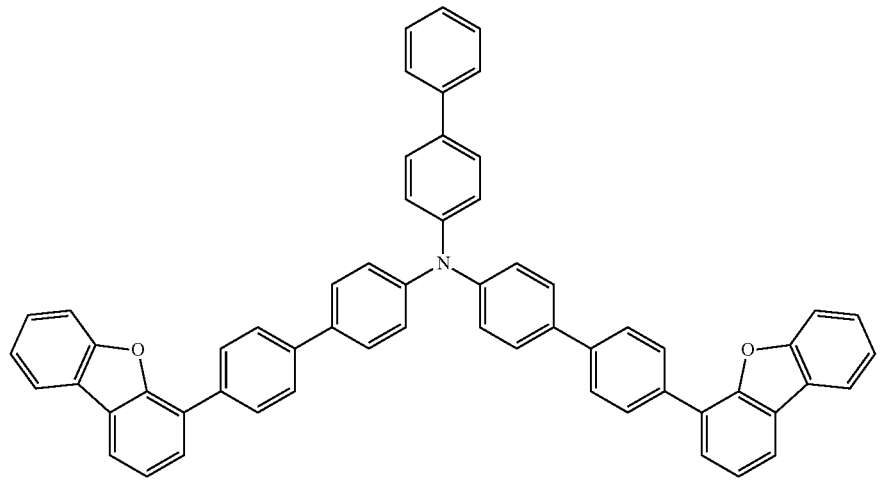
HT23
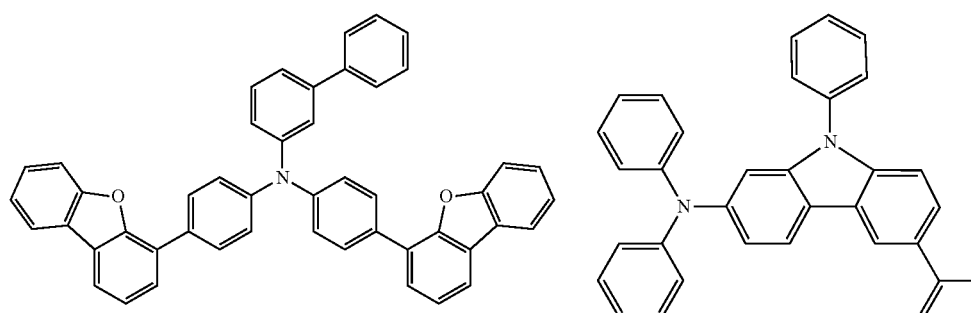
HT24
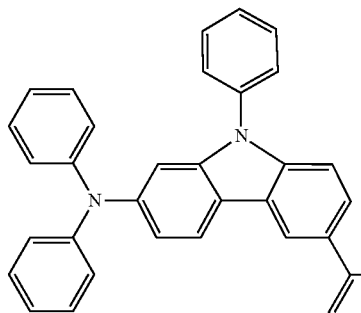
HT25
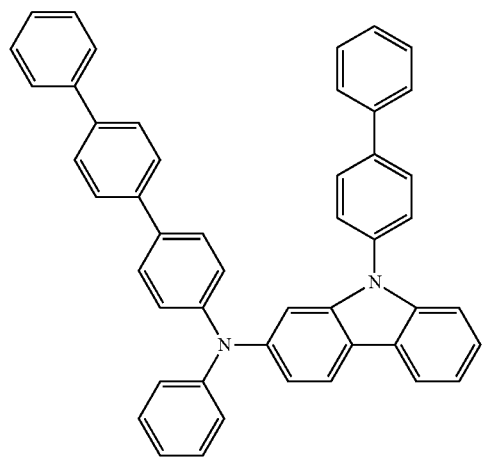
HT26
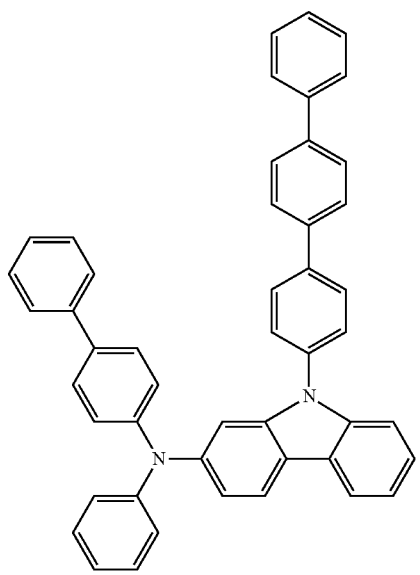
HT27

-continued
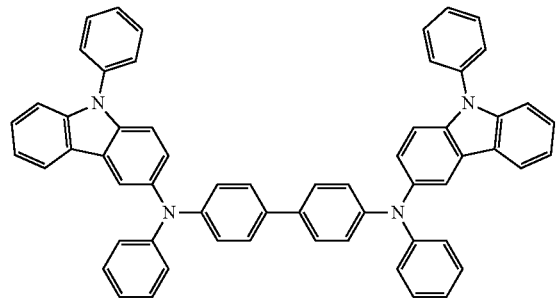
HT28
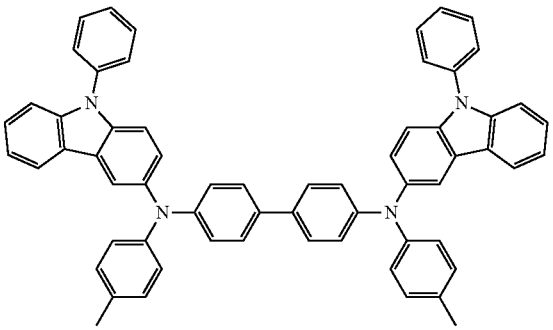
HT29
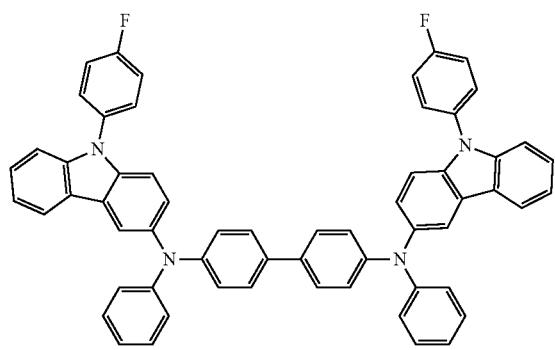
HT30
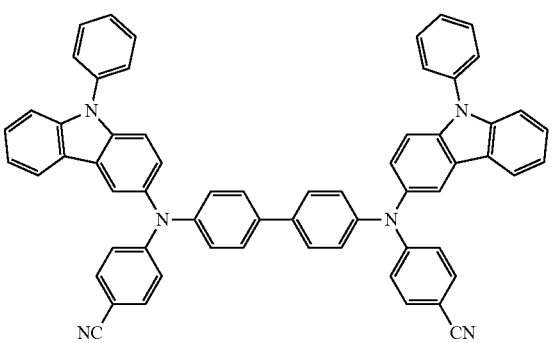
HT31
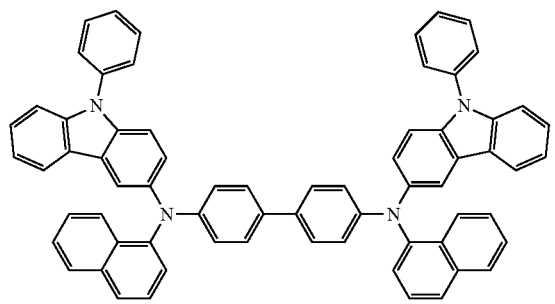
HT32
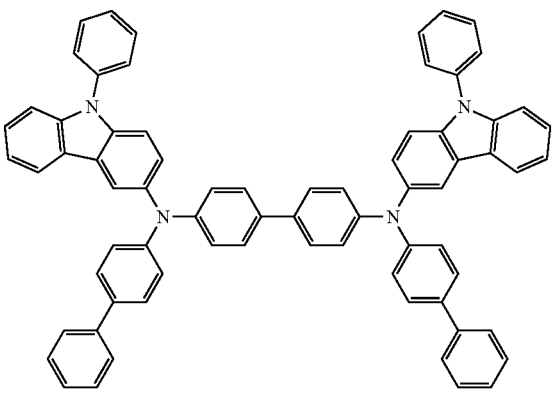
HT33
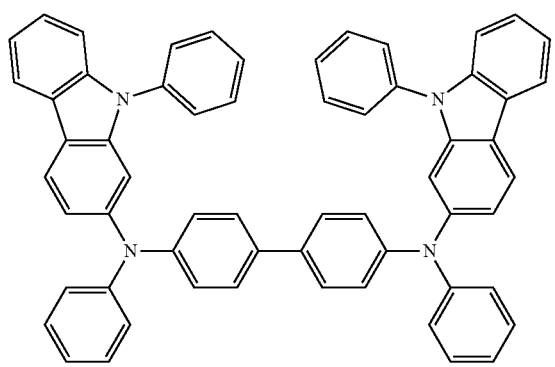
HT34
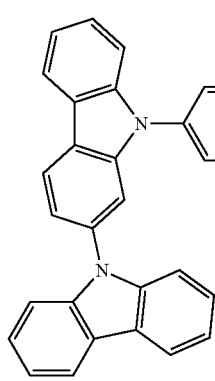
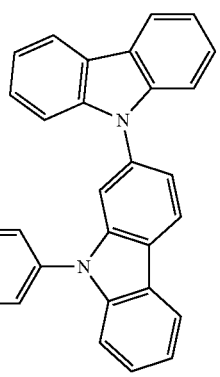
HT35

-continued
HT36
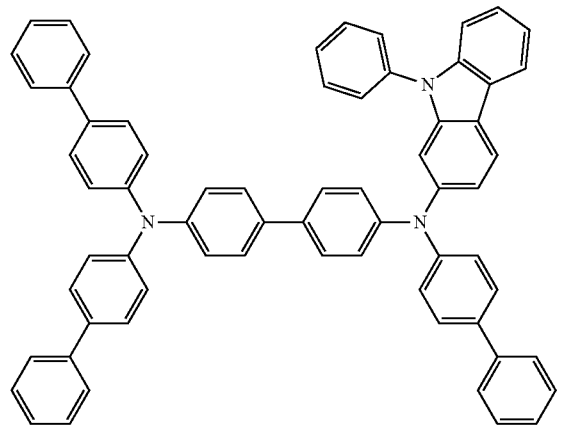
HT37
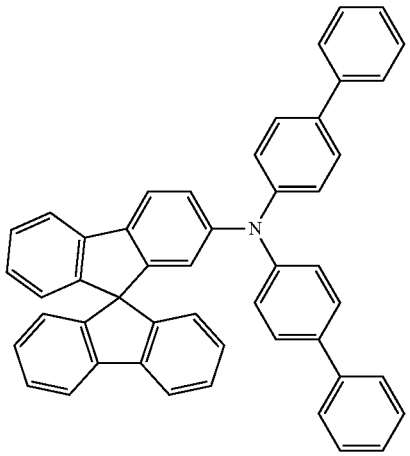
HT38
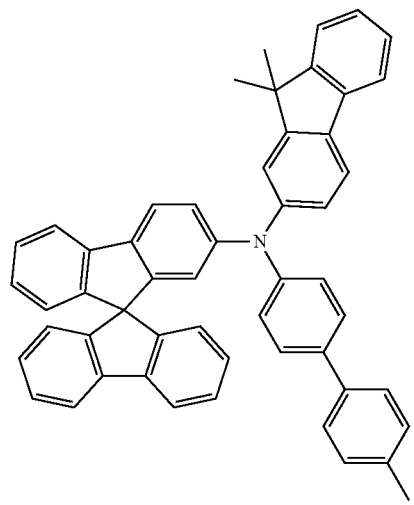
HT39
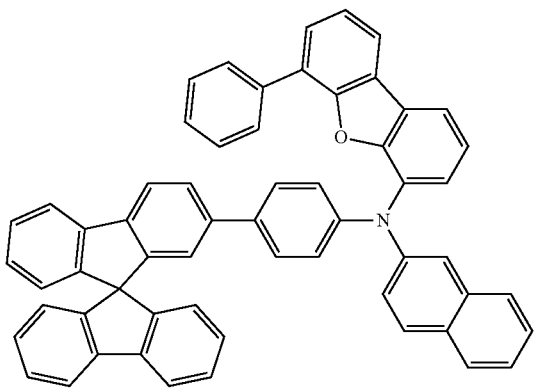
HT40
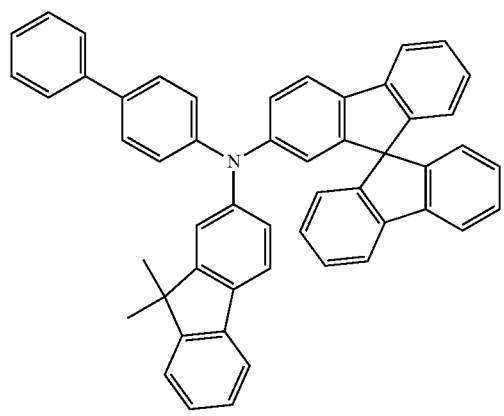
HT41
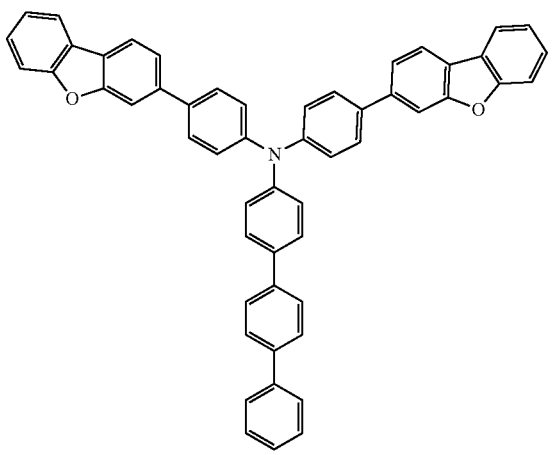

-continued
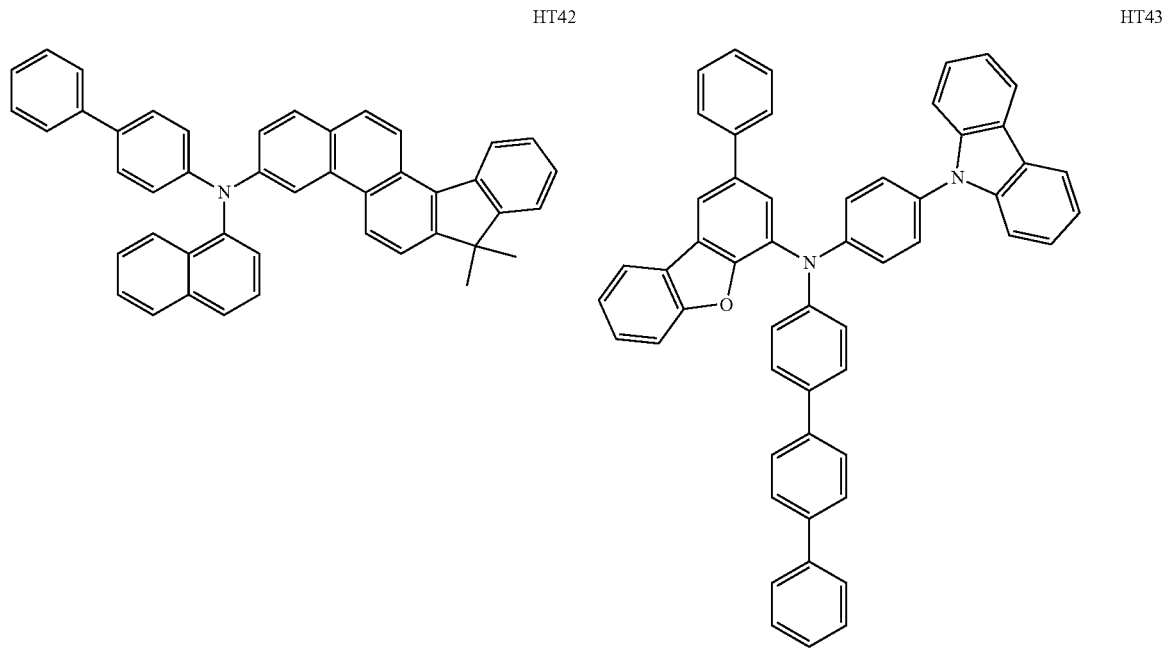
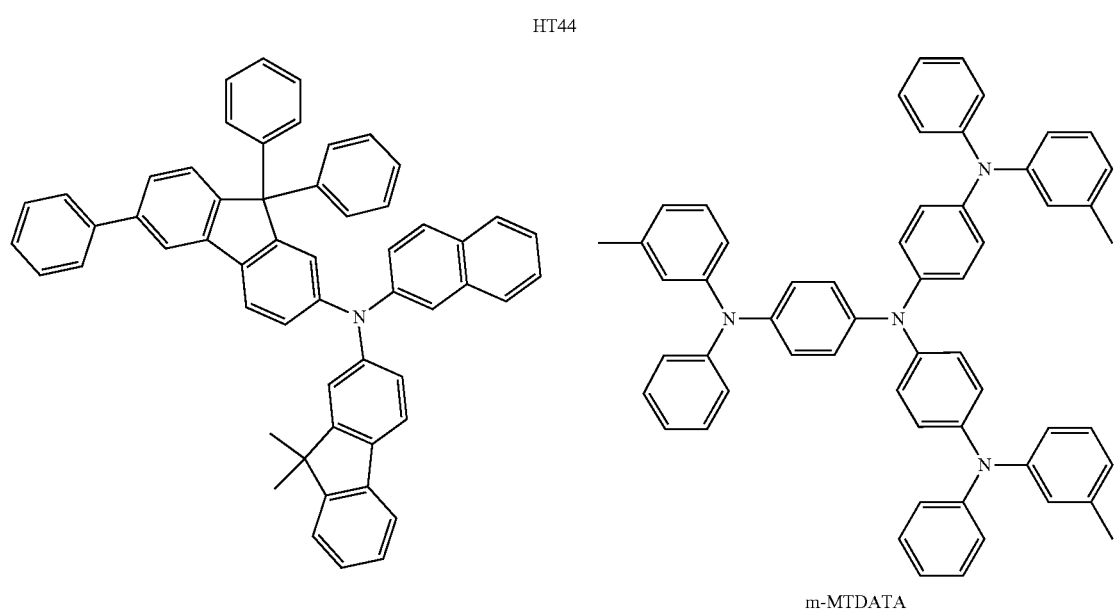

-continued
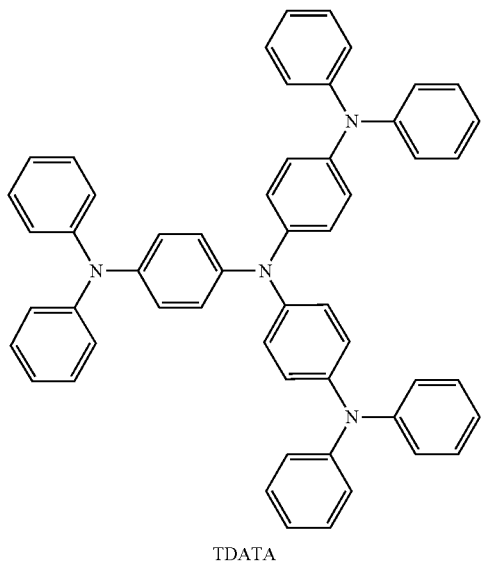
TDATA
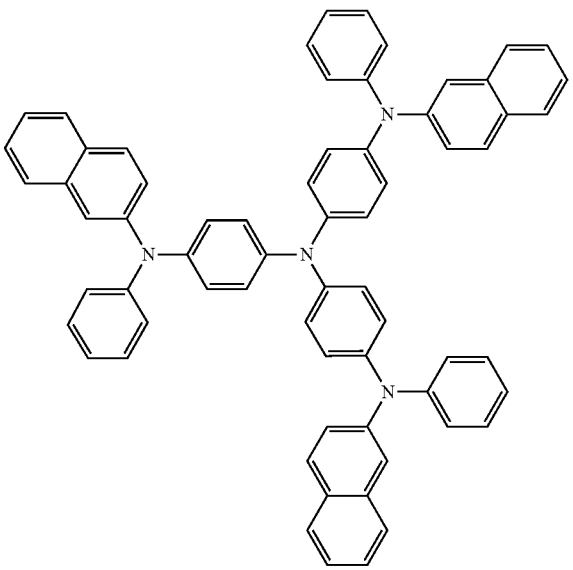
2-TNATA
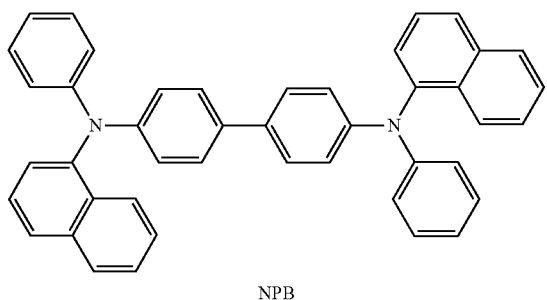
NPB
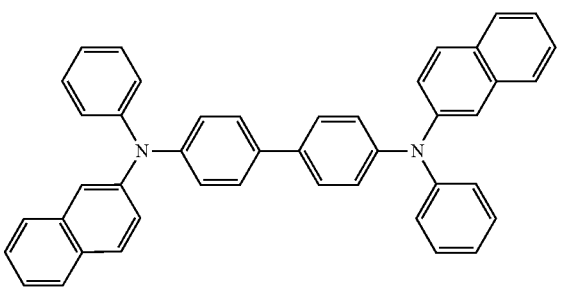
β-NPB
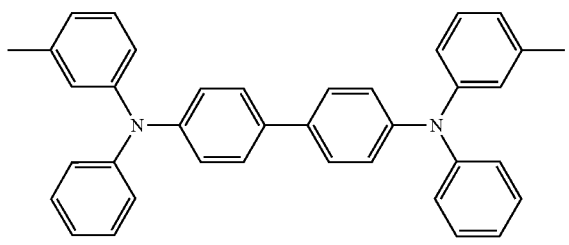
TPD
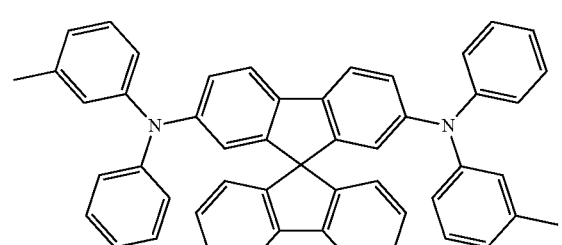
Spiro-TPD
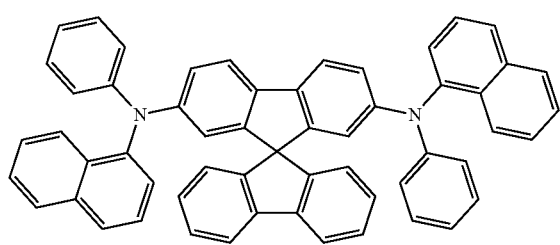
Spiro-NPB
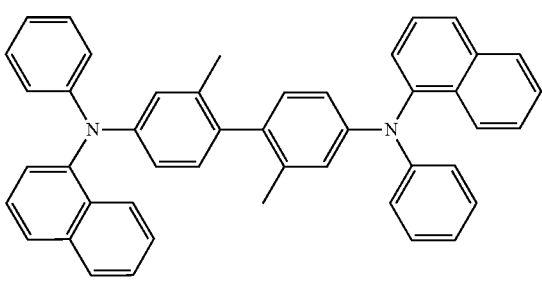
methylated-NPB

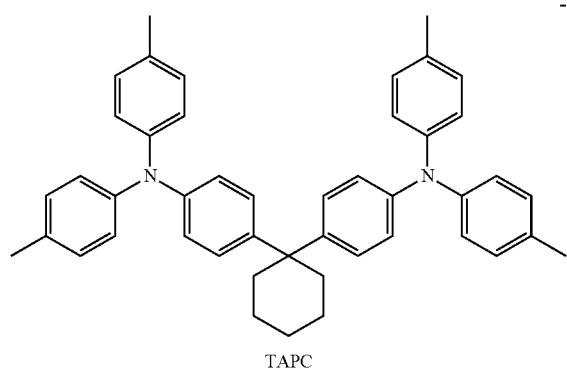

TAPC

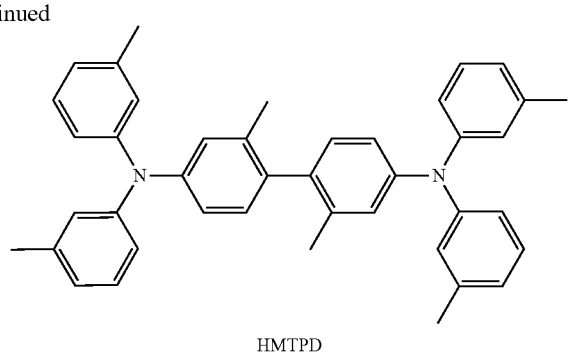

HMTPD

A thickness of the hole transport region may be in a range of about 100 Å to about 10,000 Å. In an embodiment, the thickness of the hole transport region may be in a range of about 100 Å to about 1,000 Å. When the hole transport region includes at least one selected from a hole injection layer and a hole transport layer, the thickness of the hole injection layer may be in a range of about 100 Å to about 9,000 Å, and the thickness of the hole transport layer may be in a range of about 50 Å to about 2,000 Å. In an embodiment, the thickness of the hole injection layer may be in a range of about 100 Å to about 1,000 Å. In an embodiment, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

[p-Dopant]

The hole transport region may include, in addition to these materials, a charge-generation material for the improvement of conductive properties. The charge-generation material may be homogeneously or non-homogeneously dispersed in the hole transport region.

The charge-generation material may be, for example, a p-dopant.

In one embodiment, the lowest unoccupied molecular orbital (LUMO) energy level of the p-dopant may be −3.5 eV or less.

The p-dopant may include a quinone derivative, a metal oxide, a cyano group-containing compound, or any combination particular, but embodiments are not limited thereto.

In one embodiment, the p-dopant may include a quinone derivative such as TCNQ, F4-TCNQ, and the like;

a metal oxide, such as tungsten oxide or molybdenum oxide;

a cyano group-containing compound such as HAT-CN and the like;

a compound represented by Formula 221; or any combination thereof.

However, embodiments are not limited thereto:

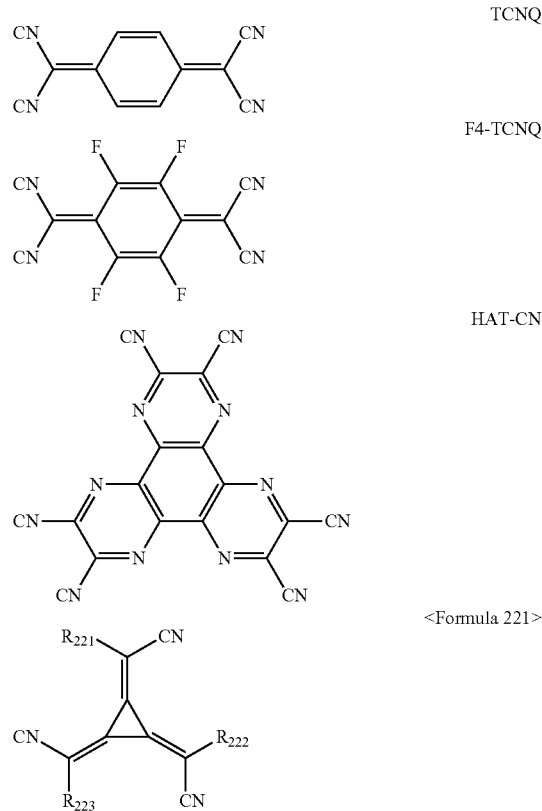

In Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and at least one of $R_{221}$ to $R_{223}$ may each independently be a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, each unsubstituted or substituted with: a cyano group; —F; —Cl; —Br; —I; a $C_1$-$C_{20}$ alkyl group substituted with at least one cyano group; a $C_1$-$C_{20}$ alkyl group substituted with at least one —F; a $C_1$-$C_{20}$ alkyl group substituted with at least one —Cl; a $C_1$-$C_{20}$ alkyl group substituted with at least one —Br; a $C_1$-$C_{20}$ alkyl group substituted with at least one —I; or any combination thereof.

[Emission Layer in Middle Layer 150]

When the light-emitting device 10 is a full-color light-emitting device, the emission layer may be patterned into a red emission layer, a green emission layer, and/or a blue emission layer, according to a sub-pixel. In embodiments, the emission layer may have a stacked structure of two or more layers of a red emission layer, a green emission layer, and a blue emission layer, in which the two or more layers contact each other or are separated from each other. In embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

The amount of the dopant in the emission layer may be from about 0.01 to about 15 parts by weight based on 100 parts by weight of the host. However, embodiments are not limited thereto.

In embodiments, the emission layer may include a quantum dot.

A thickness of the emission layer may be in a range of about 100 Å to about 1,000 Å. In an embodiment, the thickness of the emission layer may be in a range of about 200 Å to about 600 Å. When the thickness of the emission layer is within this range, excellent light-emission characteristics may be obtained without a substantial increase in driving voltage.

[Host in Emission Layer]

In embodiments, the host may include a compound represented by Formula 301 below:

$$[Ar_{301}]_{xb11}\text{-}[(L_{301})_{xb1}\text{-}R_{301}]_{xb21}$$ <Formula 301>

In Formula 301, $Ar_{301}$ may be a substituted or unsubstituted $C_5$-$C_{30}$ carbocyclic group or a substituted or unsubstituted $C_1$-$C_{60}$ heterocyclic group, xb11 may be 1, 2, or 3, $L_{301}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xb1 may be 0, 1, 2, 3, 4, or 5, $R_{301}$ may be deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be 1, 2, 3, 4, or 5, and $Q_{301}$ to $Q_{303}$ are the same as described in connection with $Q_1$.

In embodiments, when xb11 in Formula 301 is 2 or more, two or more $Ar_{301}$(s) may be linked to each other via a single bond.

In one embodiment, the host may include a compound represented by Formula 301-1, a compound represented by Formula 301-2, or any combination embodiment:

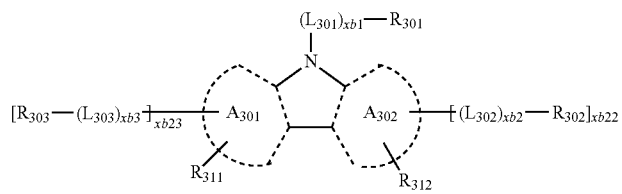

<Formula 301-1>

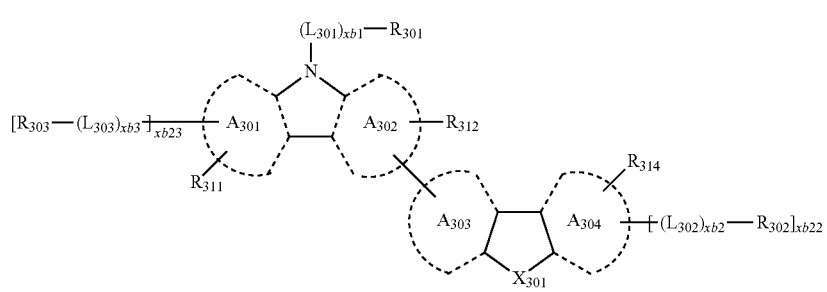

<Formula 301-2>

In Formulae 301-1 and 301-2, ring $A_{301}$ to ring $A_{304}$ may each independently be a $C_5$-$C_{60}$ carbocyclic group or a $C_1$-$C_{60}$ heterocyclic group, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are the same as described above, $L_{302}$ to $L_{304}$ are each independently the same as described in connection with $L_{301}$, xb2 to xb4 each independently the same as described in connection with xb1, and $R_{302}$ to $R_{305}$ and $R_{311}$ to $R_{314}$ are the same as described in connection with $R_{301}$.

In one embodiment, the host may include an alkaline earth-metal complex. For example, the host may be a Be complex (for example, Compound H55), a Mg complex, a Zn complex, or any combination thereof.

In one embodiment, the host may include one of Compounds H1 to H120, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof, but embodiments are not limited thereto:

H1

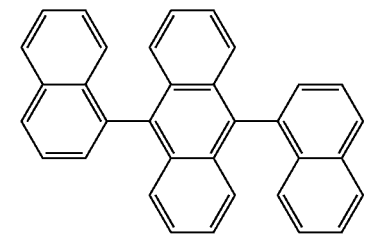

H2

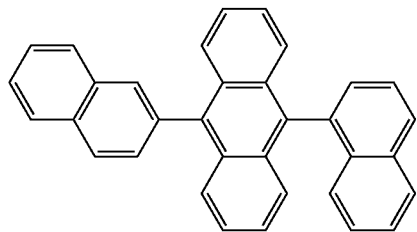

H3

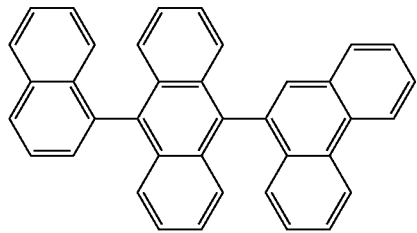

H4

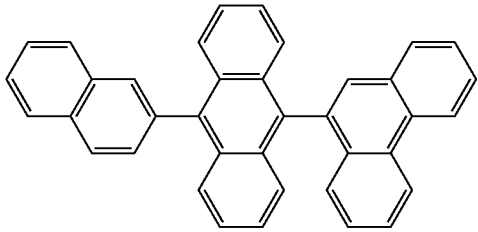

H5

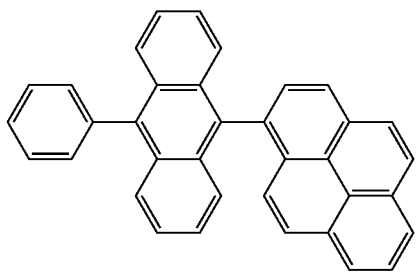

H6

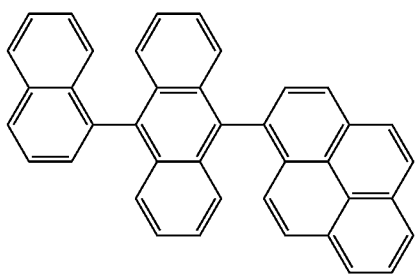

H7

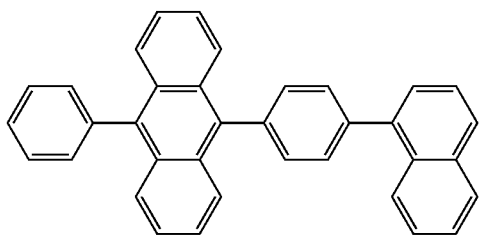

H8

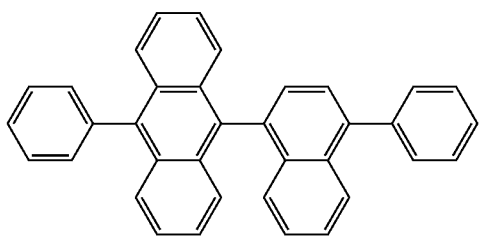

H9

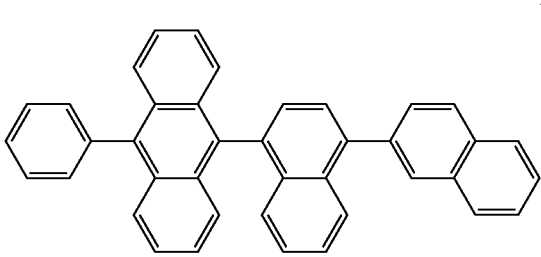

H10

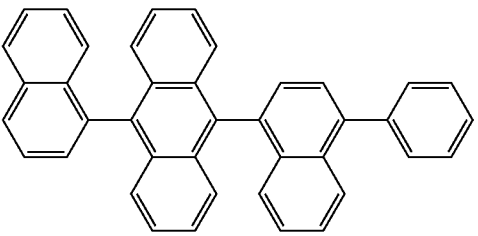

-continued
H11
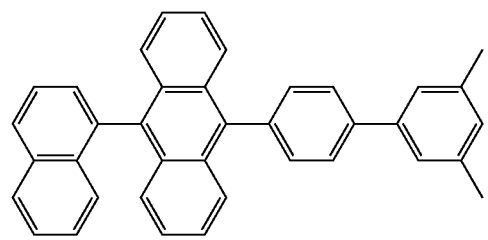
H12
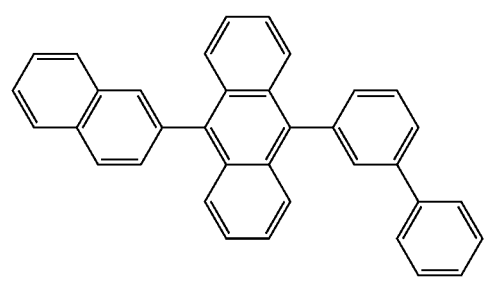
H13
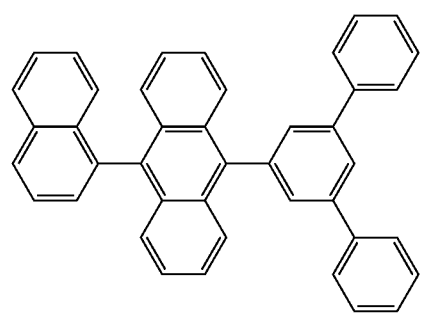
H14
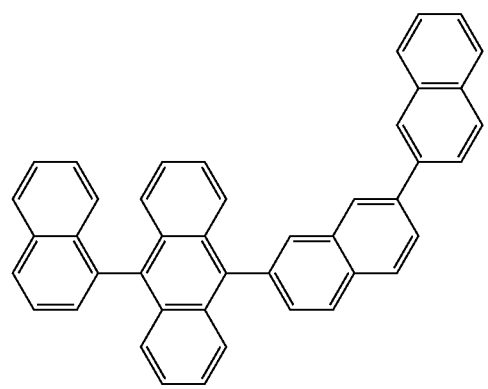
H15
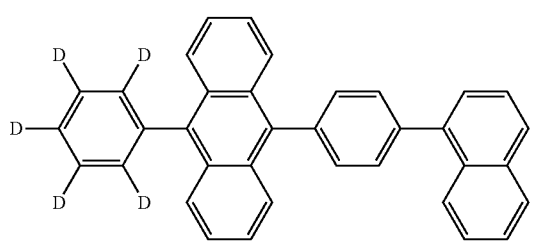
-continued
H16
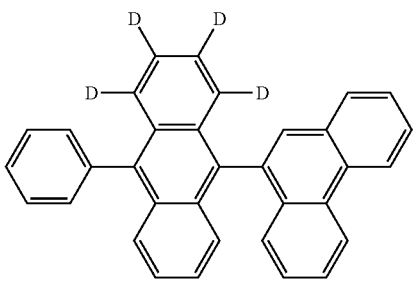
H17
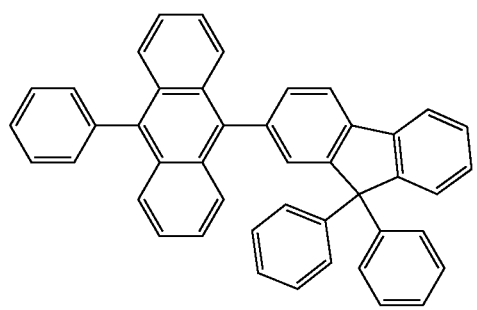
H18
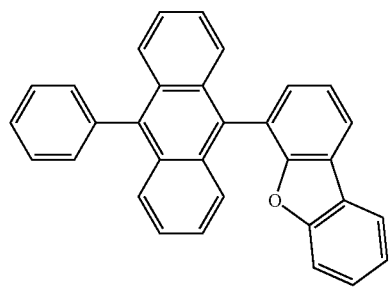
H19
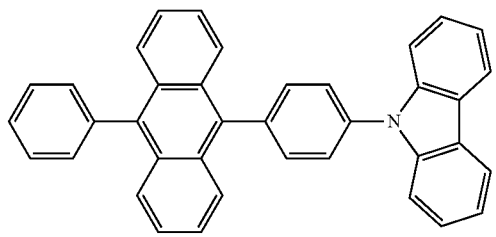
H20
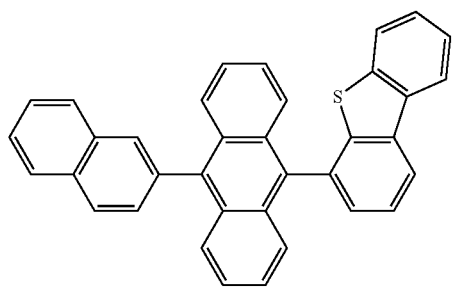

H21
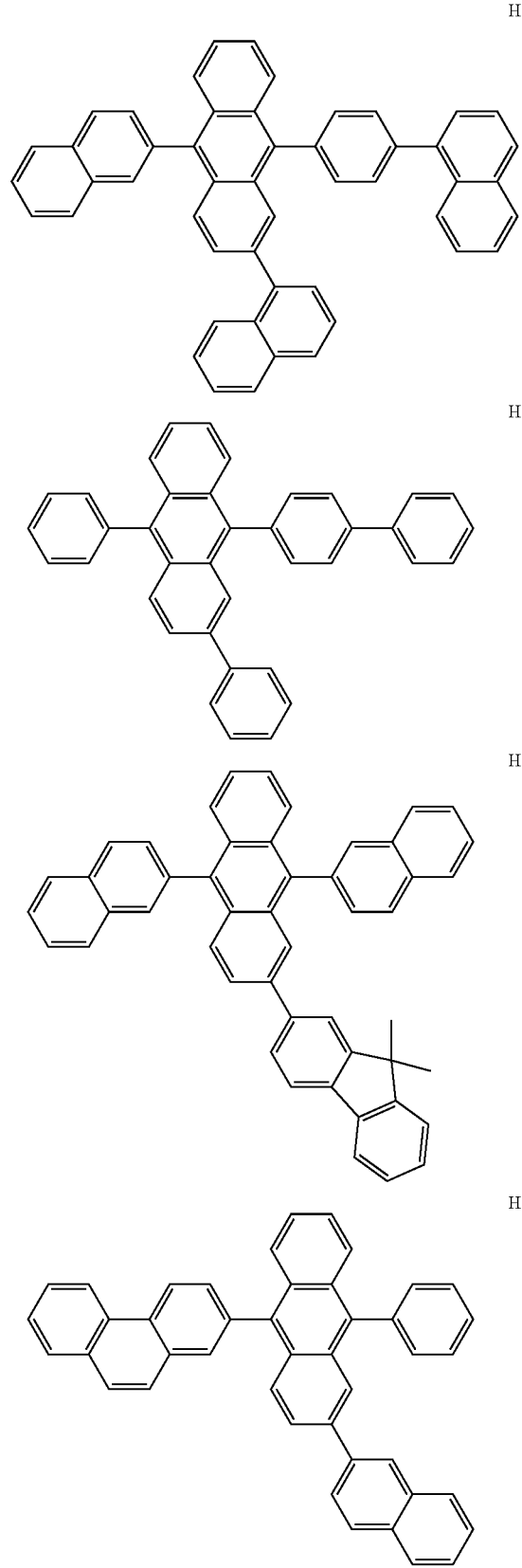
H22
H23
H24
H25
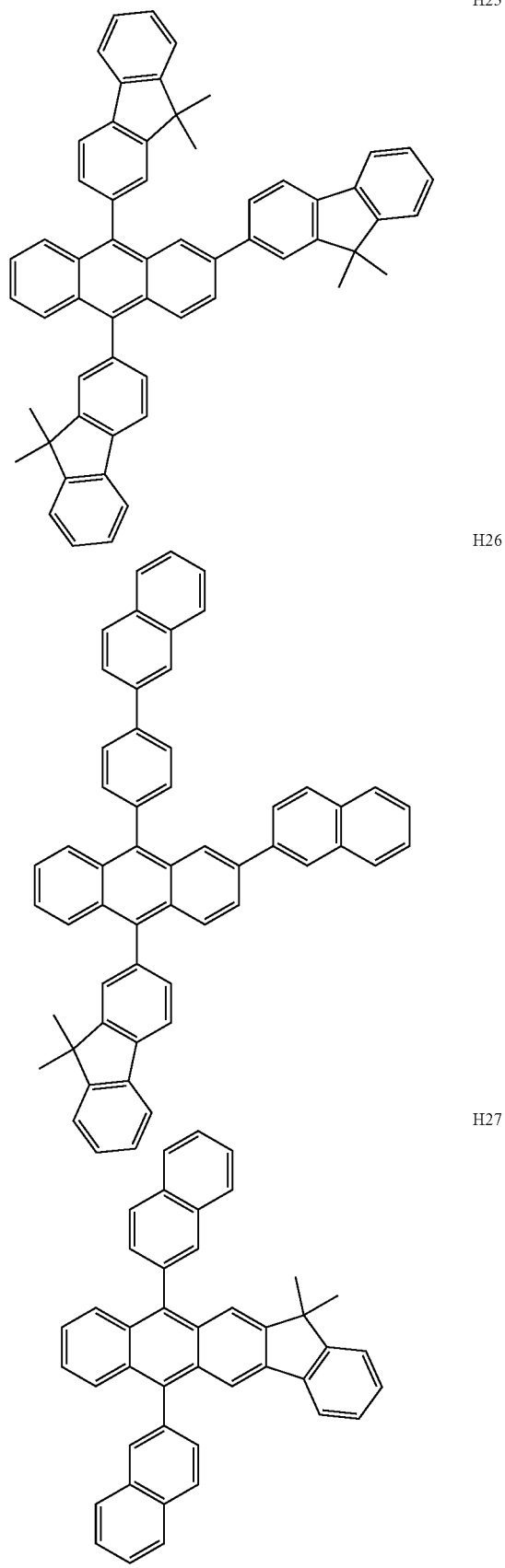
H26
H27

H28
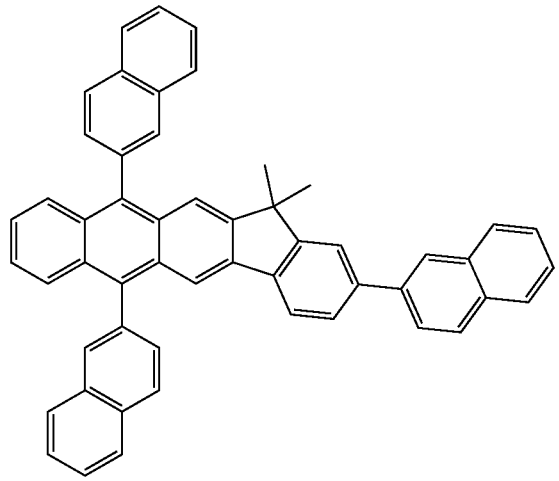
H29
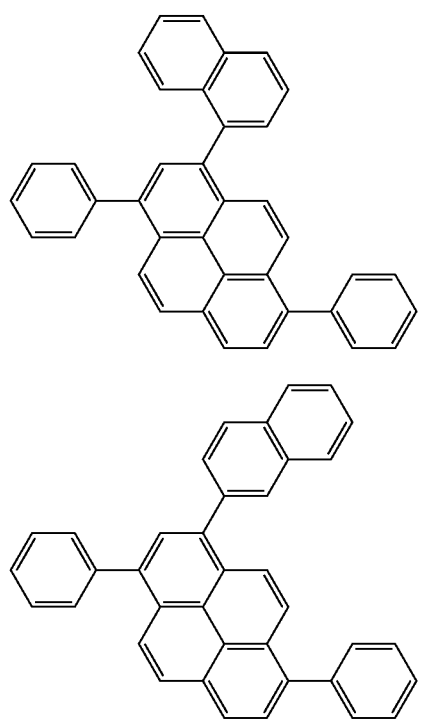
H30
H31
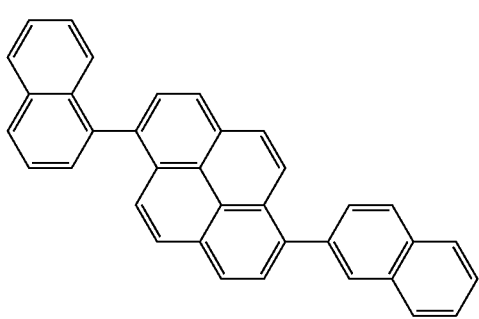
H32
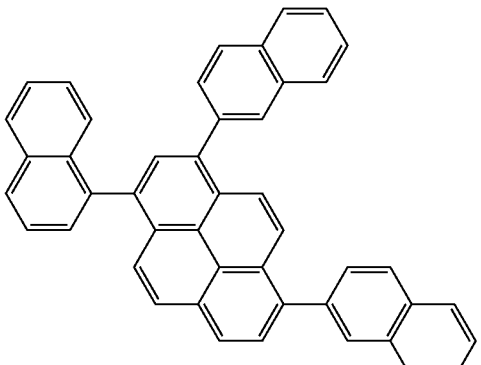
H33
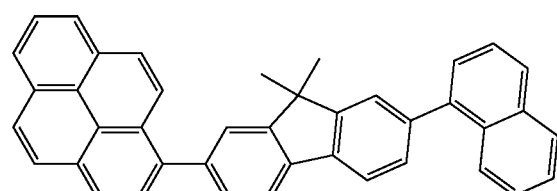
H34
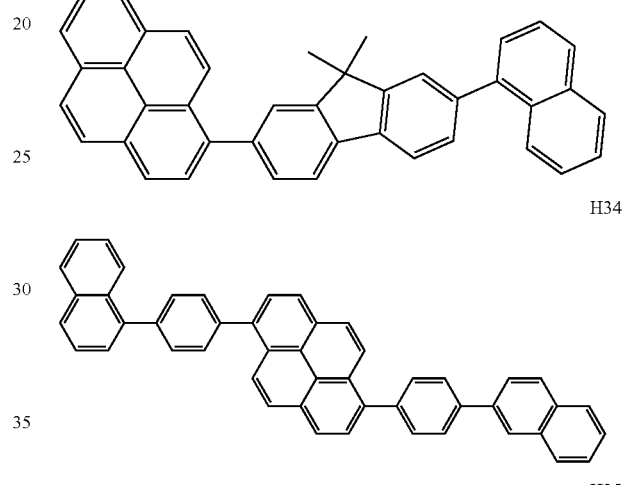
H35
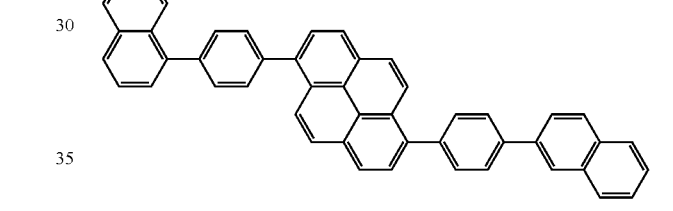
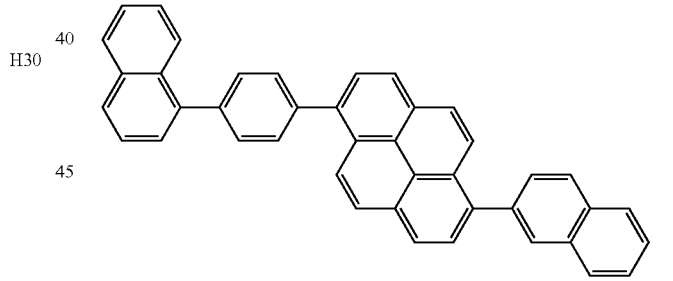
H36
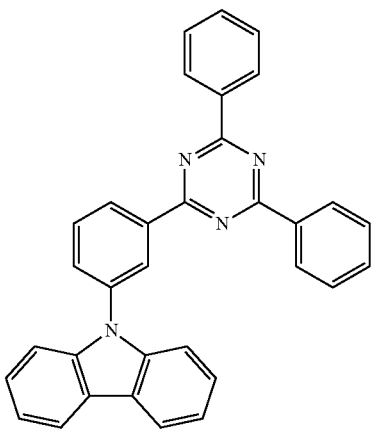

H37
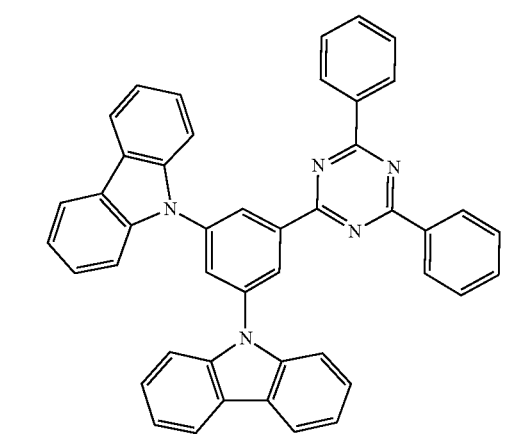
H38
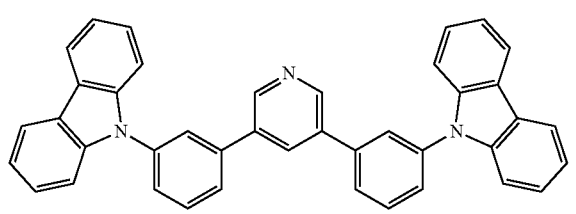
H39
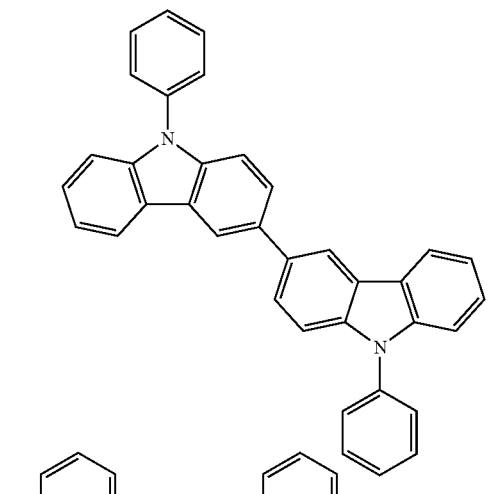
H40
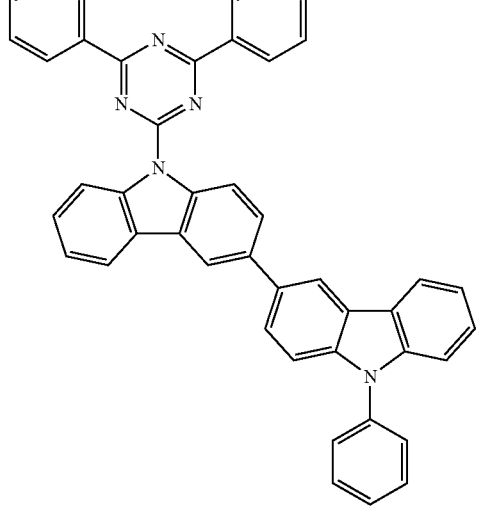
H41
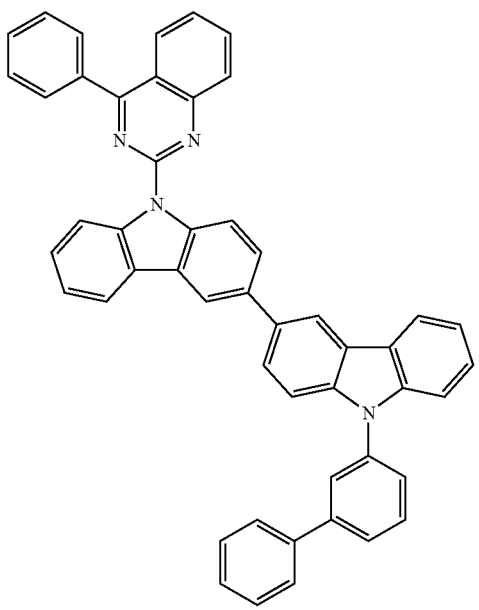
H42
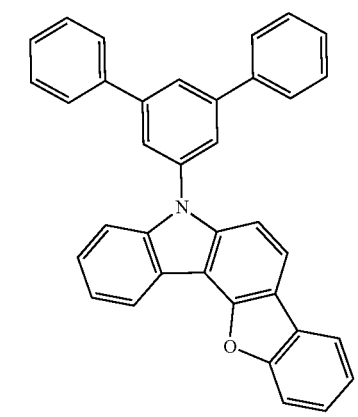
H43
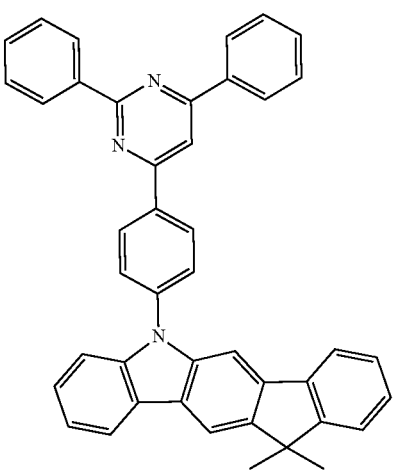

-continued
H44
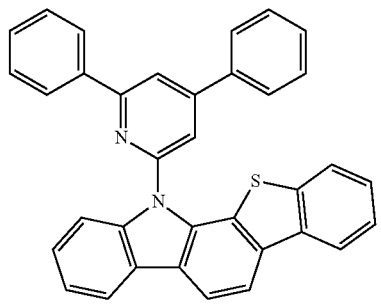
H45
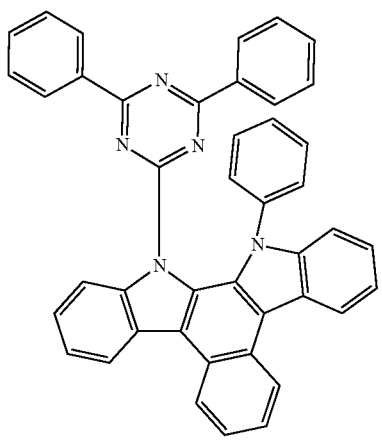
H46
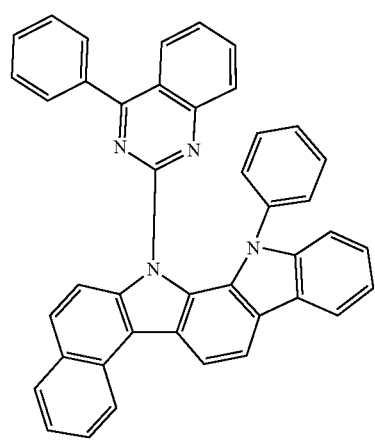
H47
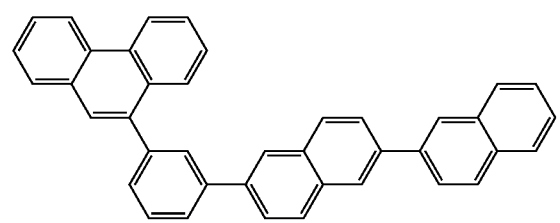
H48
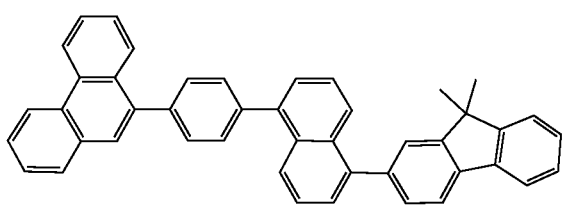
-continued
H49
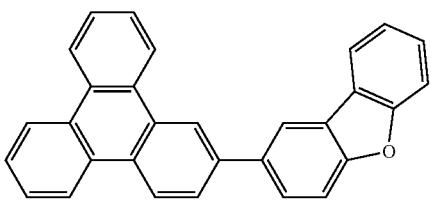
H50
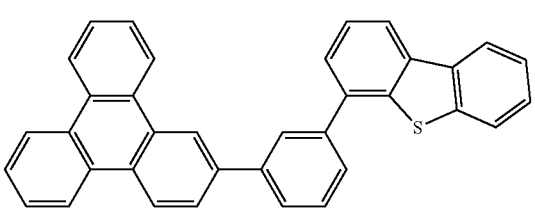
H51
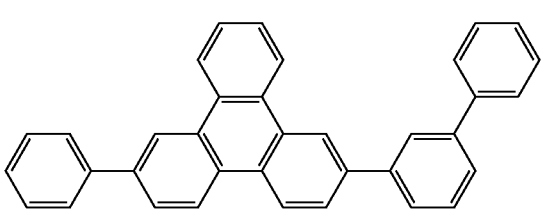
H52
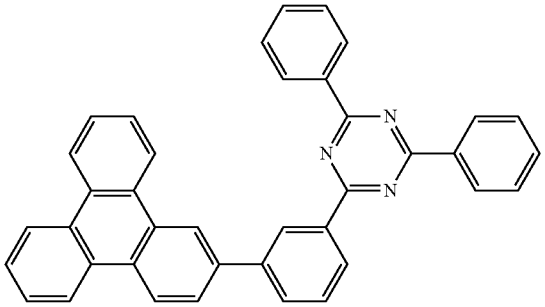
H53
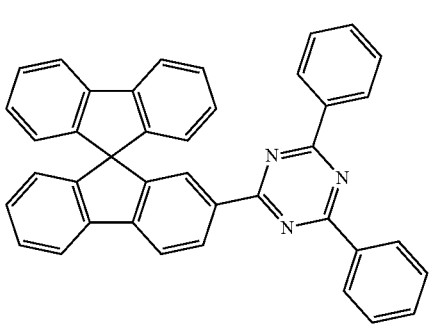

H54
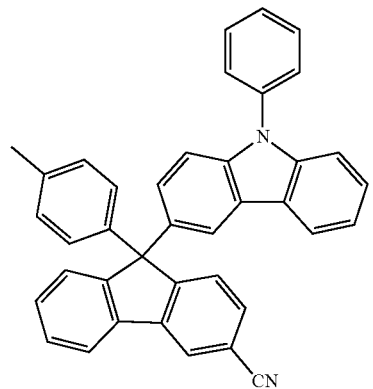
H55
H56
H57
H58
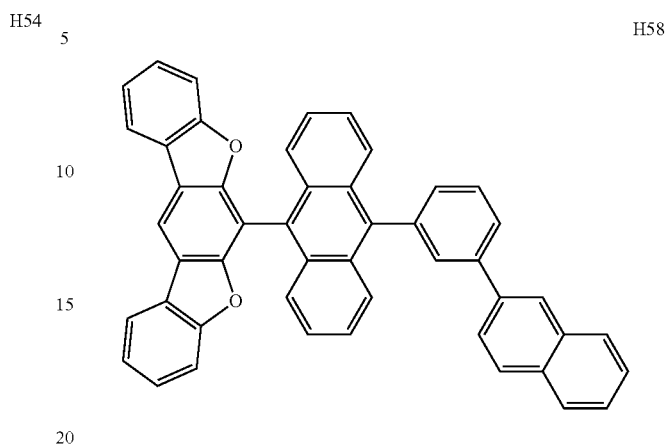
H59
H60
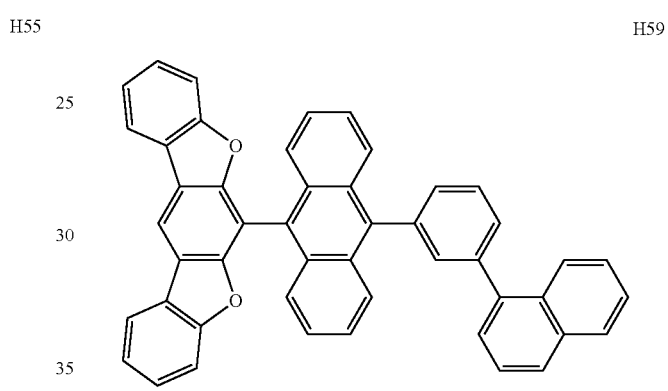
H61

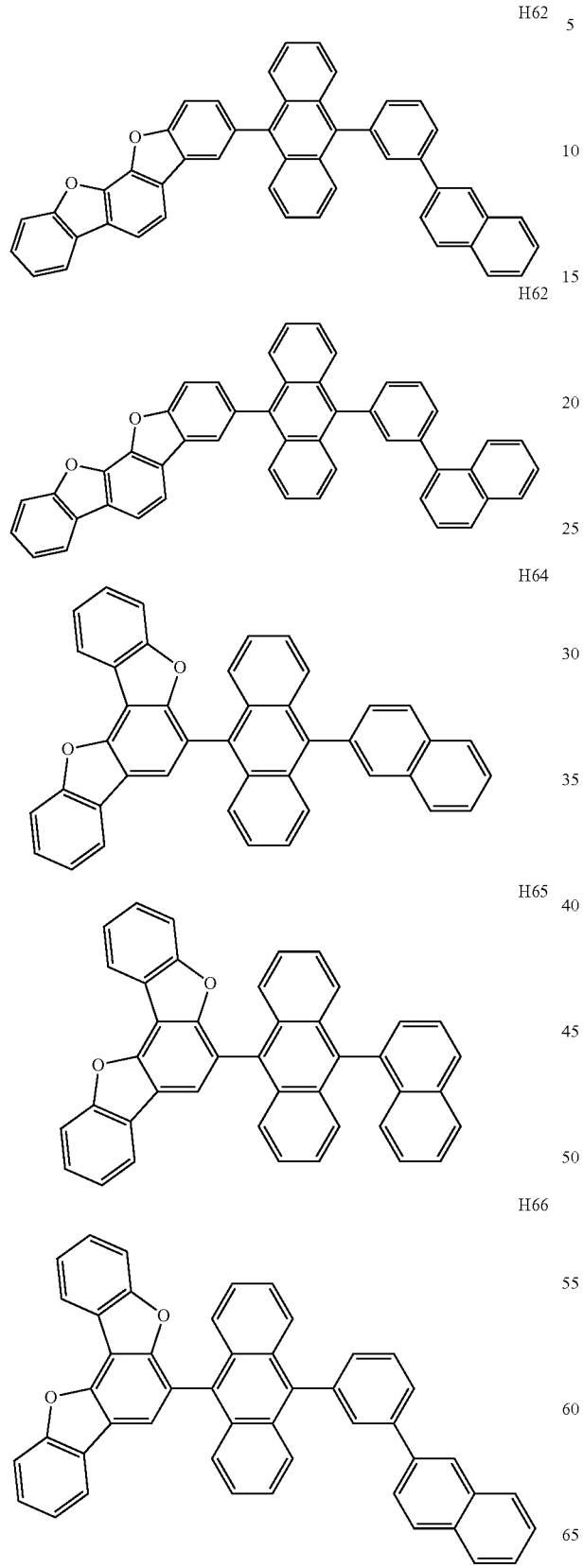
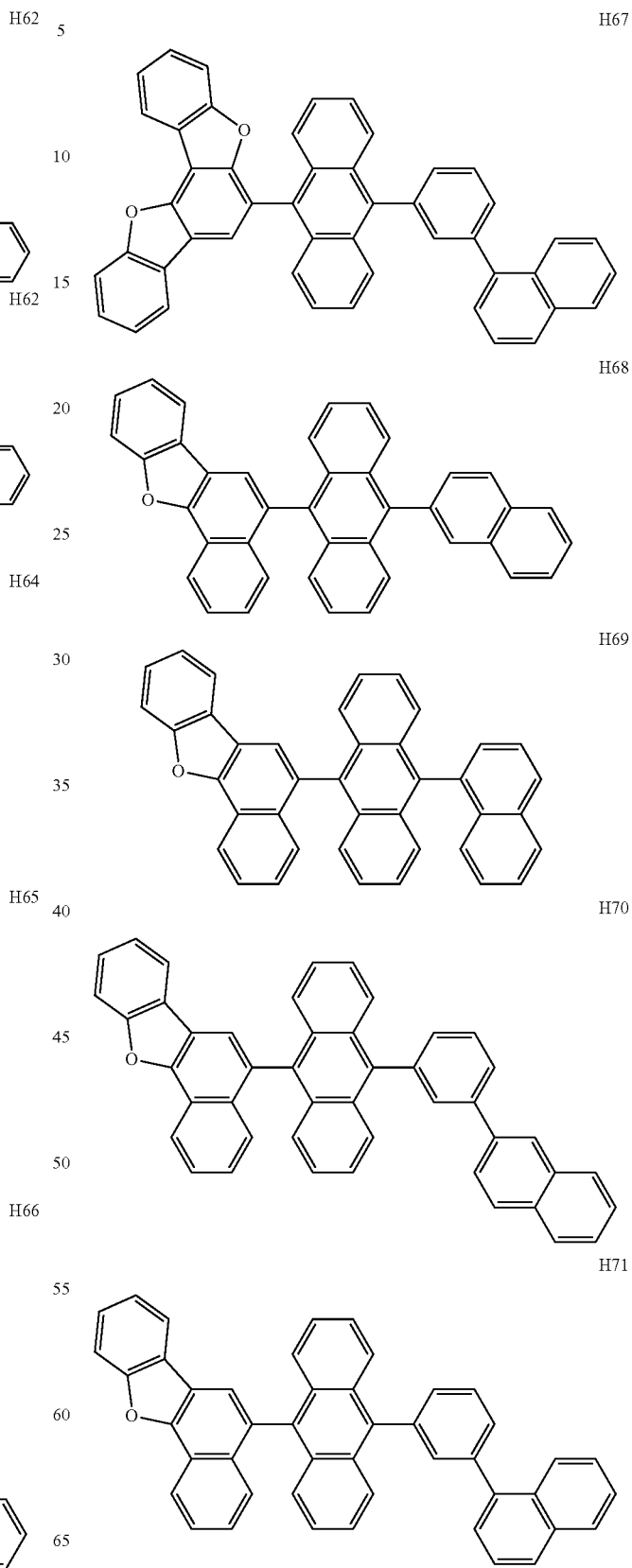

H72
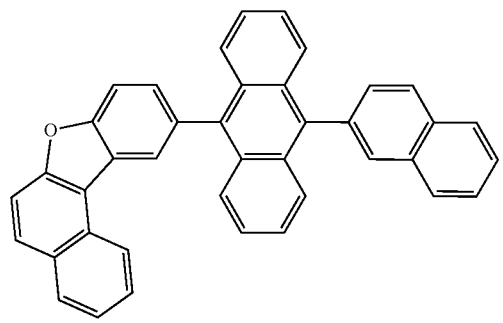
H73
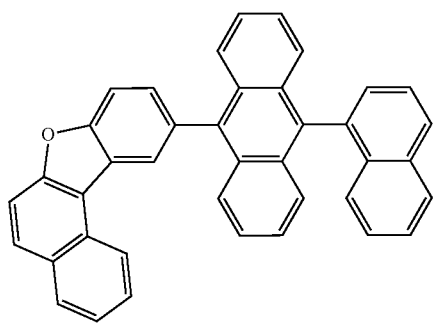
H74
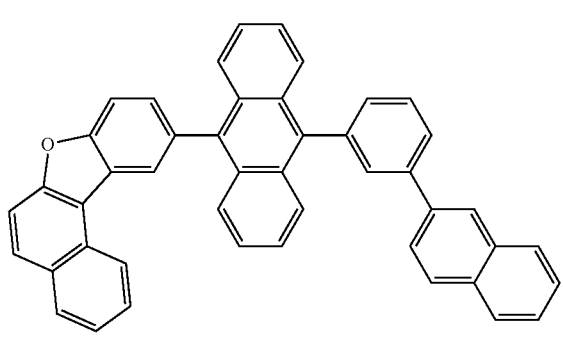
H75
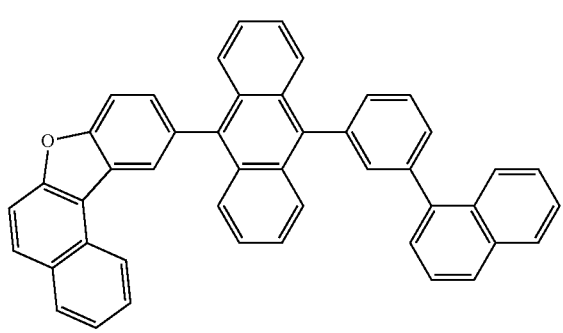
H76
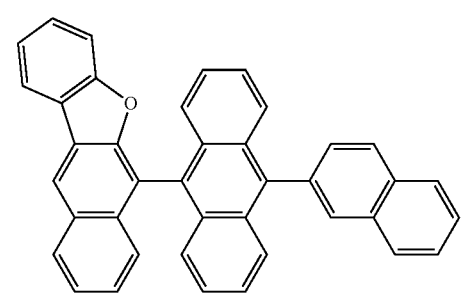
H77
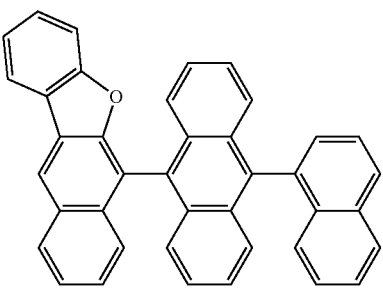
H78
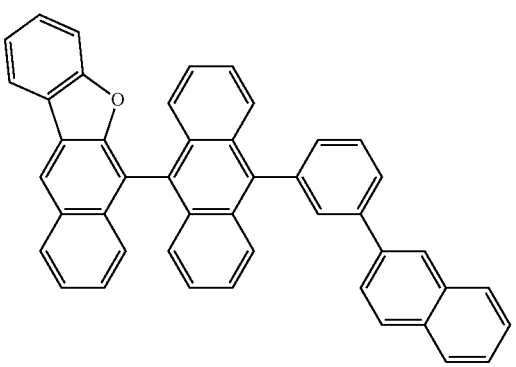
H79
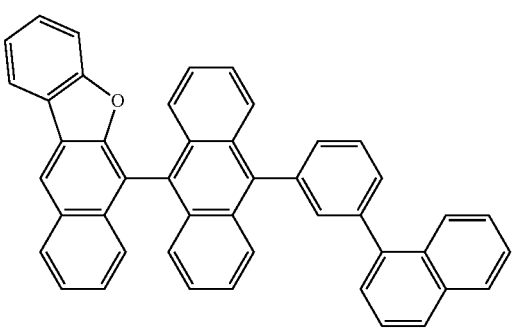
H80
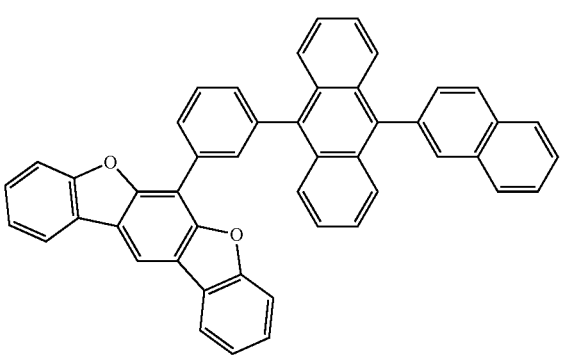

H81
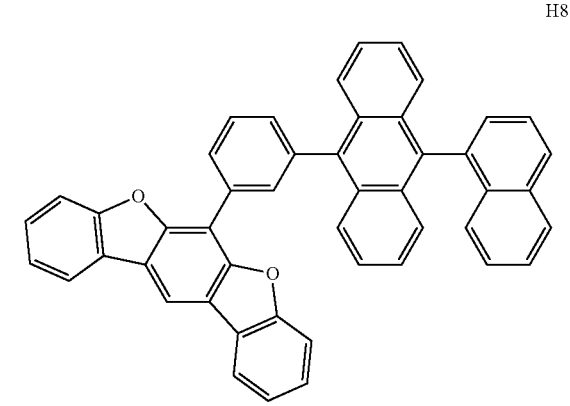
H82
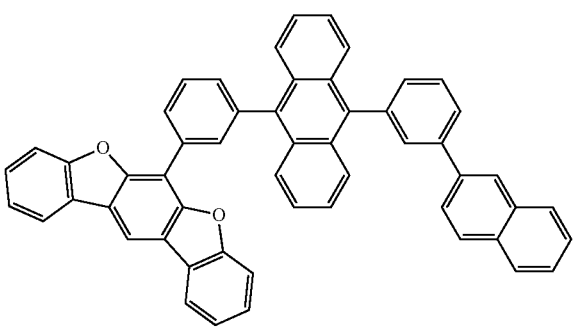
H83
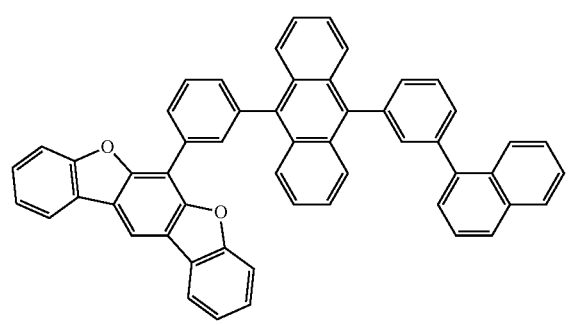
H84
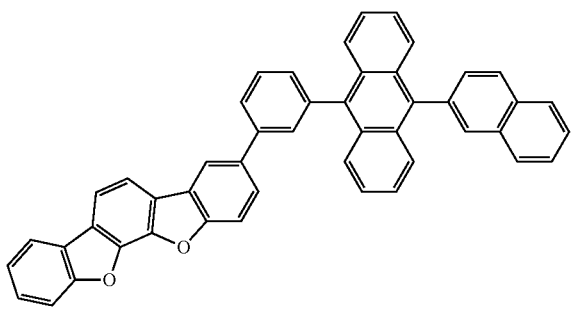
H85
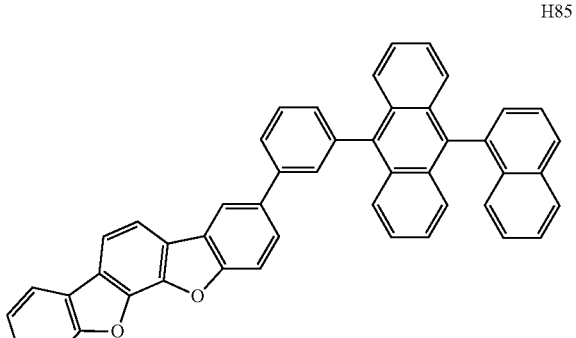
H86
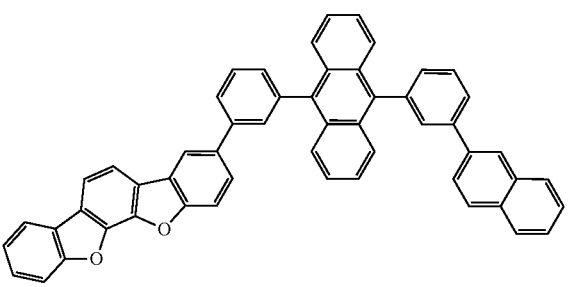
H87
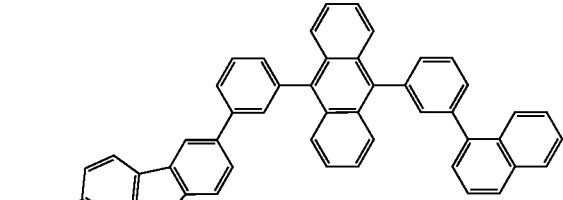
H88
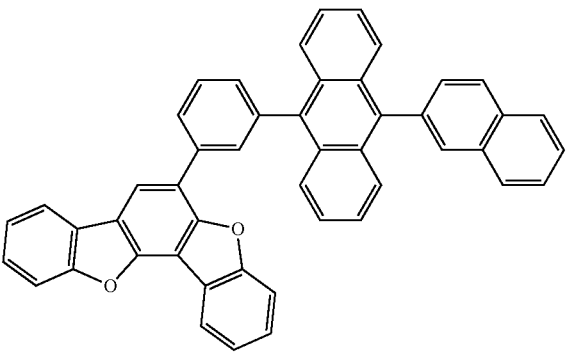

H89
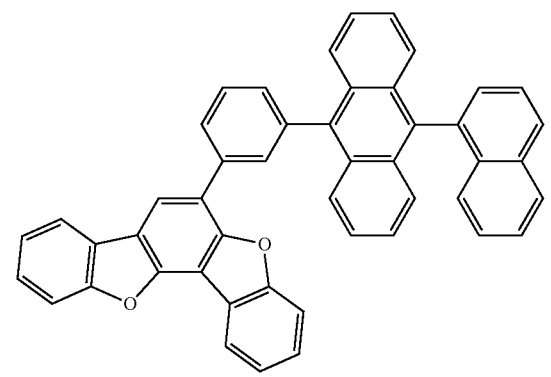
H90
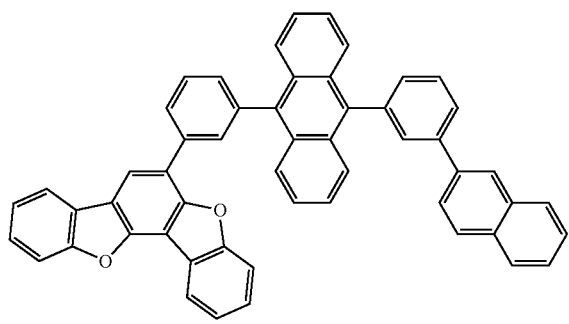
H91
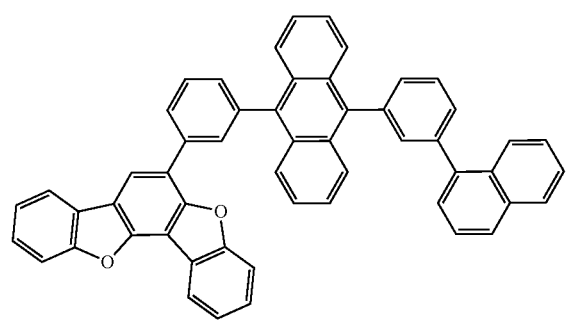
H92
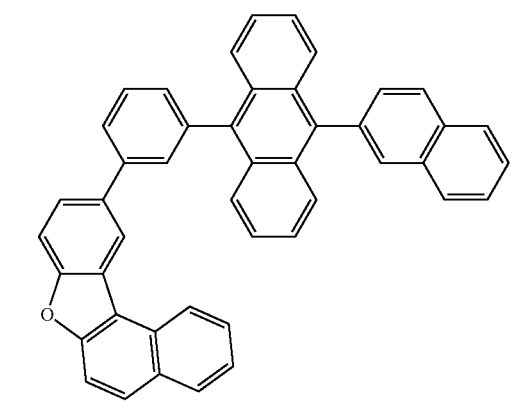
H93
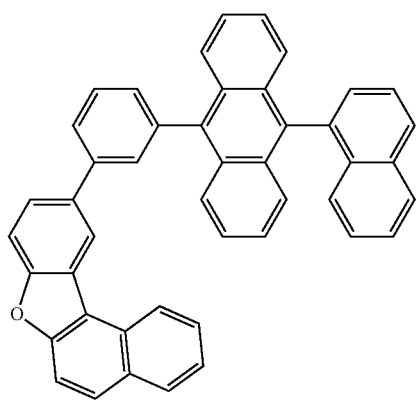
H94
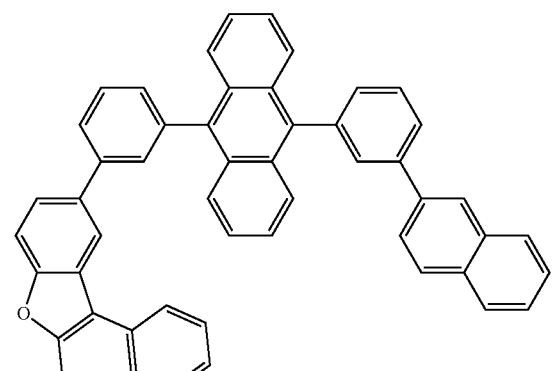
H95
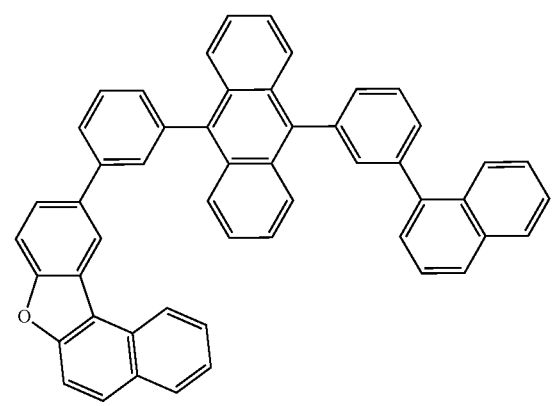
H96
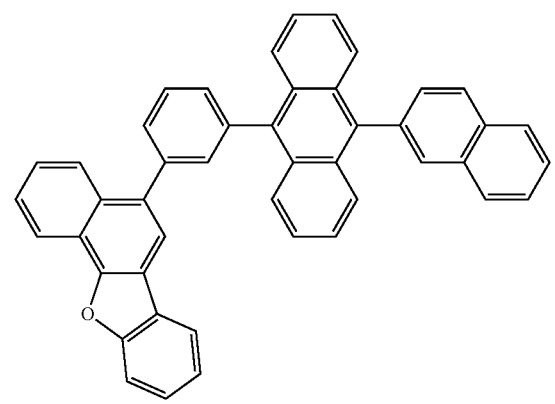

-continued
H97
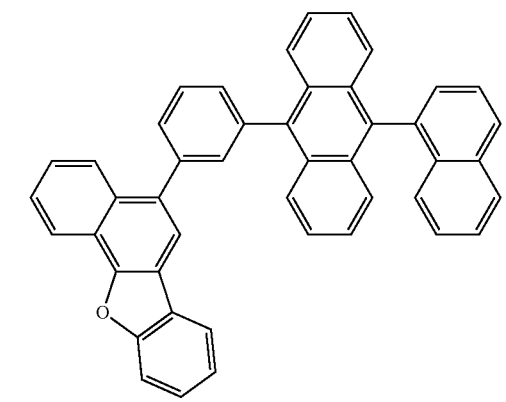
H98
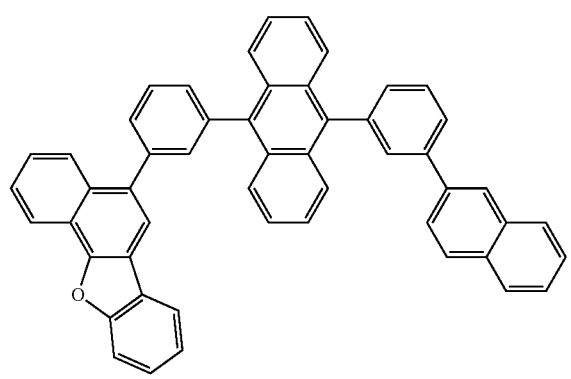
H99
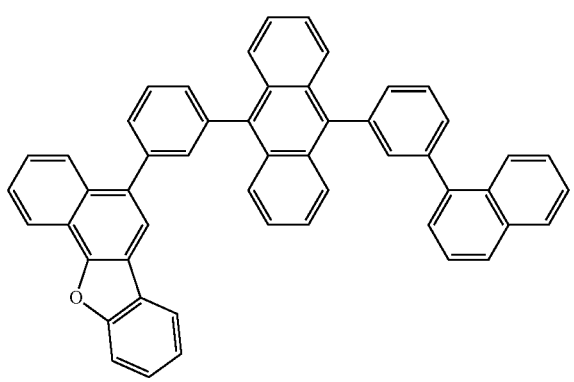
H100
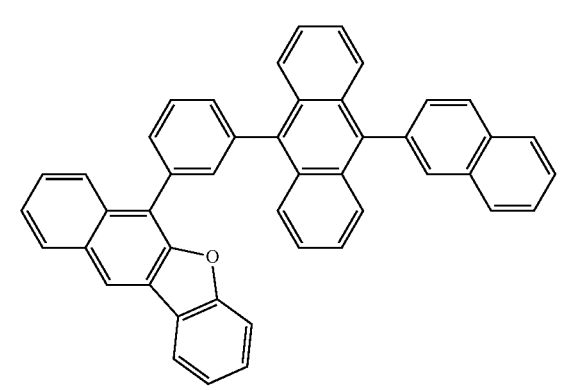
-continued
H101
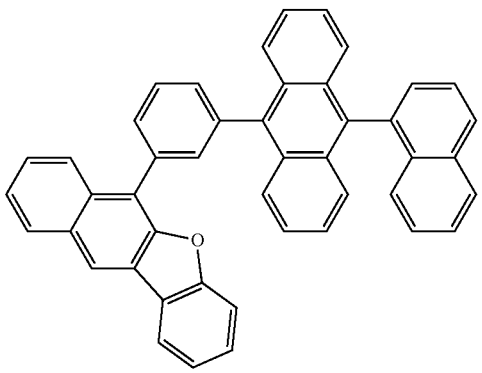
H102
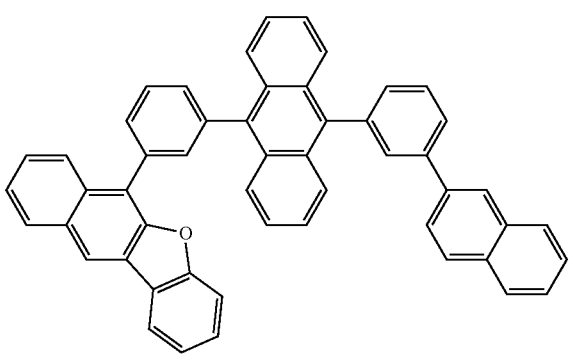
H103
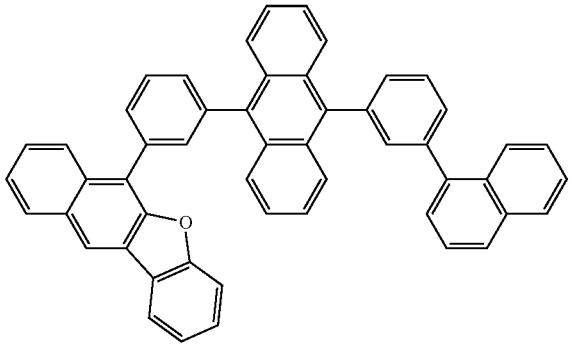
H104
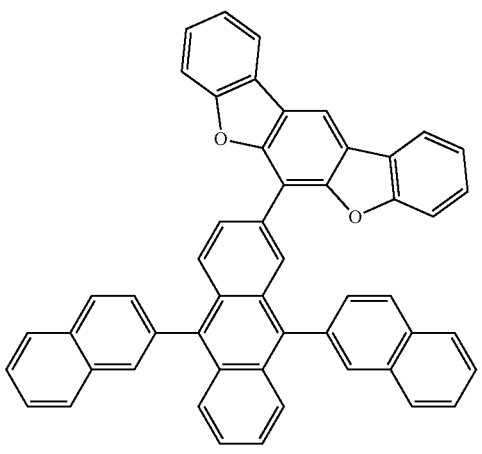

H105

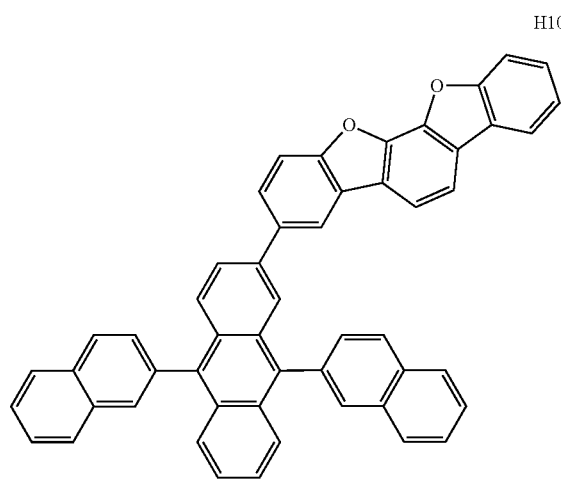

H106

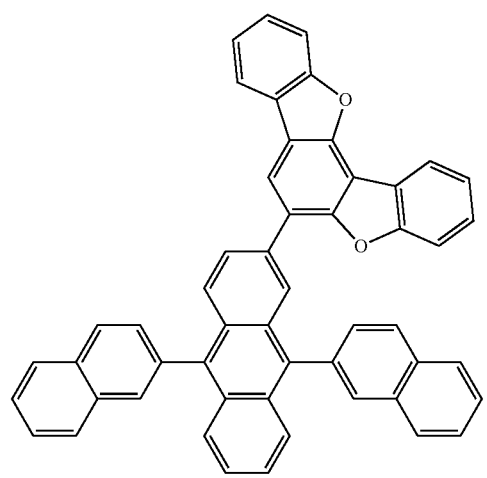

H107

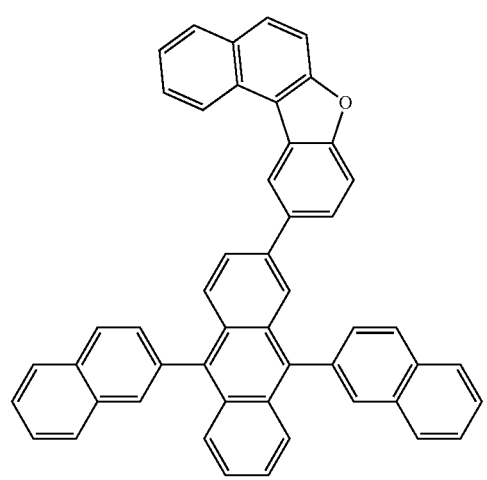

H118

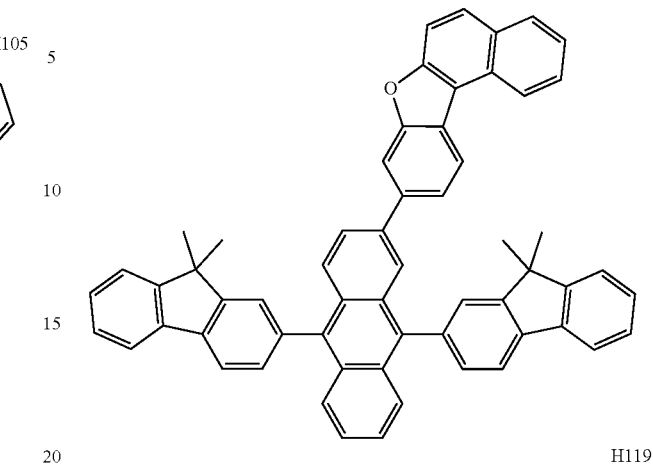

H119

H120

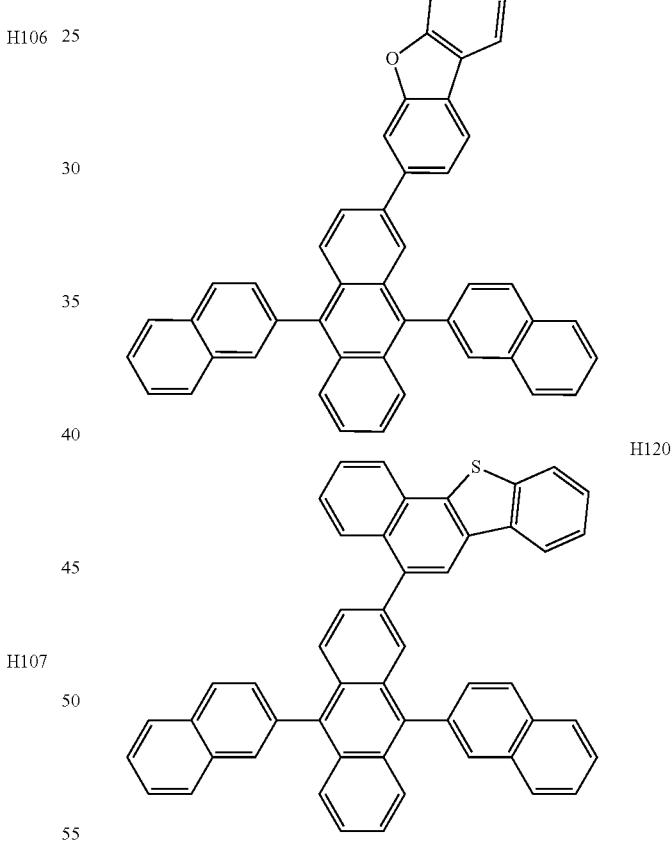

[Phosphorescent Dopant Included in Emission Layer in Middle Layer 150]

The phosphorescent dopant may include the trimetallic complex of Formula 1 according to an embodiment.

The phosphorescent dopant may further comprise an organometallic compound represented by Formula 401, in addition to the trimetallic complex of Formula 1 according to an embodiment:

$$M(L_{401})_{xc1}(L_{402})_{xc2} \qquad \text{<Formula 401>}$$

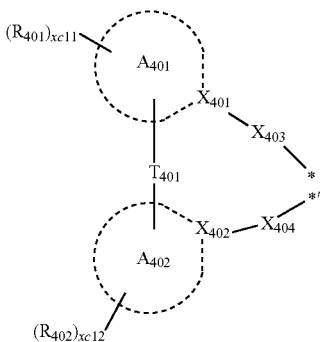

<Formula 402>

In Formulae 401 and 402,

M may be transition metal (for example, iridium (Ir), platinum (Pt), palladium (Pd), osmium (Os), titanium (Ti), gold (Au) hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more $L_{401}$(s) may be identical to or different from each other, $L_{402}$ may be an organic ligand, xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be selected from a $C_5$-$C_{60}$ carbocyclic group or a $C_1$-$C_{60}$ heterocyclic group, $T_{401}$ may be a single bond, *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{411}$), or Si($Q_{413}$)($Q_{411}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_4OI$), or —P(=O)($Q_{401}$)($Q_{402}$), $Q_{401}$ to $Q_{403}$ are the same as described in connection with $Q_1$, xc11 and xc12 may each independently be an integer from 0 to 10, and

* and *' in Formula 402 each indicate a binding site to M in Formula 401.

In embodiments, in Formula 402, i) $X_{401}$ may be nitrogen, and $X_{402}$ may be carbon, or ii) $X_{401}$ and $X_{402}$ may be nitrogen at the same time.

In embodiments, when xc1 in Formula 402 is 2 or more, two ring $A_{401}$(s) in two or more $L_{401}$(s) may optionally be linked to each other via $T_{402}$, which is a linking group, or two ring $A_{402}$(s) in two or more $L_{401}$(s) may optionally be linked to each other via $T_{403}$, which is a linking group (see Compounds PD1 to PD4 and PD7). $T_{402}$ and $T_{403}$ are the same as described in connection with $T_{401}$.

$L_{402}$ in Formula 401 may be an organic ligand. For example, $L_{402}$ may be halogen group, a diketone group (for example, an acetylacetonate group), a carboxylic acid group (for example, picolinate group), —C(=O), an isonitril group, a —CN group, a phosphorus group (for example, a phosphine group or a phosphite group), or any combination thereof, but embodiments are not limited thereto.

The phosphorescent dopant may include, for example, one of the following Compound PD1 to PD25, or any combination, but embodiments are not limited thereto:

PD1

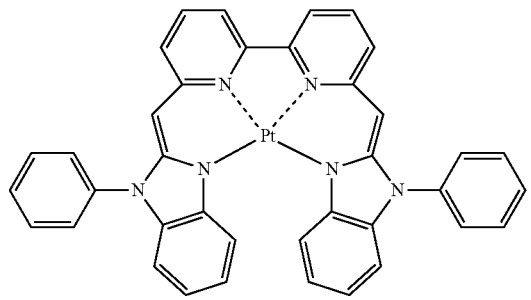

PD2

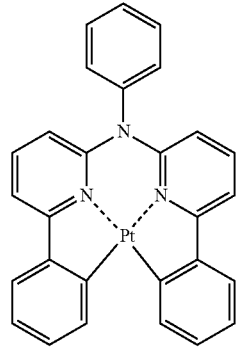

PD3

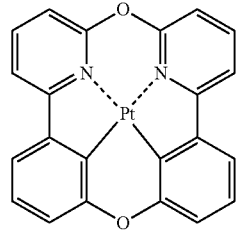

PD4
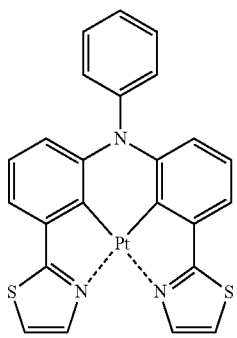
PD5
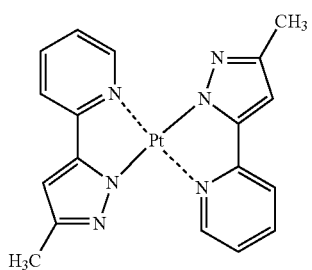
PD6
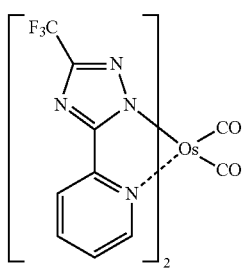
PD7
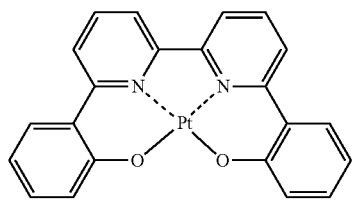
PD8
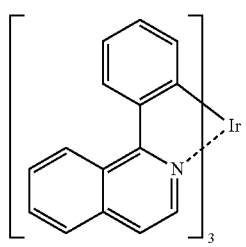
PD9
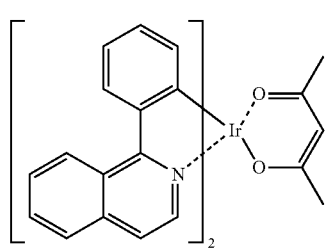
PD10
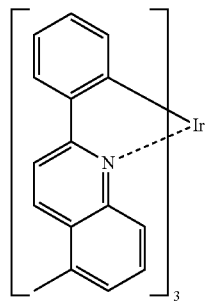
PD11
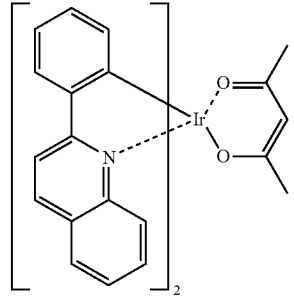
PD12
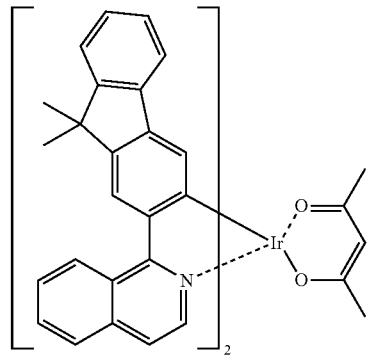
PD13
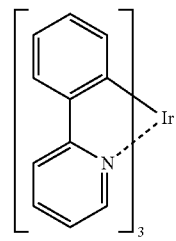
PD14
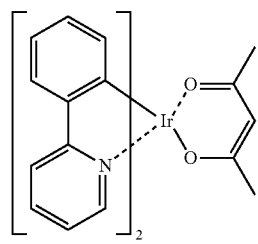

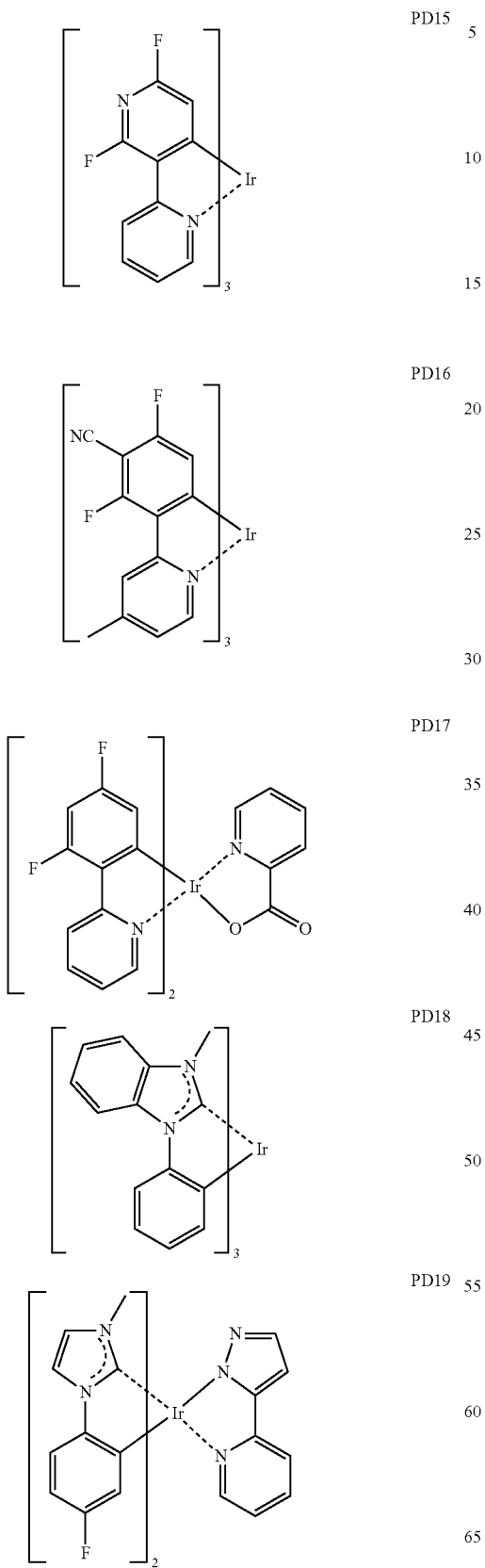
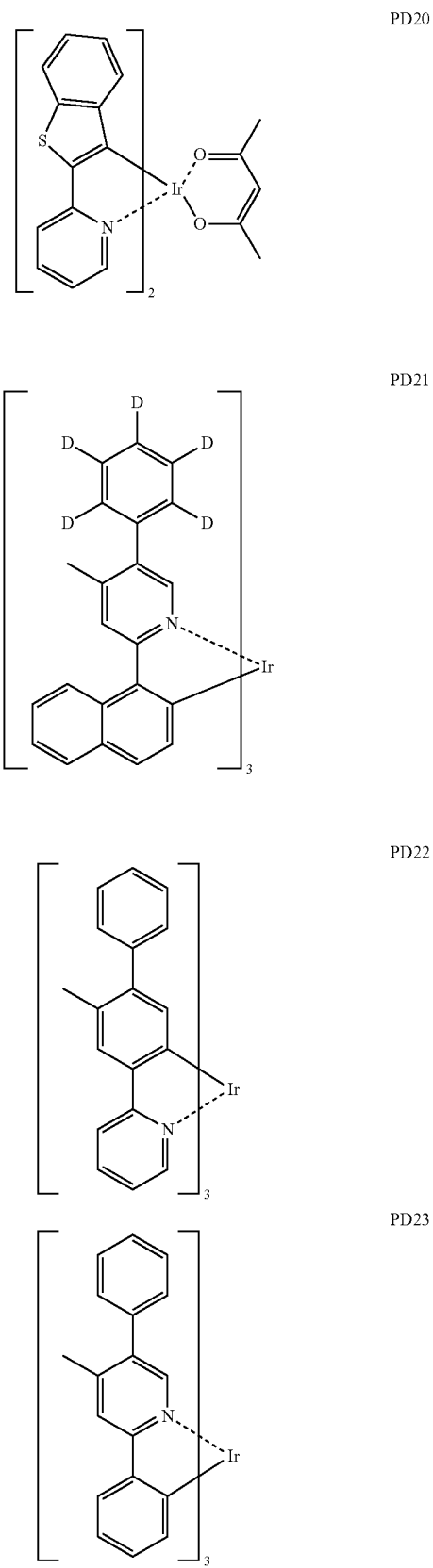

PD24

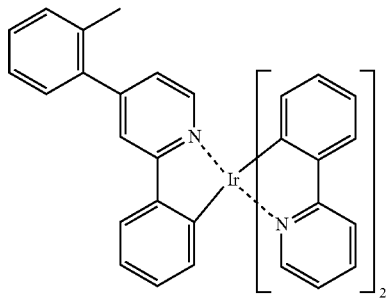

PD25

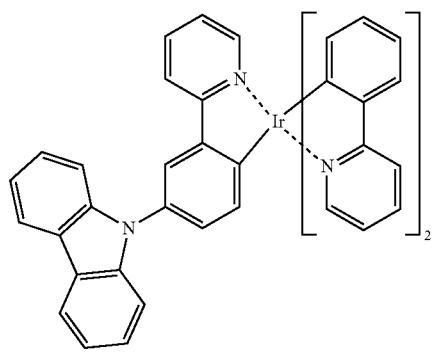

[Fluorescent Dopant in Emission Layer]

The fluorescent dopant may include an arylamine compound or a styrylamine compound.

For example, the fluorescent dopant may include a compound represented by Formula 501:

<Formula 501>

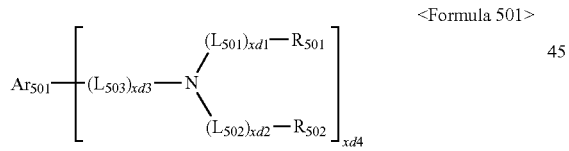

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xd1 to xd3 may each independently be 0, 1, 2, or 3, $R_{501}$ and $R_{502}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and xd4 may be 1, 2, 3, 4, 5, or 6.

For example, $Ar_{501}$ in Formula 501 may be a condensed cyclic ring (for example, an anthracene group, a chrysene group, a pyrene group, etc.) in which three or more monocyclic groups are condensed.

In one embodiment, xd4 in Formula 501 may be 2, but embodiments are not limited thereto.

For example, the fluorescent dopant may include: one of Compounds FD1 to FD36; DPVBi; DPAVBi; or any combination thereof:

FD1

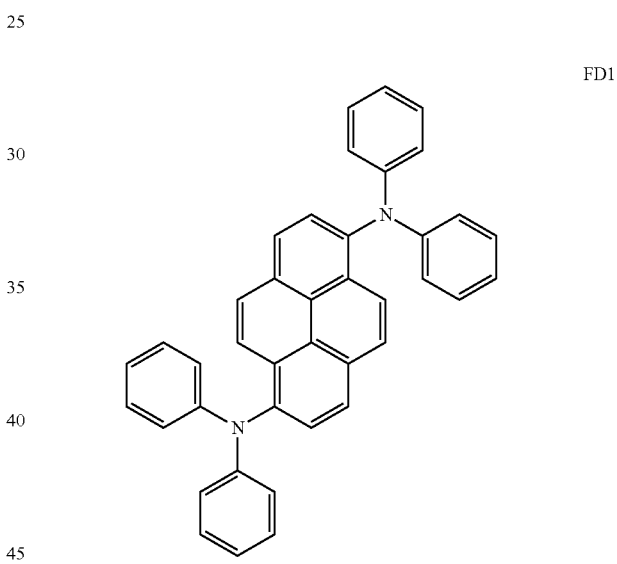

FD2

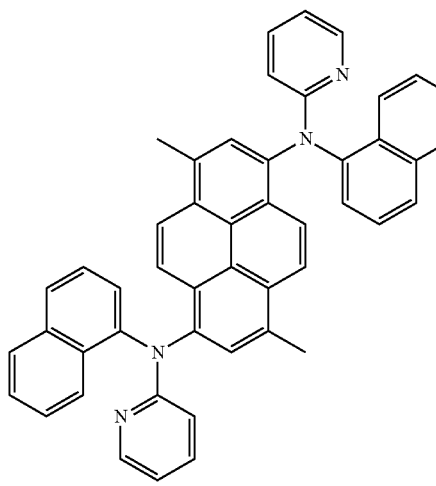

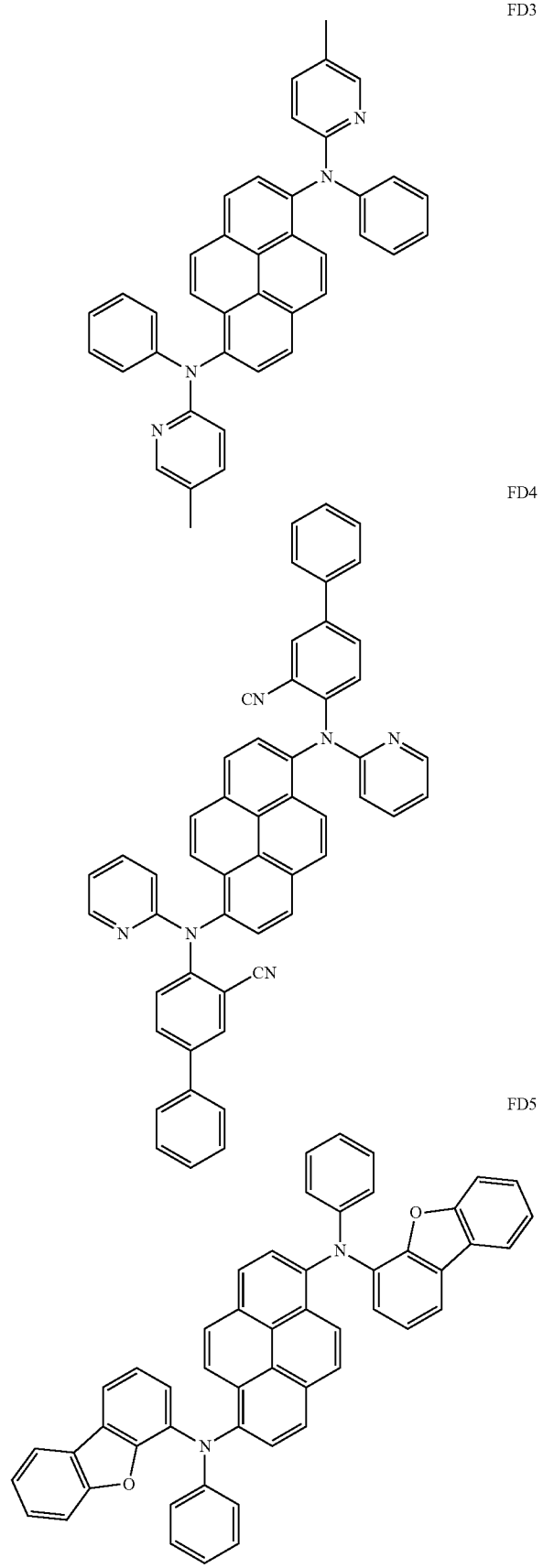

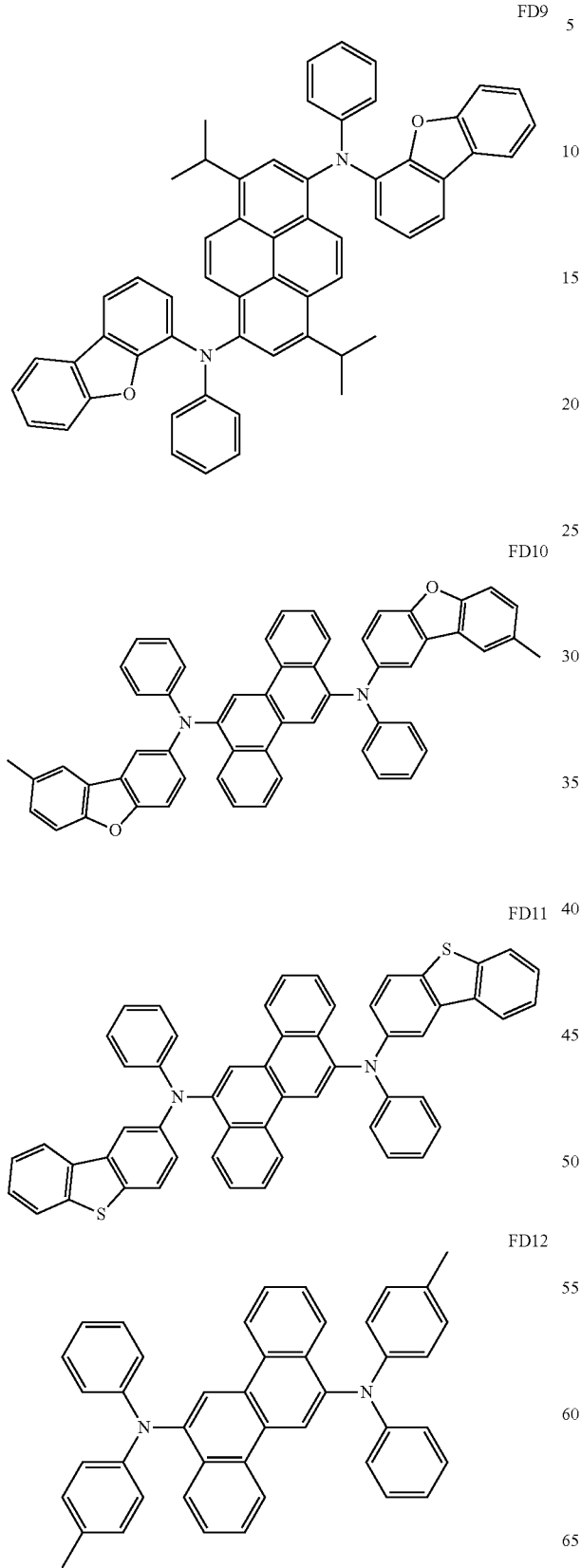
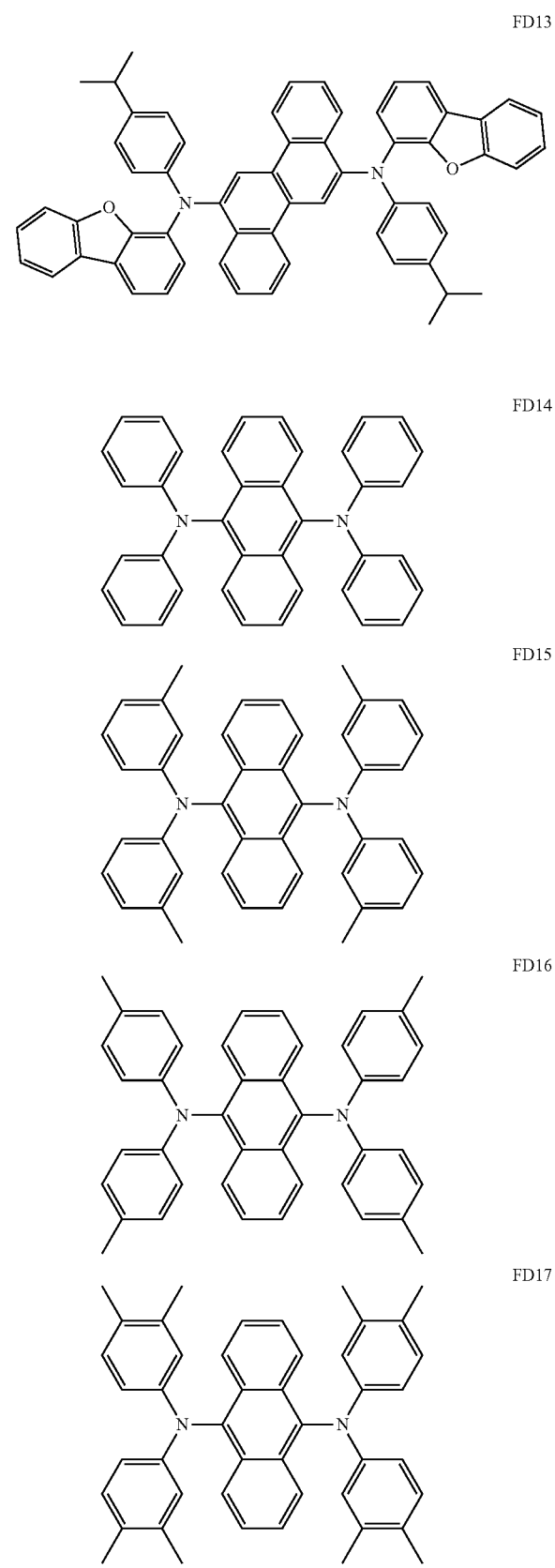

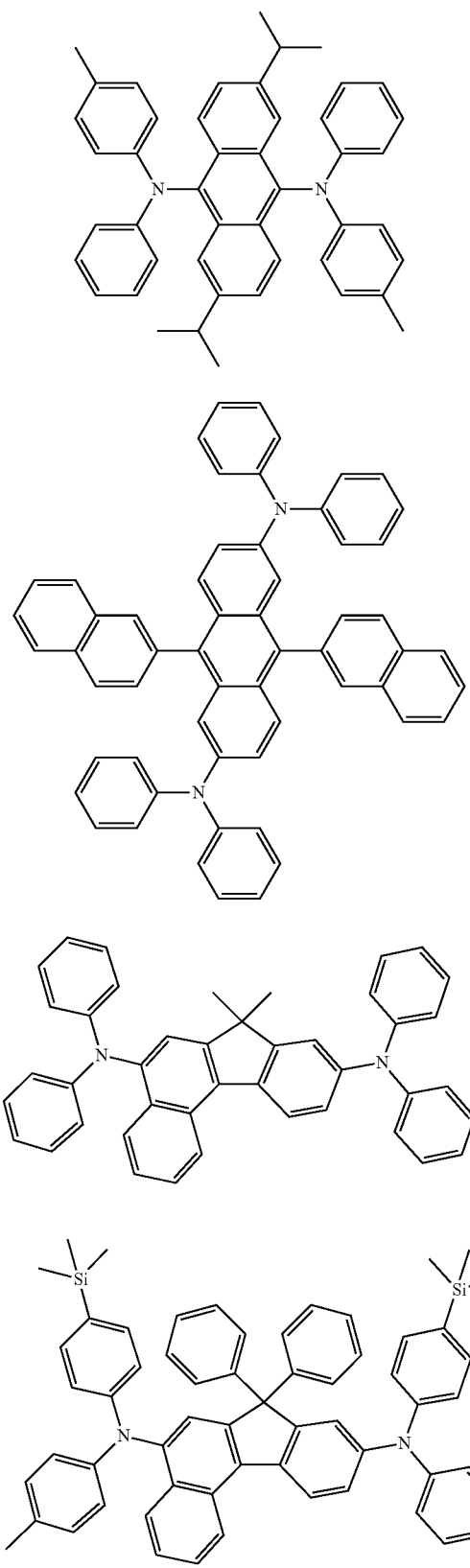
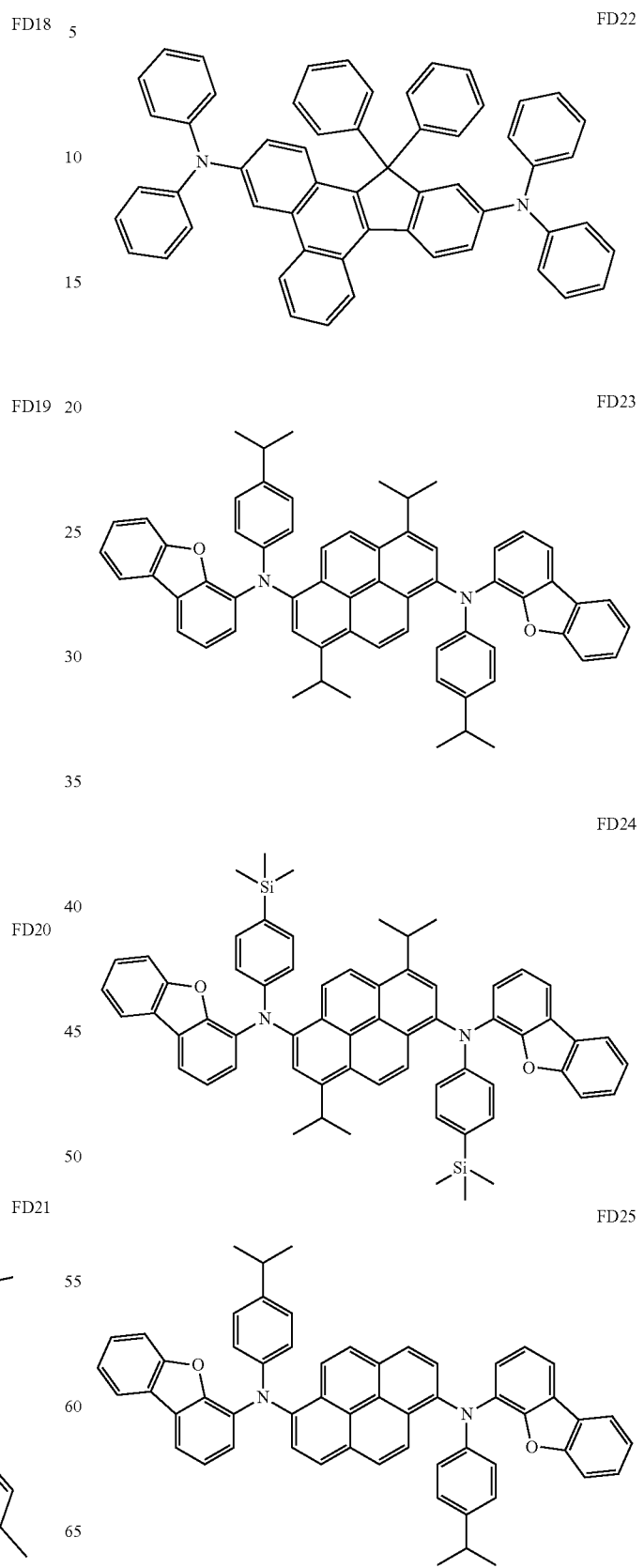

FD26
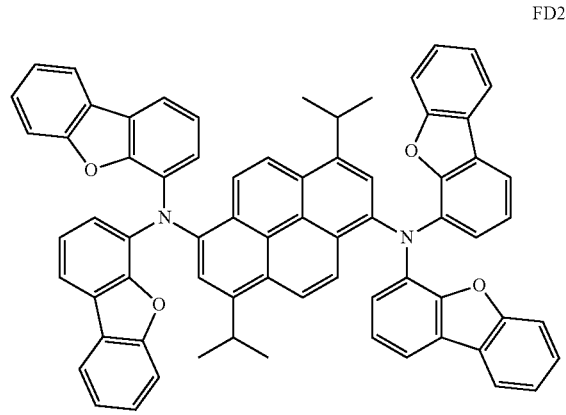
FD27
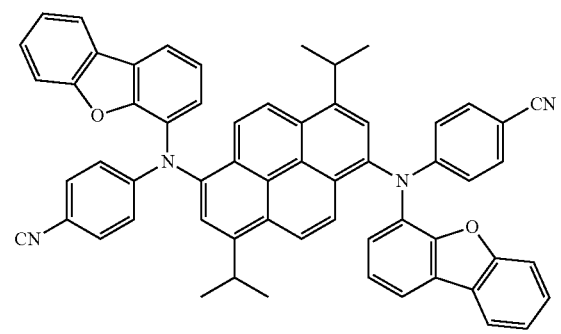
FD28
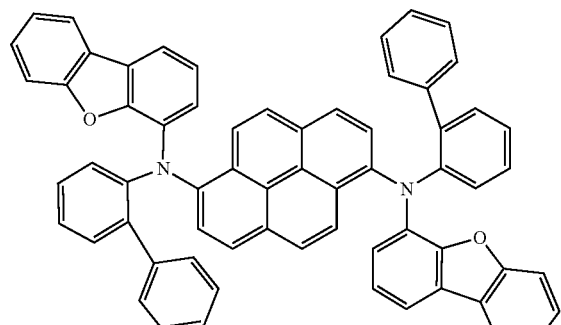
FD29
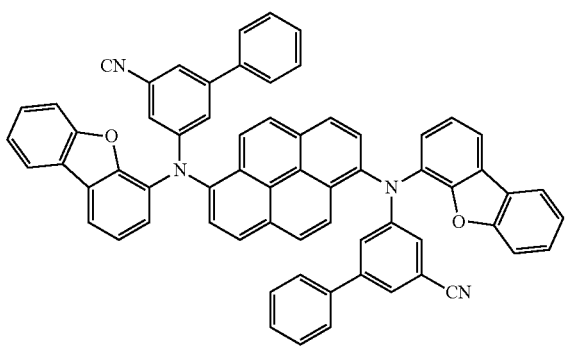
FD30
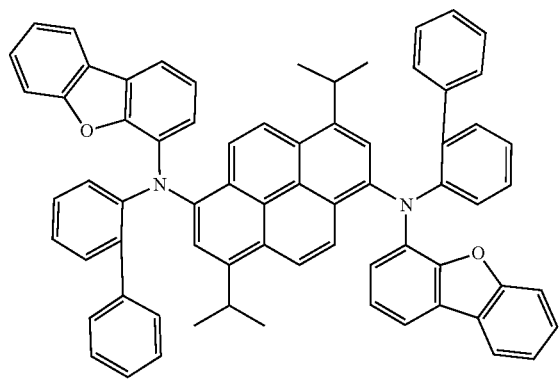
FD31
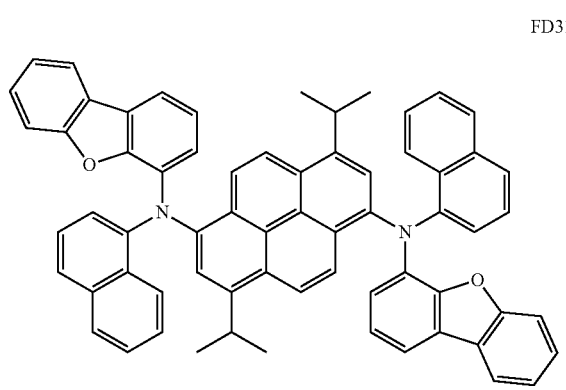
FD32
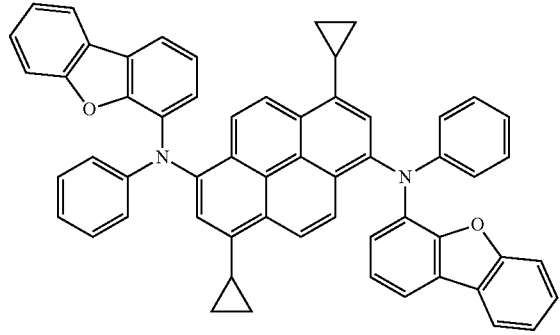
FD33
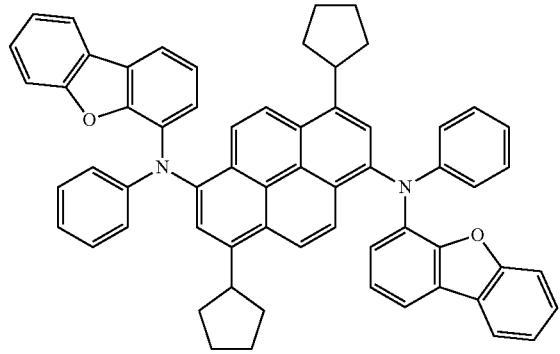

-continued

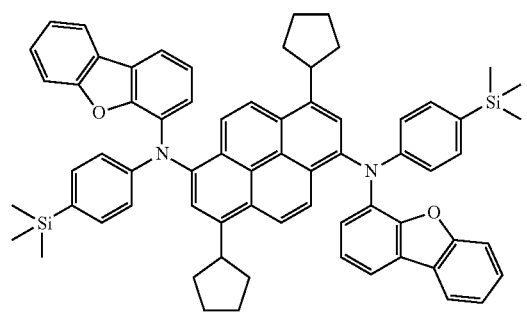
FD34

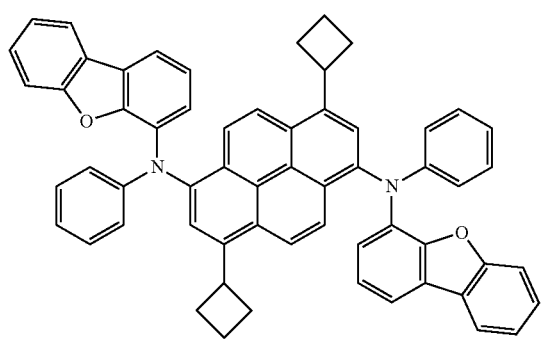
FD35

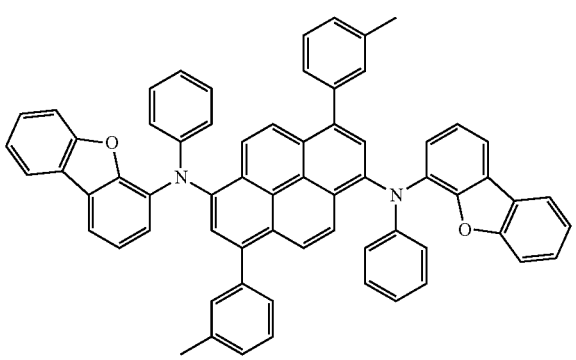
FD36

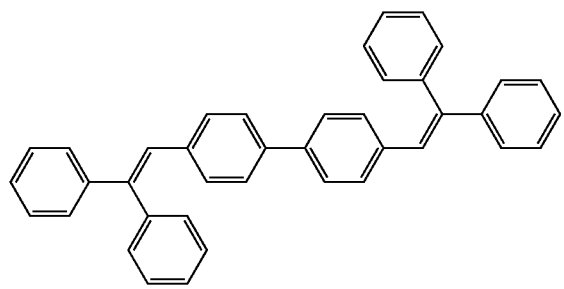
DPVBi

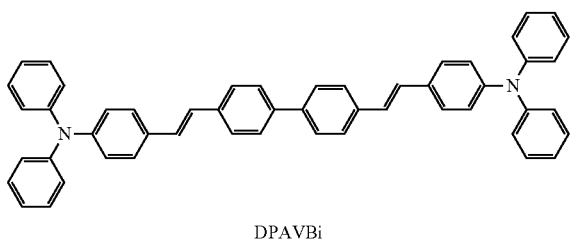
DPAVBi

[Electron Transport Region in Middle Layer 150]

The electron transport region may have: i) a single-layered structure consisting of a single layer consisting of a single material, ii) a single-layered structure consisting of a single layer consisting of different materials, or iii) a multi-layered structure including multiple layers including different materials.

The electron transport region may include a buffer layer, a hole blocking layer, an electron control layer, an electron transport layer, an electron injection layer, or any combination thereof, but embodiments are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked (or disposed) from an emission layer. However, embodiments of the structure of the electron transport region are not limited thereto.

The electron transport region (for example, the buffer layer, the hole blocking layer, the electron control layer, or the electron transport layer in the electron transport region) may include a metal-free compound including at least one π-electron deficient nitrogen-containing cyclic group, which may easily accept electrons.

The "π-electron deficient nitrogen-containing cyclic group" may be a $C_1$-$C_{60}$ heterocyclic group which has, as a ring-forming moiety, at least one *—N=*' moiety.

For example, the "π-electron-deficient nitrogen-containing cyclic group" may be i) a first ring, ii) a condensed cyclic group in which two or more first rings are condensed to each other, or iii) a condensed cyclic group in which at least one first ring and at least one second ring are condensed, wherein the first ring is a heteromonocyclic group (for example, an imidazole group, a pyridine group, a triazine group, etc.) which includes, as a ring-forming moiety, at least one *—N=*' moiety, and the second ring is a cyclic group (for example, a benzene group, a dibenzofuran group, a carbazole group, etc.) which does not include, as a ring-forming moiety, *—N=*' moiety.

Examples of the π-electron-deficient nitrogen-containing cyclic group are a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, and an imidazopyridazine group, but embodiments are not limited thereto.

For example, the electron transport region may include a compound represented by Formula 601 and including at least one π-electron deficient nitrogen-containing cyclic group.

$$[Ar_{601}]_{xe11}-[(L_{601})_{xe1}-R_{601}]_{xe21}$$ <Formula 601>

In Formula 601,

Ar$_{601}$ may be a substituted or unsubstituted C$_5$-C$_{60}$ carbocyclic group or a substituted or unsubstituted C$_1$-C$_{60}$ heterocyclic group, xe11 may be 1, 2, or 3, L$_{601}$ may be a substituted or unsubstituted C$_3$-C$_{10}$ cycloalkylene group, a substituted or unsubstituted C$_1$-C$_{10}$ heterocycloalkylene group, a substituted or unsubstituted C$_3$-C$_{10}$ cycloalkenylene group, a substituted or unsubstituted C$_1$-C$_{10}$ heterocycloalkenylene group, a substituted or unsubstituted C$_6$-C$_{60}$ arylene group, a substituted or unsubstituted C$_1$-C$_{60}$ heteroarylene group, a substituted or unsubstituted divalent non-aromatic condensed polycyclic group, or a substituted or unsubstituted divalent non-aromatic condensed heteropolycyclic group, xe1 may be 0, 1, 2, 3, 4, or 5, R$_{601}$ may be selected from a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted monovalent non-aromatic condensed polycyclic group, a substituted or unsubstituted monovalent non-aromatic condensed heteropolycyclic group, —Si(Q$_{601}$)(Q$_{602}$)(Q$_{603}$), —C(=O)(Q$_{601}$), —S(=O)$_2$(Q$_6$OI), or —P(=O)(Q$_{601}$)(Q$_{602}$), Q$_{601}$ to Q$_{603}$ are the same as described in connection with Q$_1$, and xe21 may be 1, 2, 3, 4, or 5.

For example, at least one of Ar$_{601}$, L$_{601}$, and R$_{601}$ of Formula 601 may each independently include at least one π-electron deficient nitrogen-containing ring.

In embodiments, when xe11 in Formula 601 is 2 or more, two or more Ar$_{601}$(s) may be linked to each other via a single bond.

In one embodiment, Ar$_{601}$ in Formula 601 may be a substituted or unsubstituted anthracene group.

In one embodiment, the electron transport region may include a compound represented by Formula 601-1:

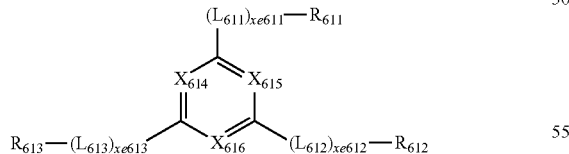

<Formula 601-1>

In Formula 601-1,

X$_{614}$ may be N or C(R$_{614}$), X$_{615}$ may be N or C(R$_{615}$), X$_{616}$ may be N or C(R$_{616}$), and at least one selected from X$_{614}$ to X$_{616}$ may be N, L$_{611}$ to L$_{613}$ may be understood by referring to the description presented in connection with L$_{601}$, xe611 to xe613 may be understood by referring to the description presented in connection with xe1, R$_{611}$ to R$_{613}$ may be understood by referring to the description presented in connection with R$_{601}$, R$_{614}$ to R$_{616}$ may each independently be hydrogen, deuterium, —F, —Cl, —Br, —I, a hydroxyl group, a cyano group, a nitro group, a C$_1$-C$_{20}$ alkyl group, a C$_1$-C$_{20}$ alkoxy group, a phenyl group, a biphenyl group, a terphenyl group, or a naphthyl group.

For example, xe1 and xe611 to xe613 in Formulae 601 and 601-1 may each independently be 0, 1, or 2.

The electron transport region may include one of Compounds ET1 to ET36, 2,9-dimethyl-4,7-diphenyl-1,10-phenanthroline (BCP), 4,7-Diphenyl-1,10-phenanthroline (Bphen), Alq$_3$, BAlq, TAZ, NTAZ, or any combination thereof, but embodiments are not limited thereto:

ET1

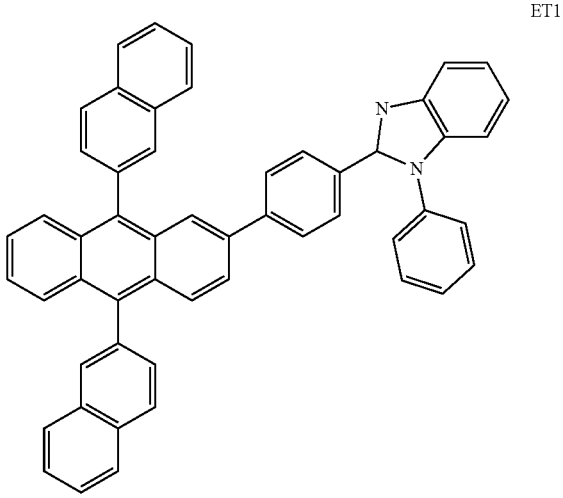

ET2

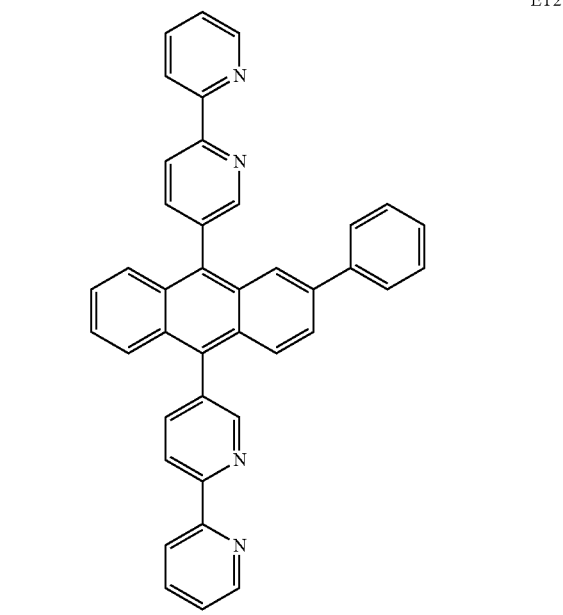

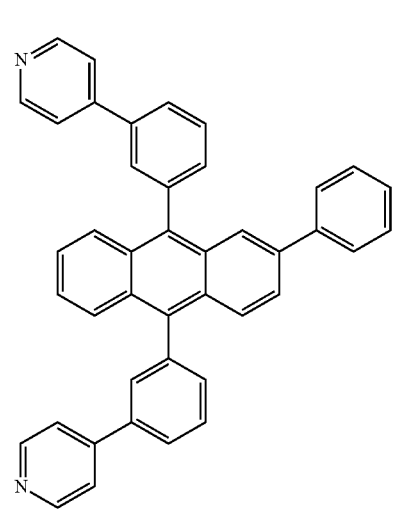
ET3
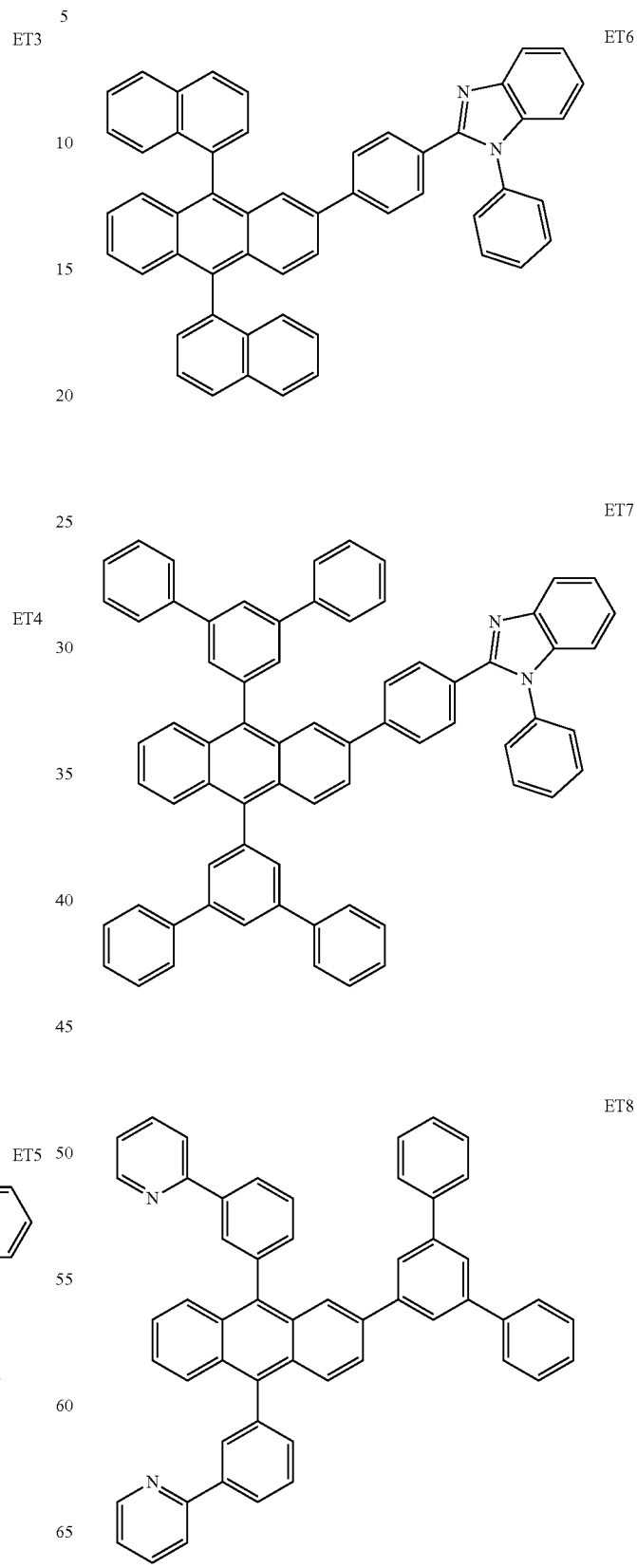
ET4
ET5
ET6
ET7
ET8

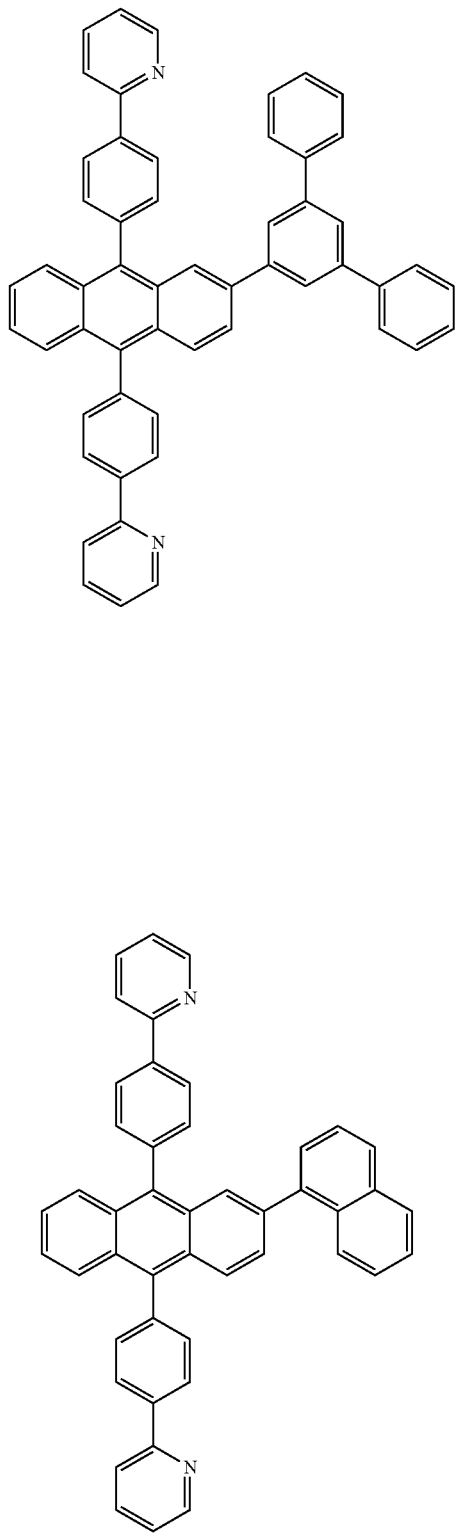
ET9
ET10
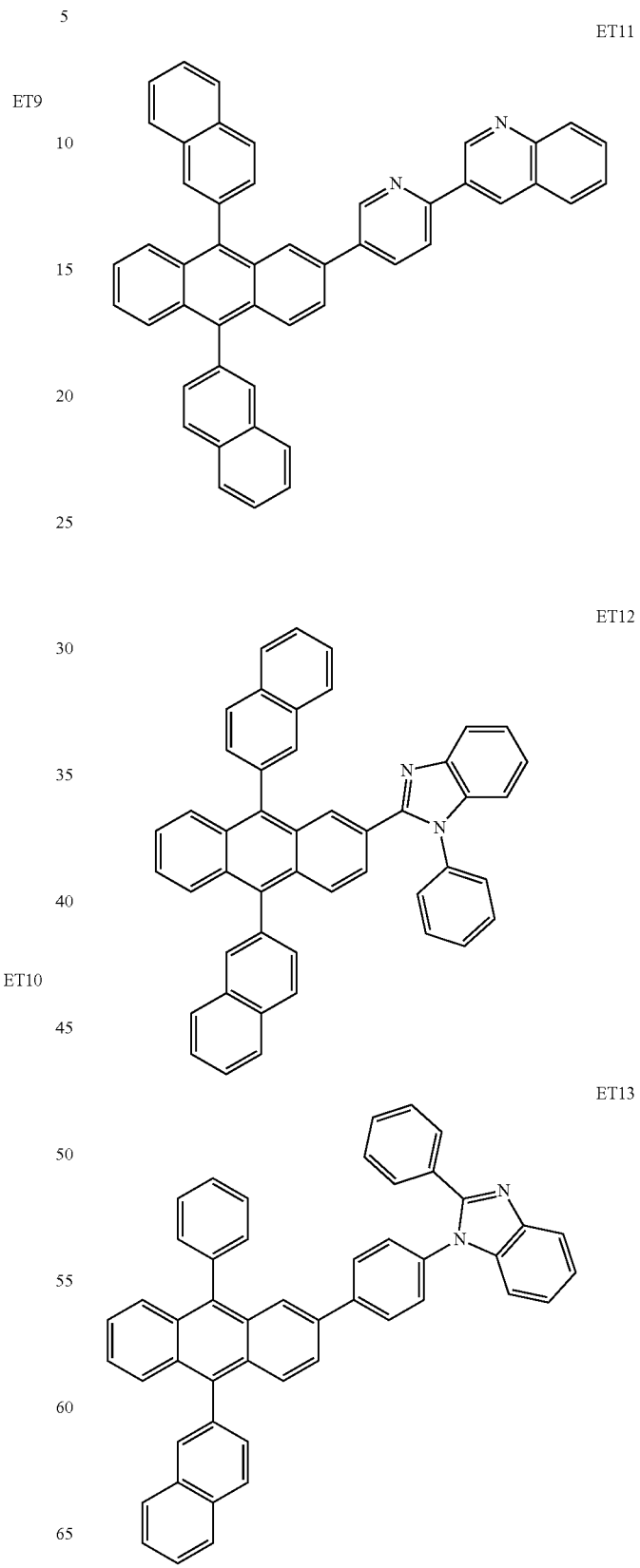
ET11
ET12
ET13

ET14
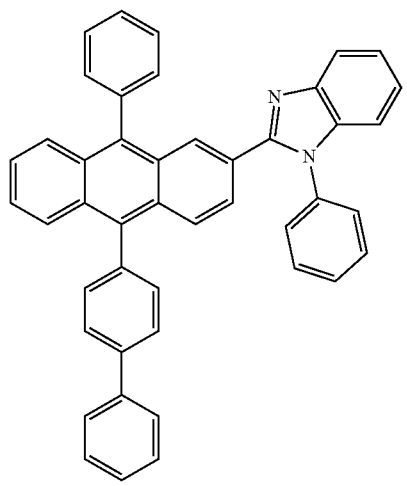
ET15
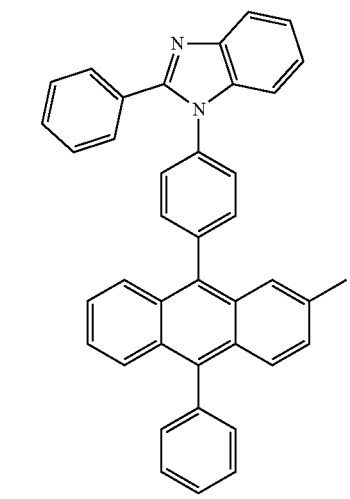
ET16
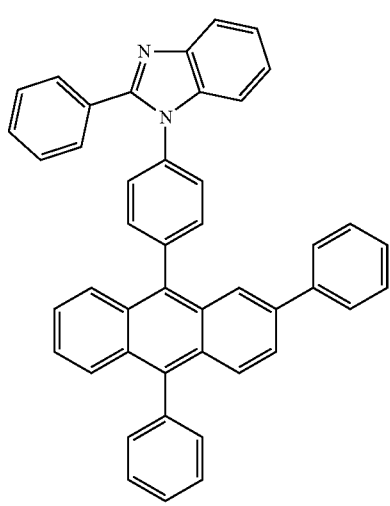
ET17
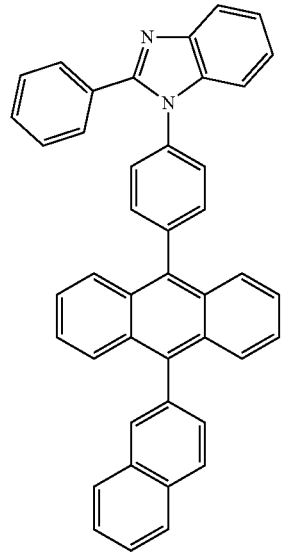
ET18
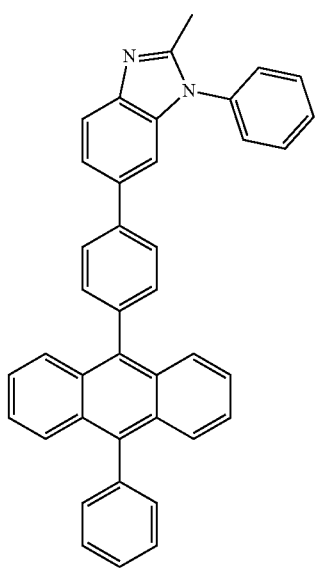
ET19
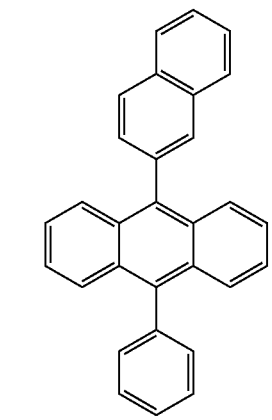

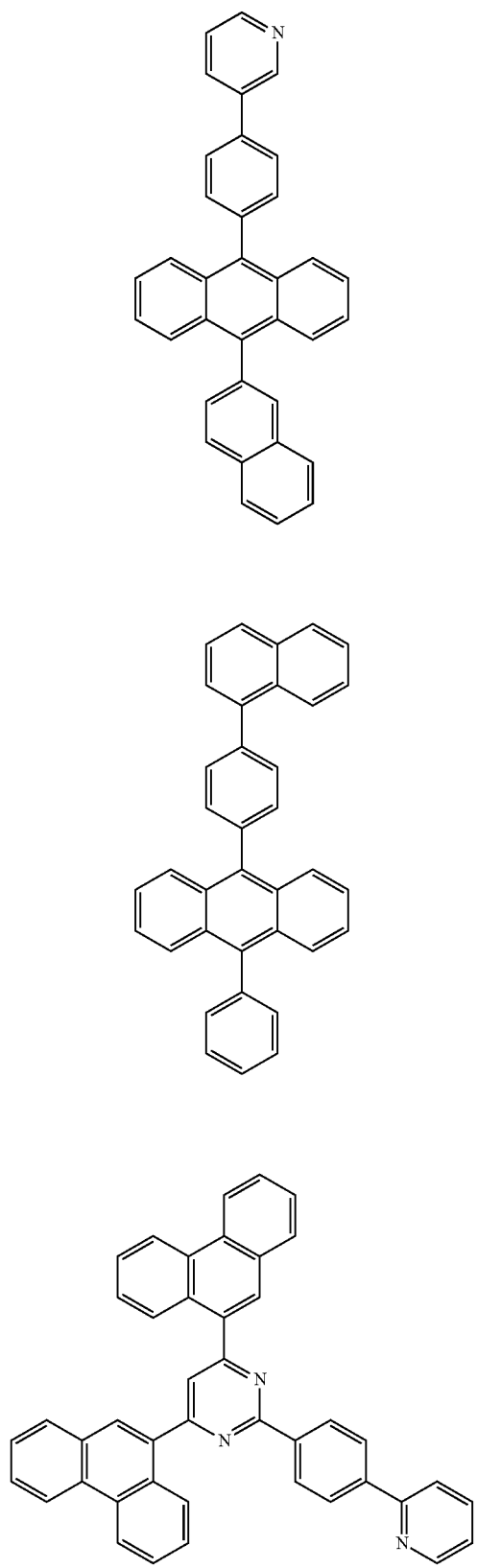
ET20
ET21
ET22
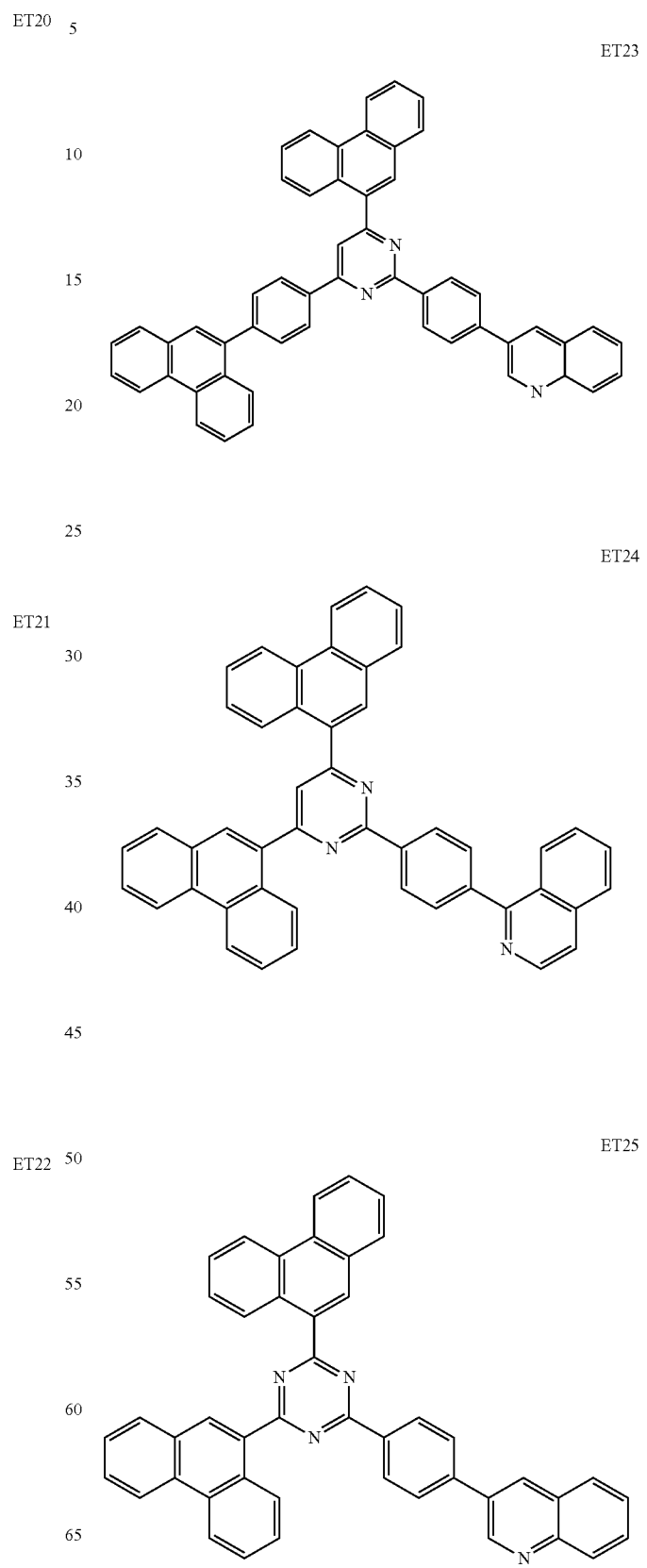
ET23
ET24
ET25

ET26
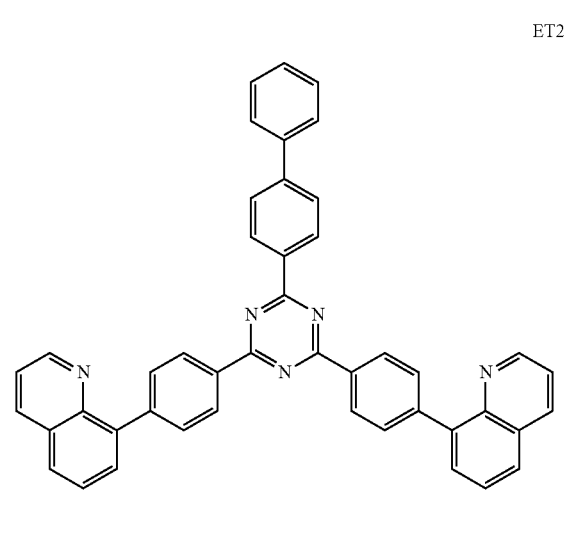
ET29
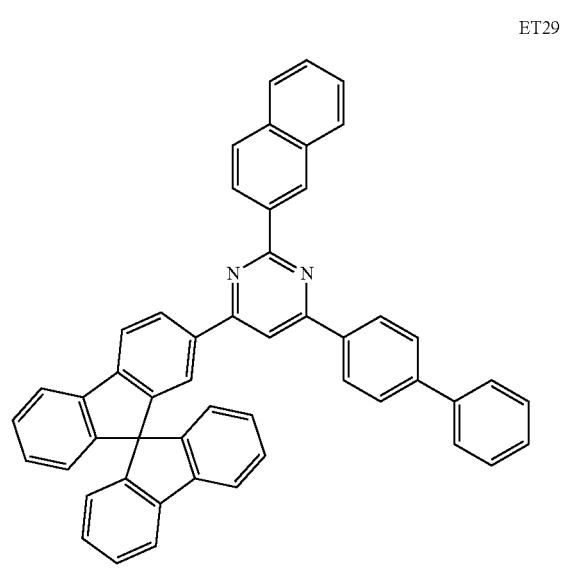
ET27
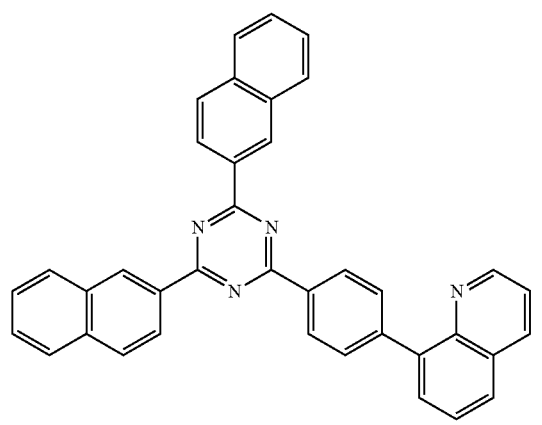
ET30
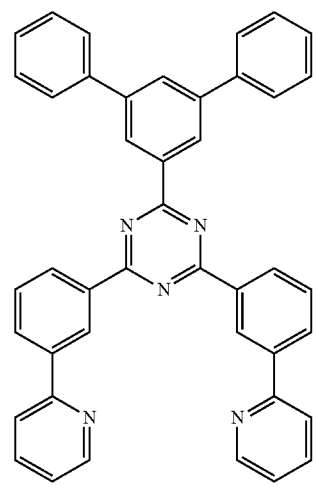
ET28
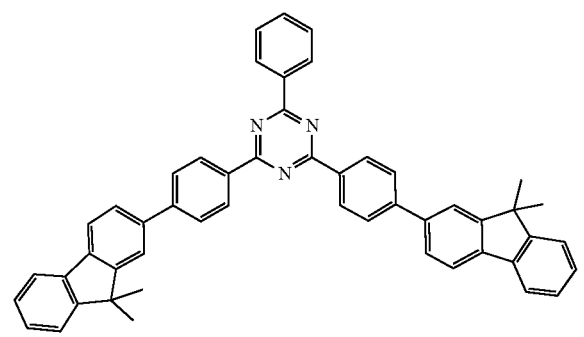
ET31
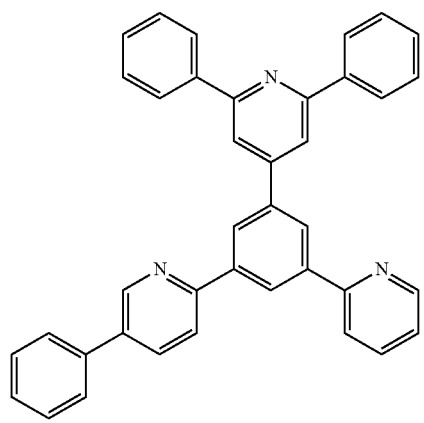

ET32
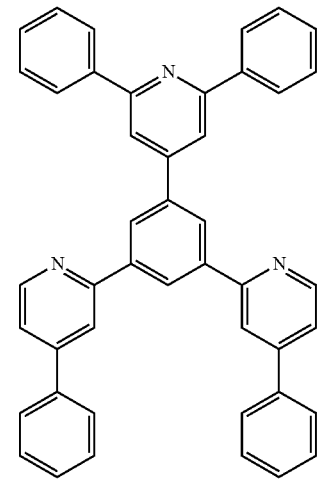
ET33
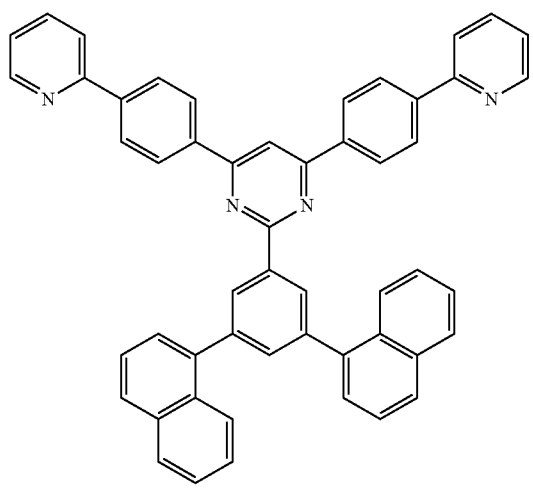
ET34
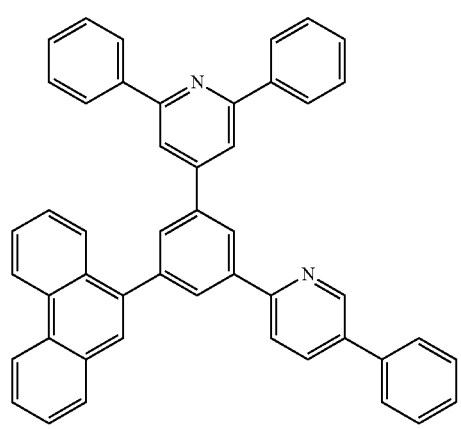
ET35
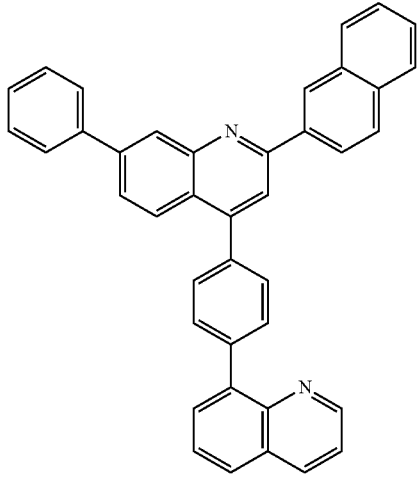
ET36
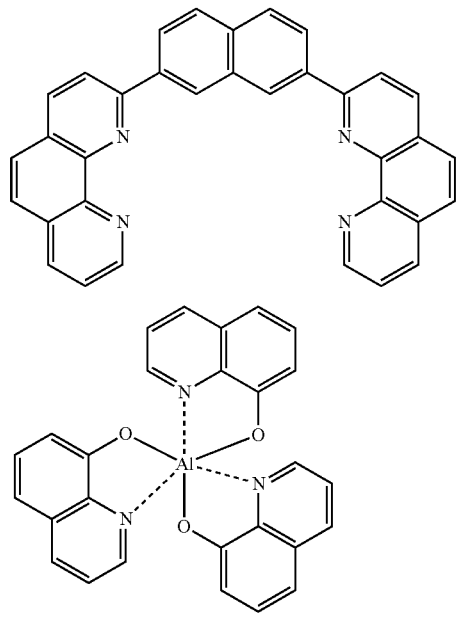
Alq₃
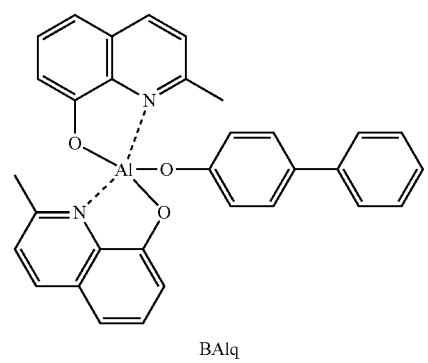
BAlq

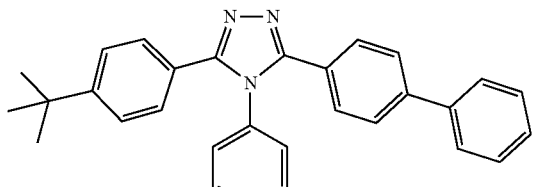

TAZ

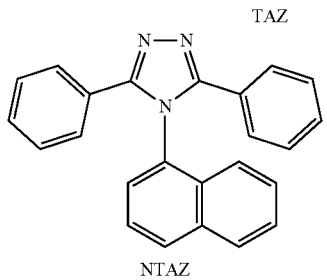

NTAZ

Thicknesses of the buffer layer, the hole blocking layer, and the electron control layer may each be in a range of about 20 Å to about 1,000 Å. In an embodiment, the thickness of the buffer layer may be in a range of about 30 Å to about 300 Å. In an embodiment, the thickness of the hole blocking layer may be in a range of about 30 Å to about 300 Å. In an embodiment, the thickness of the electron control layer may be in a range of about 30 Å to about 300 Å. When the thicknesses of the buffer layer, the hole blocking layer, and the electron control layer are within these ranges, excellent hole blocking characteristics or electron control characteristics may be obtained without a substantial increase in driving voltage.

A thickness of the electron transport layer may be in a range of about 100 Å to about 1,000 Å. In an embodiment, the thickness of the electron transport layer may be in a range of about 150 Å to about 500 Å. When the thickness of the electron transport layer is within the range described above, the electron transport layer may have satisfactory electron transport characteristics without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. The alkali metal complex may be a Li ion, a Na ion, a K ion, an Rb ion, or a Cs ion, and the alkaline earth-metal complex may be a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, or a cyclopentadiene, but embodiments are not limited thereto.

For example, the metal-containing material may include a Li complex. The Li complex may include, for example, Compound ET-D1 (LiQ) or ET-D2:

ET-D1

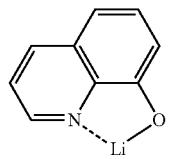

ET-D2

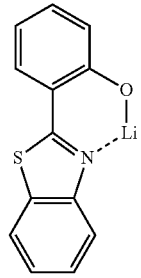

The electron transport region may include an electron injection layer that facilitates electron injection from the second electrode 190. The electron injection layer may contact (for example, directly contact) the second electrode 190.

The electron injection layer may have: i) a single-layered structure consisting of a single layer consisting of a single material, ii) a single-layered structure consisting of a single layer consisting of different materials, or iii) a multi-layered structure including multiple layers including different materials.

The electron injection layer may include an alkali metal, an alkaline earth metal, a rare earth metal, an alkali metal-containing compound, an alkaline earth-containing metal compound, a rare earth metal-containing compound, an alkali metal complex, an alkaline earth-metal complex, a rare earth metal complex, or any combinations thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides and halides (for example, fluorides, chlorides, bromides, or iodides) of the alkali metal, the alkaline earth-metal, and the rare earth metal, or any combination thereof.

The alkali metal-containing compound may be alkali metal oxides, such as $Li_2O$, $Cs_2O$, or $K_2O$, and alkali metal halides, such as LiF, NaF, CsF, KF, LiI, NaI, CsI, or KI, or any combination thereof. The alkaline earth-metal containing compound may include alkaline earth-metal oxides, such as BaO, SrO, CaO, $Ba_xSr_{1-x}O$ (0<x<1), or $Ba_xCa_{1-x}O$ (0<x<1). The rare earth metal-containing compound may include $YbF_3$, $ScF_3$, $SCO_3$, $Y_2O_3$, $Ce_2O_3$, $GdF_3$, $TbF_3$, $YbI_3$, $ScI_3$, $TbI_3$, or any combination thereof.

The alkali metal complex, the alkaline earth metal complex, and the rare earth metal complex may include i) one of ions of the alkali metal, the alkaline earth metal, and the rare earth metal and ii), as a ligand linked to the metal ion, for example, hydroxyquinoline, hydroxyan isoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenyl benzimidazole, hydroxyphenylbenzothiazole, bipyridine, phenanthroline, cyclopentadiene, or any combination thereof, but embodiments are not limited thereto.

The electron injection layer may consist of an alkali metal, alkaline earth metal, a rare earth metal, an alkali metal-containing compound, alkaline earth metal-containing compound, a rare earth metal-containing compound, an alkali metal complex, an alkaline earth metal complex, a rare earth metal complex, or any combination thereof, or may further include an organic material (for example, a compound represented by Formula 601). When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å. In an embodiment, the thickness of the electron injection layer may be in a range of about 3 Å to about 90 Å. When the thickness of the electron injection layer is within the range described above, the electron injection layer may have satisfactory electron injection characteristics without a substantial increase in driving voltage.

[Second Electrode 190]

The second electrode 190 may be disposed on the middle layer 150 having such a structure. The second electrode 190 may be a cathode, which is an electron injection electrode, and as the material for the second electrode 190, a metal, an alloy, an electrically conductive compound, or any combination thereof, each having a low work function, may be used.

The second electrode 190 may include lithium (Li), silver (Ag), magnesium (Mg), aluminum (Al), aluminum-lithium (Al—Li), calcium (Ca), magnesium-indium (Mg—In), magnesium-silver (Mg—Ag), ITO, IZO, or any combination thereof, but embodiments are not limited thereto. The second electrode 190 may be a transmissive electrode, a semi-transmissive electrode, or a reflective electrode.

The second electrode 190 may have a single-layered structure, or a multi-layered structure including two or more layers.

[Capping Layer]

A first capping layer may be disposed outside the first electrode 110, and/or a second capping layer may be disposed outside the second electrode 190. In detail, the light-emitting device 10 may have a structure in which the first capping layer, the first electrode 110, the middle layer 150, and the second electrode 190 are sequentially stacked (or disposed) in this stated order, a structure in which the first electrode 110, the middle layer 150, the second electrode 190, and the second capping layer are sequentially stacked (or disposed) in this stated order, or a structure in which the first capping layer, the first electrode 110, the middle layer 150, the second electrode 190, and the second capping layer are sequentially stacked (or disposed) in this stated order.

Light generated in an emission layer of the middle layer 150 of the light-emitting device 10 may be emitted toward the outside through the first electrode 110 and the first capping layer, each of which may be a semi-transmissive electrode or a transmissive electrode, or light generated in an emission layer of the middle layer 150 of the light-emitting device 10 may be emitted toward the outside through the second electrode 190 and the second capping layer, each of which may be a semi-transmissive electrode or a transmissive electrode.

The first capping layer and the second capping layer may increase external luminescence efficiency according to the principle of constructive interference.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth metal complex, or a combination thereof. The carbocyclic compound, the heterocyclic compound, and the amine group-containing compound may be optionally substituted with a substituent containing O, N, S, Se, Si, F, Cl, Br, I, or any combination thereof. In one embodiment, at least one of the first capping layer and the second capping layer may each independently include an amine group-containing compound.

For example, at least one of the first capping layer and second capping layer may each independently include a compound represented by Formula 201, a compound represented by Formula 202, or any combination thereof.

In embodiments, at least one of the first capping layer and the second capping layer may each independently include a compound selected from Compounds HT28 to HT33, Compounds CP1 to CP5, or any combination thereof, but embodiments are not limited thereto:

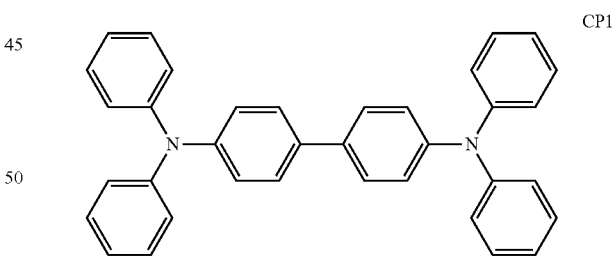

CP1

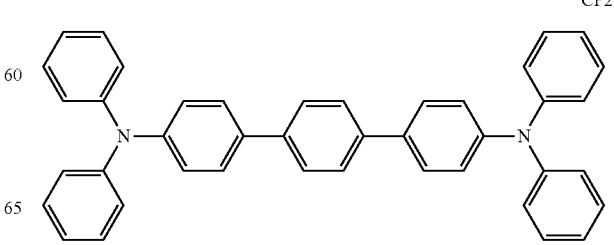

CP2

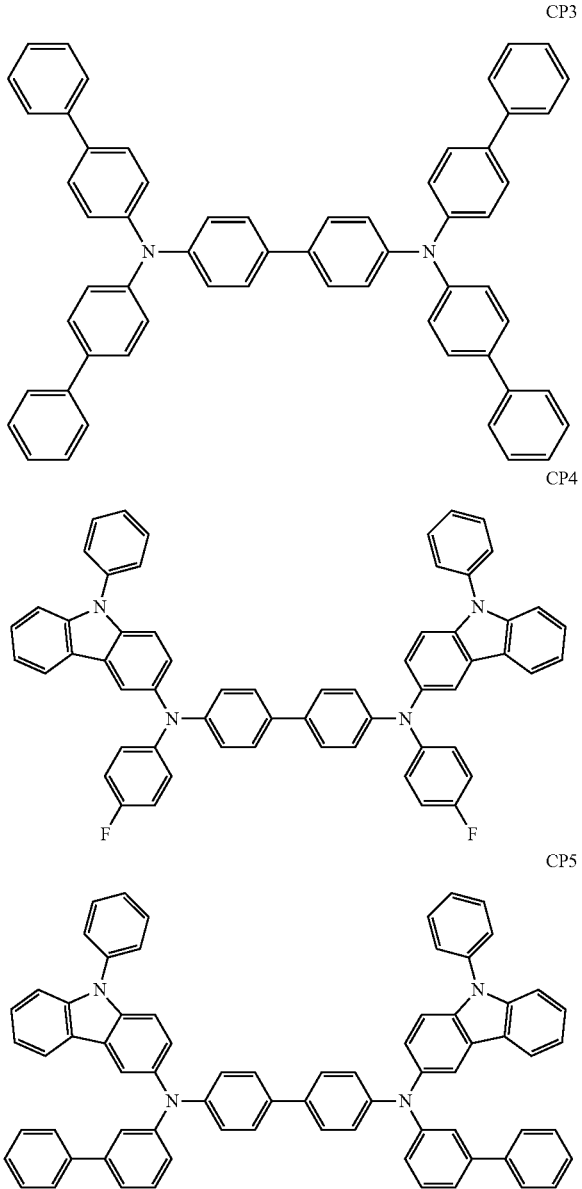

[Apparatus]

The light-emitting device 10 may be included in various apparatuses. For example, a light-emitting apparatus, an authentication apparatus, or an electronic apparatus, which includes the light-emitting device 10, may be provided.

The light-emitting apparatus may further include, in addition to the light-emitting device 10, a color filter. The color filter may be disposed on at least one traveling direction of light emitted from a light-emitting device. For example, light emitted from the light-emitting device 10 may be blue light, but embodiments are not limited thereto. The light-emitting device 10 is the same as described above.

The light-emitting apparatus may include a first substrate. The first substrate may include subpixels, and the color filter may include color filter areas respectively corresponding to the subpixels.

A pixel-defining film may be formed between the subpixels to define each of the subpixels.

The color filter may further include light blocking patterns disposed between the color filter areas.

The color filter areas may include a first color filter area emitting first color light, a second color filter area emitting second color light, and/or a third color filter area emitting third color light, and the first color light, the second color light, and/or the third color light may have different maximum emission wavelengths from one another. For example, the first color light may be red light, the second color light may be green light, and the third color light may be blue light, but embodiments are not limited thereto. For example, each of the color filter areas may include a quantum dot, but embodiments are not limited thereto. In detail, the first color filter area may include a red quantum dot, the second color filter area may include a green quantum dot, and the third color filter area may not include a quantum dot. The quantum dot is the same as described above. Each of the first color filter area, the second color filter area, and/or the third color filter area may include a scattering component, but embodiments are not limited thereto.

For example, the light-emitting device 10 may emit first light, the first color filter area may absorb the first light to emit first first-color light, the second color filter area may absorb the first light to emit second first-color light, and the third color filter area may absorb the first light to emit third first-color light. In this regard, the first first-color light, the second first-color light, and the third first-color light may have different maximum emission wavelengths from one another. In detail, the first light may be blue light, the first first-color light may be red light, the second first-color light may be green light, and the third first-color light may be blue light, but embodiments are not limited thereto.

The light-emitting apparatus may further include, in addition to the light-emitting device 10 as described above, a thin-film transistor. The thin-film transistor may include a source electrode, a drain electrode, and an activation layer, wherein any one of the source electrode and the drain electrode may be electrically connected to any one of the first electrode 110 and the second electrode 190 of the light-emitting device 10.

The thin-film transistor may further include a gate electrode, a gate insulation layer, or the like.

The activation layer may include crystalline silicon, amorphous silicon, an organic semiconductor, an oxide semiconductor, or the like, but embodiments are not limited thereto.

The light-emitting apparatus may further include a sealing portion for sealing a light-emitting device. The sealing portion may be disposed between the color filter and the light-emitting device 10. The sealing portion may allow light from the light-emitting device 10 to be emitted to the outside and may block outside air and moisture from penetrating into the light-emitting device 10 at the same time. The sealing portion may be a sealing substrate including a transparent glass substrate or a plastic substrate. The sealing portion may be a thin-film encapsulation layer including organic layers and/or inorganic layers. When the sealing portion is the thin-film encapsulation layer, the light-emitting apparatus may be flexible.

The light-emitting apparatus may be used as various displays, light sources, and the like.

The authentication apparatus may be, for example, a biometric authentication apparatus for authenticating an individual by using biometric information of a biometric body (for example, from a fingertip, a pupil, or the like).

The authentication apparatus may further include, in addition to the light-emitting device, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like, but embodiments are not limited thereto.

[Preparation Method]

Layers constituting the hole transport region, an emission layer, and layers constituting the electron transport region may be formed in a region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed and the structure of a layer to be formed.

[Definitions of Substituents]

The term "$C_1$-$C_{60}$ alkyl group" as used herein refers to a linear or branched aliphatic hydrocarbon monovalent group with 1 to 60 carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of a $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of a $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group with 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group, a bicyclo[1.1.1]pentyl group, a bicyclo[2.1.1]hexyl group, a bicyclo[2.2.1]heptyl, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group with 1 to 10 carbon atoms containing a heteroatom (for example, N, O, Si, P, S, or any combination thereof) as a ring-forming atom, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group with 1 to 10 carbon atoms containing a heteroatom (for example, N, O, Si, P, S, or any combination thereof) as a ring-forming atom, wherein the ring has at least one a double bond. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system in which a heteroatom (for example, N, O, Si, P, S, or any combination specifically) is included as a ring-forming atom and the number of carbon atoms included is 1 to 60, and the term "$C_1$-$C_{60}$ heteroarylene group" as used herein refers to a divalent group having a heterocyclic aromatic system in which a heteroatom (for example, N, O, Si, P, S, or any combination specifically) is included as a ring-forming atom and the number of carbon atoms included is 1 to 60. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "$C_6$-$C_{60}$ aryloxy group" as used herein refers to —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indeno phenanthrenyl group, and an indenon anthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group in which two or more rings are condensed to each other, which includes, as a ring-forming atom, a heteroatom (for example, N, O, Si, P, and S, or any combination thereof) other than carbon, and which has no aromaticity in its entire molecular structure. Examples of the monovalent non-aromatic condensed heteropolycyclic group are a pyrrolyl group, a thiophenyl group, a furanyl group, an indolyl group, a benzoindolyl group, a naphthon indolyl group, an isoindolyl group, a benzoisoindolyl group, a naphthonisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a monocyclic or polycyclic group that includes only carbon as a ring-forming atom and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a compound, such as benzene, a monovalent group, such as a phenyl group, or a divalent group, such as a phenylene group. In embodiments, depending on the number of substituents connected to the $C_5$-$C_{60}$ carbocyclic group, the $C_5$-$C_{60}$ carbocyclic group may be a trivalent group or a quadrivalent group.

Examples of the $C_5$-$C_{60}$ carbocyclic group are a cyclopentadiene group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indeno phenanthrene group, and an indenoanthracene group.

The term "$C_1$-$C_{60}$ heterocyclic group" as used herein refers to a monocyclic or polycyclic group which includes 1 to 60 carbon atoms and, as a ring-forming atom, a heteroatom (for example, N, O, Si, P, S, or any combination specifically), in addition to carbon (the carbon number may be 1 to 60). The $C_1$-$C_{60}$ heterocyclic group may be an aromatic heterocyclic group or a non-aromatic heterocyclic group. The $C_1$-$C_{60}$ heterocyclic group may be a compound such as a pyridine, a monovalent group such as a pyridinyl group, or a divalent group such as a pyridinylene group. In embodiments, depending on the number of substituents connected to the $C_1$-$C_{60}$ heterocyclic group, the $C_1$-$C_{60}$ heterocyclic group may be a trivalent group or a quadrivalent group.

Examples of the $C_1$-$C_{60}$ heterocyclic group are a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, a pyrrole group, a thiophene group, a furan group, an indole group, a benzoindole group, a naphthon indole group, an isoindole group, a benzo isoindole group, a naphthon isoindole group, a benzosilole group, a benzothiophene group, a benzofuran group, a carbazole group, a dibenzosilole group, a dibenzothiophene group, a dibenzofuran group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, an imidazopyridazine group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, and a benzothienodibenzothiophene group.

The substituent of the substituted $C_5$-$C_{60}$ carbocyclic group, the substituted $C_1$-$C_{60}$ heterocyclic group, the substituted $C_1$-$C_{60}$ alkylene group, the substituted $C_2$-$C_{60}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{30}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$;

—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), or any combination thereof.

$Q_1$ to $Q_3$, $Q_{11}$ to $Q_{13}$, $Q_{21}$ to $Q_{23}$ and $Q_{31}$ to $Q_{33}$ used herein may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, or a terphenyl group.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group". In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a phenyl group having, as a substituent, a $C_6$-$C_{60}$ aryl group substituted with a $C_6$-$C_{60}$ aryl group.

* and *' used herein, unless defined otherwise, each refer to a binding site to a neighboring atom in a corresponding formula.

Hereinafter, a compound according to embodiments and a light-emitting device according to embodiments will be described in detail with reference to Synthesis Examples and Examples. The wording "B was used instead of A" used in describing Synthesis Examples refers to when an identical molar equivalent of B was used in place of A.

EXAMPLES

Synthesis Example: Synthesis of Compounds BD1 to BD8

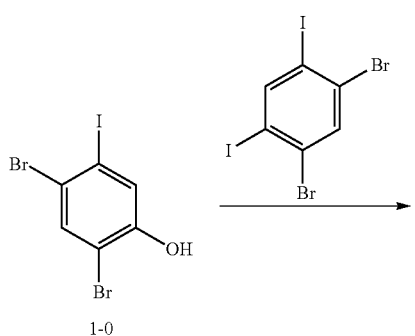

1-0

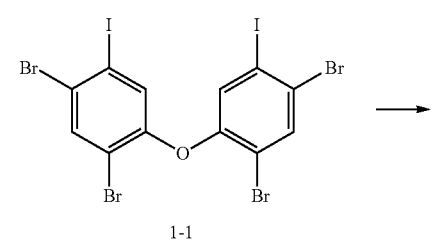

1-1

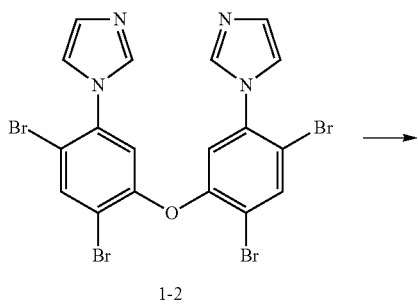

1-2

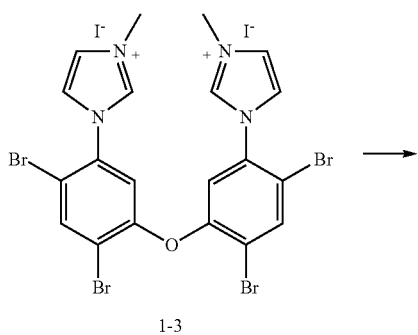

1-3

Synthesis of Intermediate 1-1

Intermediate 1-1 was synthesized using Intermediate 1-0, 1,5-dibromo-2,4-diiodobenzene (CAS: 96843-23-1), CuI, $K_3PO_4$, and BPPO in a DMSO solvent at 160° C. Intermediate 1-1 was confirmed by LC-MS.

$C_{12}H_4Br_4I_2O$: M+1 733.55

Synthesis of Intermediate 1-2

Intermediate 1-1 was reacted with imidazole (CAS: 288-13-1) and potassium carbonate to synthesize Intermediate 1-2. Intermediate 1-2 was confirmed by LC-MS.

$C_{18}H_{10}Br_4N_4O$: M+1 613.77

Synthesis of Intermediate 1-3

Intermediate 1-2 was reacted with iodide methane (CAS: 74-88-4) using acetone as a solvent to synthesize 1-3. Intermediate 1-3 was confirmed by LC-MS.

$C_{20}H_{16}Br_4I_2N_4O$: M+1 897.61

Synthesis of Intermediate 1-4

Intermediate 1-4 was synthesized using Intermediate 1-3, dichloro(1,5-cyclooctadiene)platinum(II), and sodium acetate at 160° C. in a dioxane solvent. Intermediate 1-4 was confirmed by LC-MS.

$C_{20}H_{12}Br_4N_4OPt$: M+1 834.78

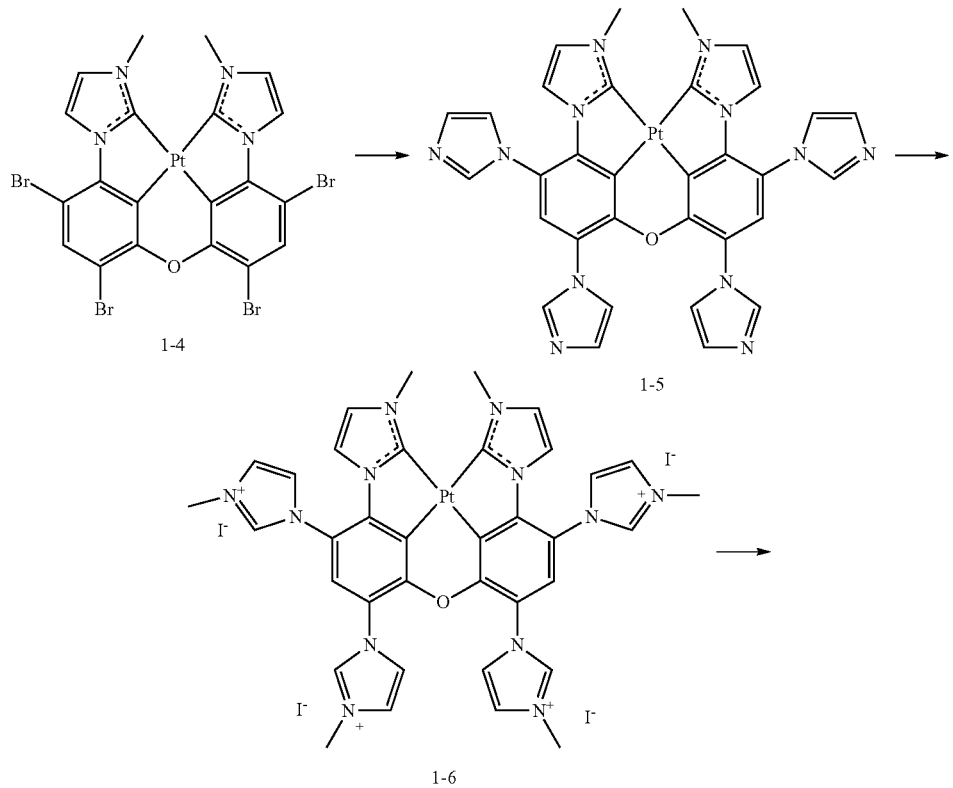

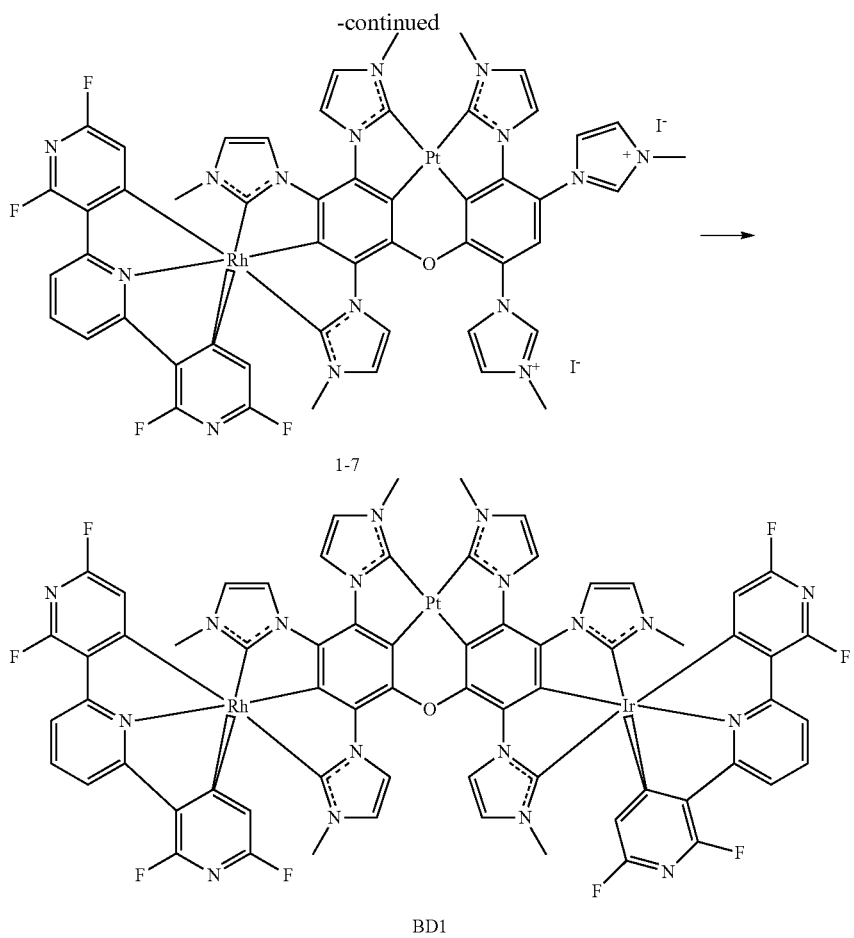

Synthesis of Intermediate 1-5

Intermediate 1-4 was reacted with imidazole (CAS: 288-13-1) and potassium carbonate to synthesize Intermediate 1-5. Intermediate 1-5 was confirmed by LC-MS.

C32H24N12OPt: M+1 787.22

Synthesis of Intermediate 1-6

Intermediate 1-5 was reacted with iodide methane (CAS: 74-88-4) using acetone as a solvent to synthesize Intermediate 1-6. Intermediate 1-6 was confirmed by LC-MS.

C36H36I4N12OPt: M+1 1354.91

Synthesis of Intermediate 1-7

Intermediate 1-7 was synthesized using Intermediate 1-6, rhodium(III) chloride, and sodium acetate at 160° C. in a dioxane solvent. Intermediate 1-7 was confirmed by LC-MS.

C51H38F4I2N15OPtRh: M+1 1504.01

Synthesis of Compound BD1

Compound BD1 was synthesized using Intermediate 1-7, bis(1,5-cyclooctadiene)diiridium(I) dichloride, and sodium acetate at 160° C. in a dioxen solvent. Compound BD1 was confirmed by LC-MS.

C66H40F8IrN18OPtRh: M+1 1743.21

The intermediate synthesis method of Compound BD1 was equally applied to synthesis of Compounds BD2 to BD8.

The compounds synthesized according to Synthesis Examples above were identified by $^1$H NMR and MS/FAB, and results are shown in Table 1 below.

Even compounds other than the compounds shown in Table 1 may be easily recognized by those skilled in the art by referring to the above synthesis routes and source materials.

TABLE 1

| Compound | $^1$H NMR (CDCl$_3$, 400 MHz) | MS/FAB found | MS/FAB calc. |
|---|---|---|---|
| 1 | 3.63 (s, 6H), 3.67 (s, 6H), 3.69 (s, 6H), 6.49-6.54 (m, 12H), 7.54-7.59 (m, 10H) | 1743.19 | 1743.21 |
| 2 | 3.63 (s, 6H), 3.65 (s, 6H), 3.67 (s, 6H), 3.70 (s, 6H), 3.72 (s, 6H), 6.49-6.54 (m, 8H), 7.54-7.59 (m, 10H) | 1799.56 | 1799.47 |
| 3 | 3.63 (s, 6H), 3.66 (s, 6H), 3.68 (s, 6H), 6.51-6.60 (m, 10H), 7.52-7.64 (m, 18H) | 1843.46 | 1843.48 |
| 4 | 3.62 (s, 6H), 3.61 (s, 6H), 3.65 (s, 6H), 6.54-6.67 (m, 10H), 7.50-7.66 (m, 16H) | 1845.75 | 1845.21 |
| 5 | 3.61 (s, 6H), 3.65 (s, 6H), 3.70 (s, 6H), 6.50-6.54 (m, 12H), 7.44-7.50 (m, 10H) | 1833.20 | 1833.24 |
| 6 | 3.62 (s, 6H), 3.64 (s, 6H), 3.68 (s, 6H), 3.72 (s, 6H), 3.74 (s, 6H), 6.50-6.54 (m, 8H), 7.50-7.59 (m ,10H) | 1799.97 | 1799.25 |
| 7 | 3.60 (s, 6H), 3.65 (s, 6H), 3.67 (s, 6H), 6.51-6.62 (m, 10H), 7.52-7.64 (m, 18H) | 1843.55 | 1843.48 |
| 8 | 3.62 (s, 6H), 3.61 (s, 6H), 3.64 (s, 6H), 6.50-6.61 (m, 10H), 7.50-7.69 (m, 16H) | 1845.64 | 1845.46 |

Manufacture of Light-Emitting Device

Example 1

As an anode, a glass substrate with 15 Ωcm² (1,200 Å) ITO thereon, which was manufactured by Corning Inc., was cut to a size of 50 mm×50 mm×0.7 mm, and the glass substrate was sonicated by using isopropyl alcohol and pure water for 5 minutes each, and ultraviolet (UV) light was irradiated for 30 minutes thereto and ozone was exposed thereto for cleaning. The resultant glass substrate was loaded onto a vacuum deposition apparatus.

A known material Compound NPD was vacuum-deposited on the ITO glass substrate to form a hole injection layer having a thickness of 300 Å, and TCTA as a hole transport compound was vacuum-deposited on the hole injection layer to form a hole transport layer having a thickness of 200 Å.

mCP and Compound BD1 of the disclosure were co-deposited at a weight ratio of 99:1 thereon to form an emission layer having a thickness of 200 Å.

Subsequently, TSP01 as an electron transport compound was vacuum-deposited thereon to form an electron transport layer having a thickness of 200 Å.

LiF as a halogenated alkali metal was deposited thereon to form an electron injection layer having a thickness of 10 Å, and Al (cathode) was vacuum-deposited thereon to a thickness of 3,000 Å, thereby forming an LiF/Al electrode, resulting in completing the manufacture of a light-emitting device.

NPD

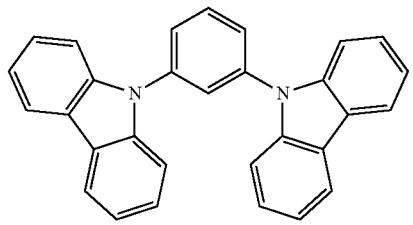

TCTA

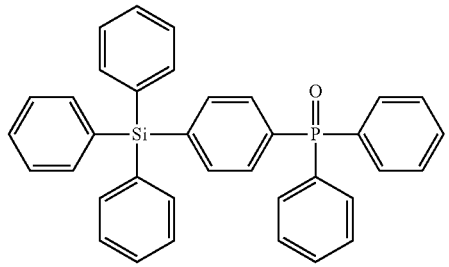

mCP

TSPO1

Example 2

A light-emitting device was manufactured in the same manner as in Example 1, except that Compound BD2 was used instead of Compound BD1 in forming an emission layer.

Example 3

A light-emitting device was manufactured in the same manner as in Example 1, except that Compound BD3 was used instead of Compound BD1 in forming an emission layer.

Example 4

A light-emitting device was manufactured in the same manner as in Example 1, except that Compound BD4 was used instead of Compound BD1 in forming an emission layer.

Example 5

A light-emitting device was manufactured in the same manner as in Example 1, except that Compound BD5 was used instead of Compound BD1 in forming an emission layer.

Example 6

A light-emitting device was manufactured in the same manner as in Example 1, except that Compound BD6 was used instead of Compound BD1 in forming an emission layer.

Example 7

A light-emitting device was manufactured in the same manner as in Example 1, except that Compound BD7 was used instead of Compound BD1 in forming an emission layer.

Example 8

A light-emitting device was manufactured in the same manner as in Example 1, except that Compound BD8 was used instead of Compound BD1 in forming an emission layer.

Comparative Example 1

A light-emitting device was manufactured in the same manner as in Example 1, except that known Compound A was used instead of Compound BD1 in forming an emission layer.

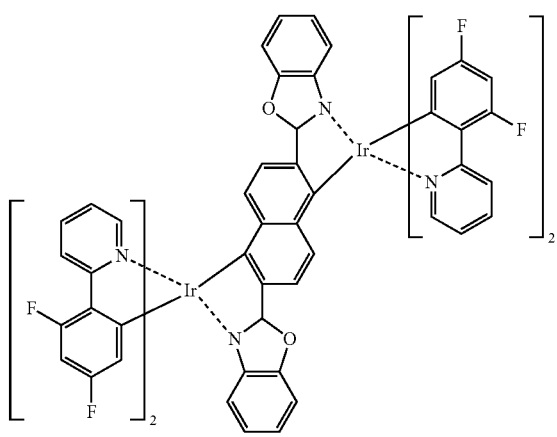

A

Comparative Example 2

A light-emitting device was manufactured in the same manner as in Example 1, except that known Compound B was used instead of Compound BD1 in forming an emission layer.

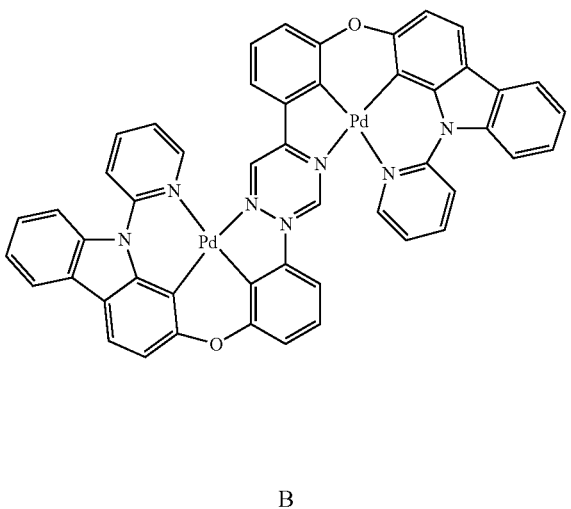

B

In order to evaluate characteristics of the light-emitting devices manufactured in Examples 1 to 8 and Comparative Examples 1 and 2, driving voltage and efficiency were measured in a current density of 10 mA/cm$^2$.

The driving voltage and current density of the light-emitting devices were measured by using a source meter (Keithley Instrument, 2400 series).

TABLE 2

| | Dopant in emission layer | Driving voltage (V) | Current density (mA/cm$^2$) | Luminance (cd/m$^2$) | Efficiency (cd/A) | Emission color | Half-life span (hr @100 mA/cm$^2$) |
|---|---|---|---|---|---|---|---|
| Example 1 | Compound BD1 | 4.3 | 6.5 | 1000 | 33.40 | Blue color | 3.7 |
| Example 2 | Compound BD2 | 4.5 | 6.1 | 1000 | 32.43 | Blue color | 3.7 |
| Example 3 | Compound BD3 | 4.4 | 6.5 | 1000 | 28.68 | Blue color | 3.2 |
| Example 4 | Compound BD4 | 5.3 | 6.5 | 1000 | 22.17 | Blue color | 3.5 |
| Example 5 | Compound BD5 | 5.5 | 6.1 | 1000 | 31.33 | Blue color | 3.2 |
| Example 6 | Compound BD6 | 4.6 | 6.2 | 1000 | 29.30 | Blue color | 3.4 |
| Example 7 | Compound BD7 | 5.3 | 6.2 | 1000 | 30.27 | Blue color | 3.3 |
| Example 8 | Compound BD8 | 4.7 | 6.4 | 1000 | 30.11 | Blue color | 2.9 |
| Comparative Example 1 | Compound A | 5.3 | 6.0 | 1000 | 25.95 | Blue color | 1.5 |
| Comparative Example 2 | Compound B | 5.5 | 5.2 | 1000 | 24.47 | Blue color | 0.2 |

Referring to Table 2, it was confirmed that the light-emitting devices manufactured according to Examples 1 to 8 showed excellent results compared to those of the light-emitting devices manufactured according to Comparative Examples 1 and 2.

When the trimetallic complex of Formula 1 according to an embodiment is used as a material of emission layer, driving voltage may decrease and efficiency and lifespan may increase, compared to known compounds.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the FIGURE, it will be understood by those of ordinary skill in the art that various changes in form and details may be made therein without departing from the spirit and scope as defined by the following claims.

What is claimed is:

1. A trimetallic complex represented by Formula 1:

<Formula 1>

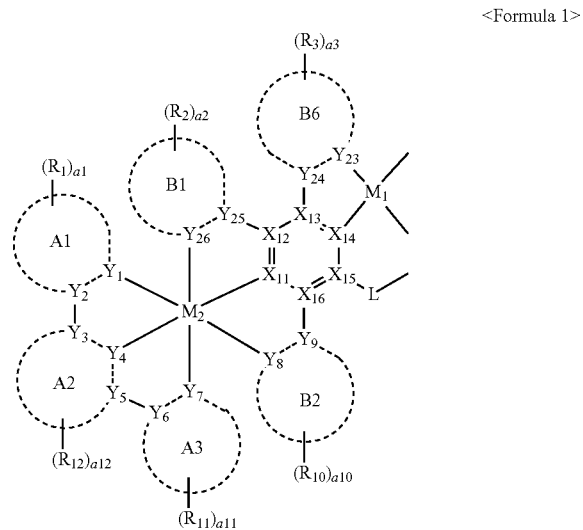

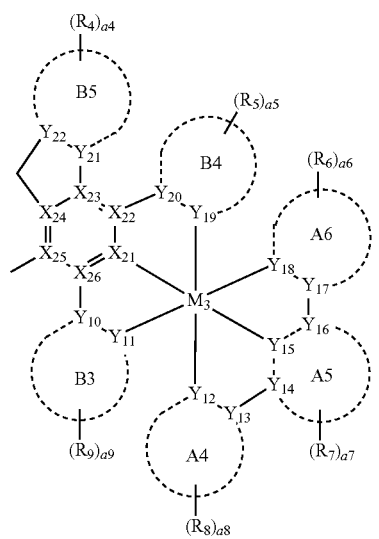

wherein in Formula 1, $M_1$, $M_2$, and $M_3$ are transition metals, $A_1$ to $A_6$ and $B_1$ to $B_6$ are each independently selected from a $C_5$-$C_{60}$ carbocyclic group and a $C_1$-$C_{60}$ heterocyclic group, $Y_1$ to $Y_{26}$ are each independently C or N, $X_{11}$ to $X_{16}$ and $X_{21}$ to $X_{26}$ are each independently C or N, L is selected from a single bond, *—O—*', *—S—*', *—C($R_{21}$)($R_{22}$)—*', *—C($R_{21}$)=*', *=C($R_{21}$)—*', *—C($R_{21}$)=C($R_{22}$)—*', *—C(=O)—*', *—C(=S)—*', *—C≡C—*', *—B($R_{21}$)—*', *—N($R_{21}$)—*', *—P($R_{21}$)—*', *—Si($R_{21}$)($R_{22}$)—*', *—P($R_{21}$)($R_{22}$)—*', and *—Ge($R_{21}$)($R_{22}$)—*', $R_1$ to $R_{12}$, $R_{21}$, and $R_{22}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), two adjacent substituents selected from the group consisting of $R_1$ to $R_{12}$, $R_{21}$, and $R_{22}$ are optionally linked to each other to form a substituted or unsubstituted $C_5$-$C_{60}$ carbocyclic group or a substituted or unsubstituted $C_1$-$C_{60}$ heterocyclic group, a1 to a12 are each independently an integer from 1 to 4,

* and *' each indicate a binding site to a neighboring atom, and at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amino group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

2. The trimetallic complex of claim 1, wherein $M_1$, $M_2$, and $M_3$ are each independently selected from platinum (Pt), palladium (Pd), copper (Cu), silver (Ag), gold (Au), rhodium (Rh), iridium (Ir), ruthenium (Ru), and osmium (Os).

3. The trimetallic complex of claim 1, wherein $M_1$ is selected from platinum (Pt), palladium (Pd), and osmium (Os).

4. The trimetallic complex of claim 1, wherein $M_2$ and $M_3$ are each independently selected from rhodium (Rh), iridium (Ir), and ruthenium (Ru).

5. The trimetallic complex of claim 1, wherein $A_1$ to $A_6$ and $B_1$ to $B_6$ are each independently selected from a benzene group, a naphthalene group, an anthracene group, a phenanthrene group, an azulene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isooxazole group, a thiazole group, an isothiazole group, an oxadiazole group, a thiadiazole group, a benzopyrazole group, a pyrazolopyridine group, a furopyrazole group, a thienopyrazole group, a benzimidazole group, a 2,3-dihydrobenzimidazole group, an imidazopyridine group, a 2,3-dihydroimidazopyridine group, a furo imidazole group, a thienoimidazole group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

6. The trimetallic complex of claim 1, wherein $Y_4$, $Y_9$, $Y_{10}$, $Y_{15}$, $Y_{20}$, $Y_{21}$, $Y_{24}$, and $Y_{25}$ are each N.

7. The trimetallic complex of claim 1, wherein $X_{11}$ to $X_{16}$ and $X_{21}$ to $X_{26}$ are each C.

8. The trimetallic complex of claim 1, wherein

L is *—O—*', and $Y_1$, $Y_7$, $Y_8$, $Y_{11}$, $Y_{12}$, $Y_{18}$, $Y_{19}$, $Y_{22}$, $Y_{23}$, $Y_{26}$, $X_{11}$, $X_{14}$, $X_{21}$, and $X_{24}$ are each C.

9. The trimetallic complex of claim 1, wherein $A_1$ to $A_6$ and $B_1$ to $B_6$ are each independently selected from a $C_5$-$C_6$ carbocyclic group and a $C_3$-$C_7$ heterocyclic group.

10. The trimetallic complex of claim 1, wherein $A_1$ to $A_6$ are each independently a $C_5$ heterocyclic group.

11. The trimetallic complex of claim 1, wherein $B_1$ to $B_6$ are each independently a $C_3$-$C_7$ heterocyclic group.

12. The trimetallic complex of claim 1, wherein $A_1$ to $A_6$ are each independently a 6-membered ring comprising one or more N(s).

13. The trimetallic complex of claim 1, wherein $B_1$ to $B_6$ are each independently a 5-membered ring comprising two or more N(s).

14. The trimetallic complex of claim 1, wherein $A_1$ to $A_6$ and $B_1$ to $B_6$ are each independently selected from a benzene group, a pyridine group, an imidazole group, a 2,3-dihydroimidazole group, an imidazopyrimidine group, and a benzimidazole group.

15. The trimetallic complex of claim 1, wherein Formula 1 is a trimetallic complex represented by Formula 2 below:

<Formula 2>

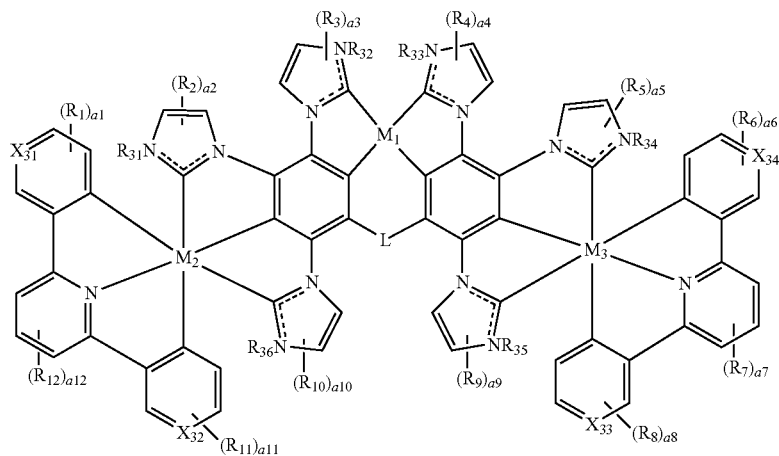

wherein in Formula 2, $M_1$, $M_2$, and $M_3$ are the same as described in connection with Formula 1, L is the same as described in connection with Formula 1, $R_1$ to $R_{12}$ are the same as described in connection with Formula 1, a1 to a12 are the same as described in connection with Formula 1, $R_{31}$ to $R_{36}$ are the same as described in connection with $R_1$ of Formula 1, and $X_{31}$ to $X_{34}$ each independently indicate C or N.

16. The trimetallic complex of claim 15, wherein

L is *—O—*', $R_1$ to $R_{12}$ are each independently —F, —Cl, —Br, or —I, and $R_{31}$ to $R_{36}$ are each independently a substituted or unsubstituted $C_1$-$C_{60}$ alkyl group.

17. The trimetallic complex of claim 1, wherein the trimetallic complex represented by Formula 1 is any one of the following compounds:

BD1

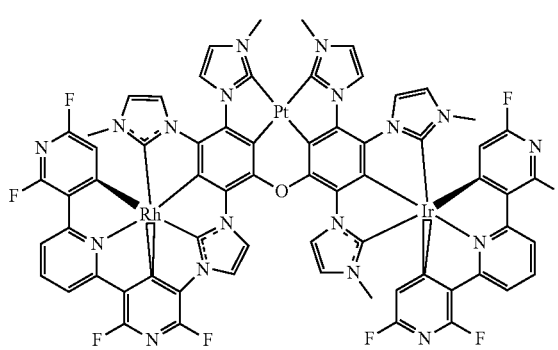

BD2

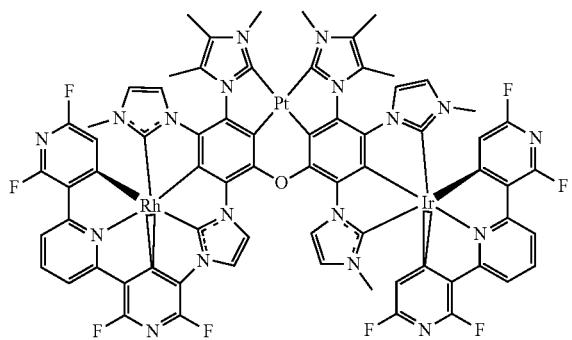

BD3

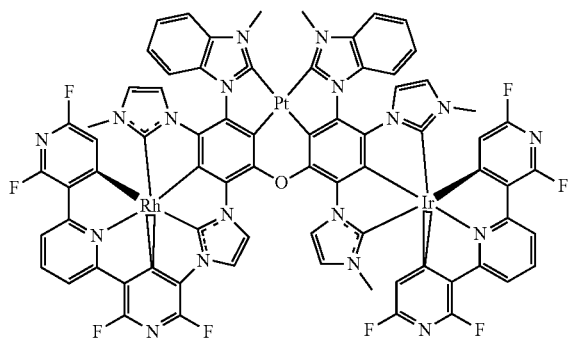

BD4

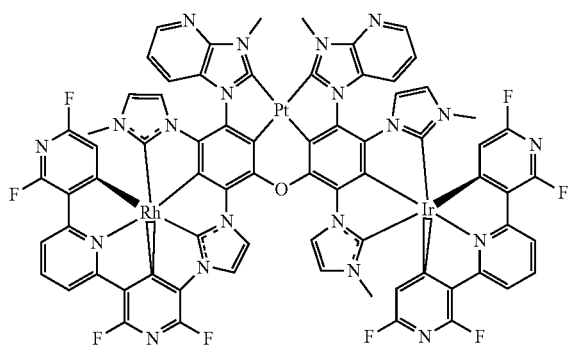

BD5

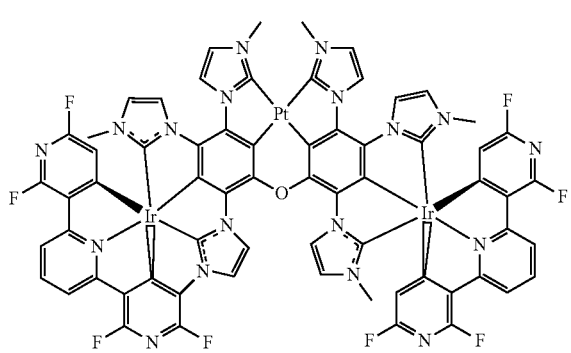

BD6

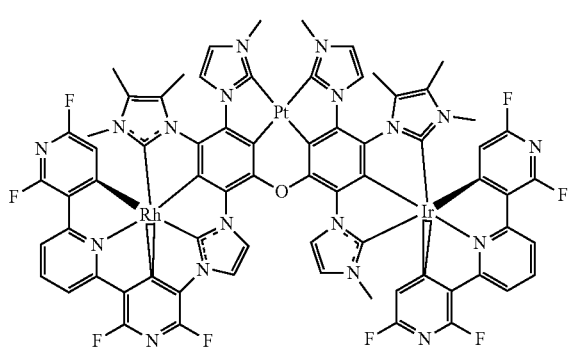

BD7

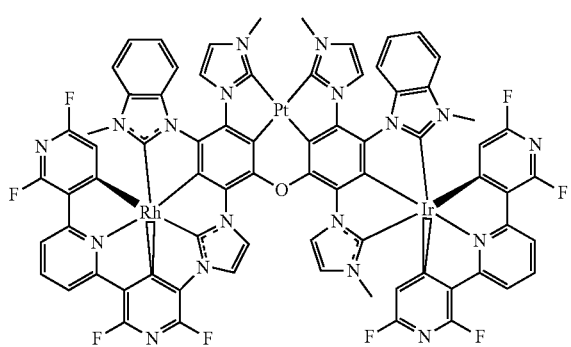

BD8

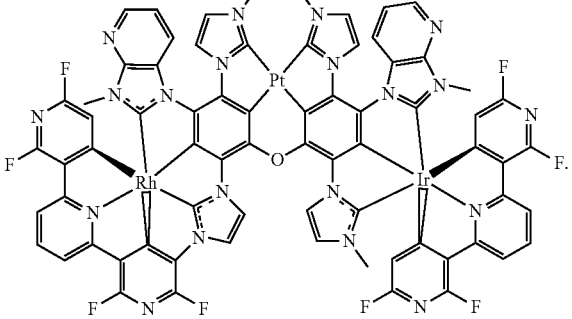

18. A light-emitting device comprising:
a first electrode;
a second electrode facing the first electrode; and
a middle layer disposed between the first electrode and the second electrode and comprising an emission layer,
wherein the middle layer comprises the trimetallic complex of claim 1.

19. The light-emitting device of claim 18, wherein
the first electrode is an anode,
the second electrode is a cathode, and
the middle layer comprises:
  a hole transport region disposed between the first electrode and the emission layer and comprising at least one selected from the group consisting of a hole injection layer, a hole transport layer, an emission auxiliary layer, and an electron blocking layer; and
  an electron transport region disposed between the emission layer and the second electrode and comprising at least one selected form the group consisting of a hole blocking layer, an electron transport layer, and an electron injection layer.

20. An electronic apparatus comprising a thin-film transistor and the light-emitting device of claim 18, wherein
the thin-film transistor comprises:
  a source electrode;
  a drain electrode;
  an activation layer; and
  a gate electrode, and
the first electrode of the light-emitting device is electrically connected to one of the source electrode and the drain electrode of the thin-film transistor.

* * * * *